US012751078B2

(12) United States Patent
Lin et al.

(10) Patent No.: US 12,751,078 B2
(45) Date of Patent: Sep. 29, 2026

(54) DOPED WELL FOR SEMICONDUCTOR DEVICES

(71) Applicant: Taiwan Semiconductor Manufacturing Co., Ltd., Hsinchu (TW)

(72) Inventors: Yu-Chang Lin, Hsinchu (TW); Bau-Ming Wang, Kaohsiung City (TW); Liang-Yin Chen, Hsinchu (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 648 days.

(21) Appl. No.: 17/655,637

(22) Filed: Mar. 21, 2022

(65) Prior Publication Data

US 2022/0406774 A1 Dec. 22, 2022

Related U.S. Application Data

(60) Provisional application No. 63/212,167, filed on Jun. 18, 2021.

(51) Int. Cl.

| | |
|---|---|
| ***H10D 84/83*** | (2025.01) |
| ***H10D 30/67*** | (2025.01) |
| ***H10D 62/10*** | (2025.01) |
| ***H10D 62/60*** | (2025.01) |
| ***H10P 30/20*** | (2026.01) |
| ***H10P 30/22*** | (2026.01) |

(52) U.S. Cl.

CPC ......... *H10D 84/83* (2025.01); *H10D 30/6735* (2025.01); *H10D 30/6757* (2025.01); *H10D 62/118* (2025.01); *H10D 62/60* (2025.01); *H10P 30/22* (2026.01); *H10P 30/222* (2026.01)

(58) Field of Classification Search

CPC ...... H10D 84/83; H10D 62/118; H10D 62/60; H10D 30/6735; H10D 30/6757; H01L 21/26586; H01L 21/266; H10P 30/222; H10P 30/22

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |

(Continued)

FOREIGN PATENT DOCUMENTS

| | | | |
|---|---|---|---|
| CN | 105225958 | A | 1/2016 |
| TW | 201503377 | A | 1/2015 |

(Continued)

OTHER PUBLICATIONS

Changhae Park et al., “Critical Angles for Channeling of Boron Ions Implanted into Single-Crystal Silicon” J. Electrochem. Soc., vol. 138, No. 7, Jul. 1991, pp. 2107-2115.

*Primary Examiner* — Timor Karimy

(74) *Attorney, Agent, or Firm* — Slater Matsil, LLP

(57) ABSTRACT

A semiconductor structure having doped wells and a method of forming is provided. The doped wells may utilize parallel implantation techniques and tilt implantation techniques to form wells having less lateral diffusion and less vertical doping.

20 Claims, 61 Drawing Sheets

(56) References Cited

U.S. PATENT DOCUMENTS

| | | | | |
|---|---|---|---|---|
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2007/0238273 | A1 | 10/2007 | Doyle et al. | |
| 2009/0029535 | A1* | 1/2009 | Okai | H01L 21/76237 257/E21.345 |
| 2015/0091054 | A1* | 4/2015 | Su | H10D 84/811 257/140 |
| 2020/0135469 | A1* | 4/2020 | Liu | H01L 21/26513 |
| 2021/0066100 | A1 | 3/2021 | Liaw | |
| 2021/0066452 | A1 | 3/2021 | Liaw | |
| 2021/0066506 | A1 | 3/2021 | Liaw | |
| 2021/0098470 | A1 | 4/2021 | Fung | |

FOREIGN PATENT DOCUMENTS

| | | | |
|---|---|---|---|
| TW | 202109630 | A | 3/2021 |
| TW | 202109636 | A | 3/2021 |
| TW | 202109678 | A | 3/2021 |
| TW | 202118062 | A | 5/2021 |

* cited by examiner

DOPED WELL FOR SEMICONDUCTOR DEVICES

PRIORITY CLAIM AND CROSS-REFERENCE

This application claims the benefit of U.S. Provisional Application No. 63/212,167, filed on Jun. 18, 2021, which application is hereby incorporated herein in its entirety by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
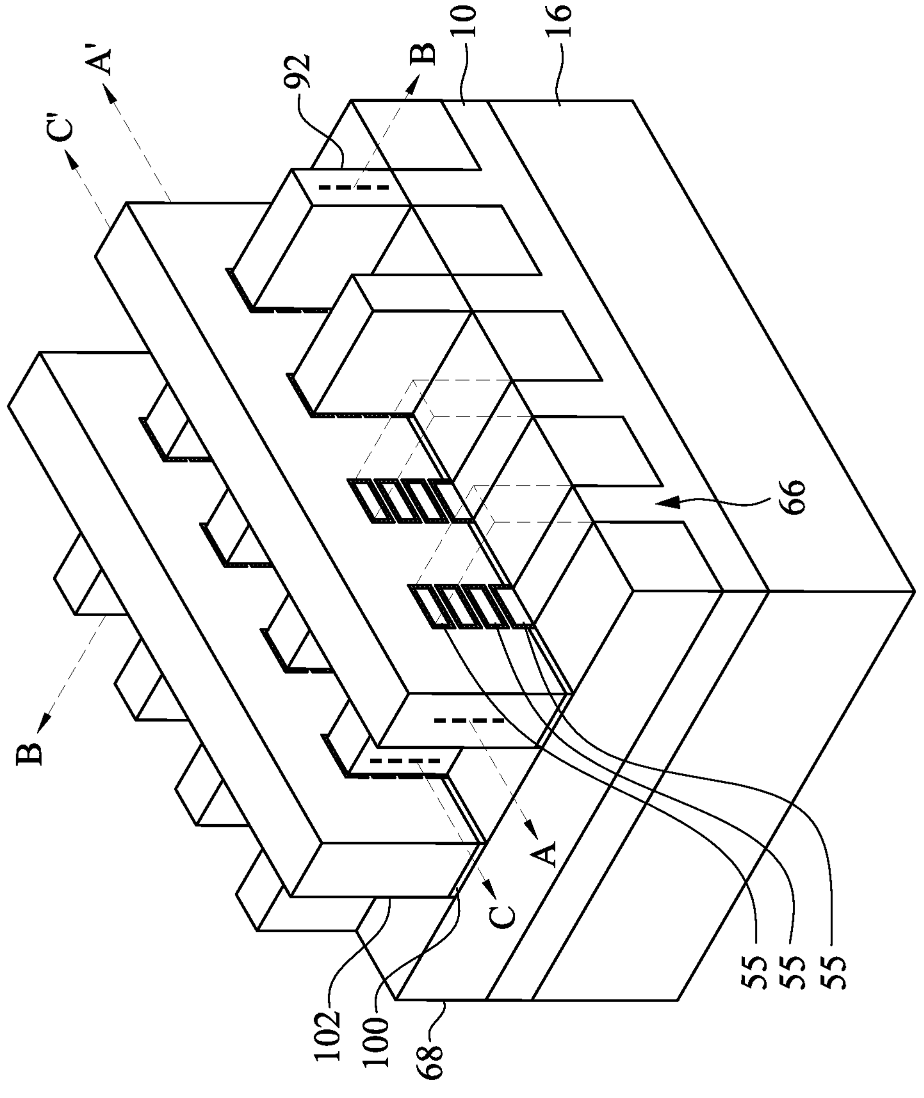
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As discussed in greater detail below, embodiments of the present disclosure describe a dopant implantation process to form p-wells and/or n-wells in a substrate, which may be used to form a transistor (e.g., nano-FETs, fin field effect transistors (FinFETs), planar transistors, or the like). The techniques described herein include tilting and twisting or rotating the substrate during the implantation processes to modulate the dopant concentration profile in p-wells and n-wells. Embodiments such as those discussed herein may create a dopant concentration profile having characteristics such as less vertical and lateral straggling of dopants and piling up of dopants within a small region at a smaller depth beneath the surface of the substrate. A dopant concentration profile such as this may provide a reduction of depletion region pinch off in p-wells and n-wells, resulting in greater resistance along junction leakage pathways and thereby a reduction of junction leakage from the source and drain regions to the substrate (e.g., a neighboring well), which may be desirable for transistors with small critical dimensions of p-wells and n-wells. Embodiments are described below in a particular context, a die comprising nano-FETs. Various embodiments may be applied, however, to dies comprising other types of transistors, such as FinFETs, planar transistors, or the like, in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 10 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. A deep n-well 16 is disposed in the substrate 10. Although the isolation regions 68 are described/illustrated as being separate from the substrate 10, as used herein, the term "substrate" may refer to the semiconductor substrate alone or a combination of the semiconductor substrate and the isolation regions. Additionally, although a bottom portion of the fins 66 are illustrated as being single, continuous materials with the substrate 10, the bottom portion of the fins 66 and/or the substrate 10 may comprise a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 98 and in a direction, for example, perpendicular to the direction of current flow between the epitaxial source/drain regions 92 of a nano-FET. Cross-section B-B' is substantially perpendicular to cross-section A-A' and is substantially parallel to a longitudinal axis of a fin 66 of the nano-FET and in a direction of, for example, a current flow between the epitaxial source/drain regions 92 of the nano-FET, within process variations. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in other devices, such as planar FETs or FinFETs.

FIG. 2 through 31C illustrate various intermediate stages in the manufacturing of nano-FETs, in accordance with some embodiments. FIGS. 2, 3, 4, 7A, 7B, 9, 10, 12, 13, 14, 15, 16A, 23A, 24A, 25A, 26A, 27A, 28A, 29A, 30A, and 32A illustrate reference cross-section A-A' illustrated in FIG. 1. FIGS. 16B, 17B, 18B, 19B, 20B, 21B, 21C, 22B, 22D, 23B, 24B, 25B, 26B, 27B, 28B, 29B, 30B, and 32B illustrate reference cross-section B-B' illustrated in FIG. 1. FIGS. 17A, 18A, 19A, 20A, 21A, 22A, 22C, 23C, 28C, 29C, 30C, 31A, 31B, and 32C illustrate reference cross-section C-C' illustrated in FIG. 1.

Figure 2:
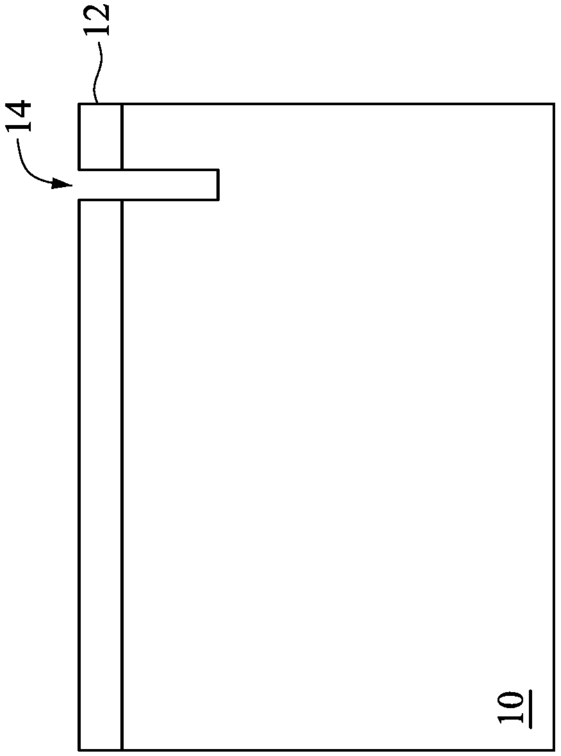
FIGS. 2, 3, 4, 5A, 5B, 5C, 6, 7A, 7B, 9, 10, 11, 12, 13, 14, 15, 16A, 16B, 17A, 17B, 18A, 18B, 19A, 19B, 20A, 20B, 21A, 21B, 21C, 22A, 22B, 22C, 22D, 23A, 23B, 23C, 24A, 24B, 25A, 25B, 26A, 26B, 27A, 27B, 28A, 28B, 28C, 29A, 29B, 29C, 30A, 30B, 30C, 31A, 31B, 32A, 32B, and 32C illustrate various intermediate stages in the manufacturing of nano-FETs, in accordance with some embodiments.

Referring first to FIG. 2, the substrate 10 having a mask layer 12 formed thereon is shown in accordance with some embodiments. The substrate 10 may be a semiconductor substrate, such as a bulk semiconductor, a semiconductor-on-insulator (SOI) substrate, or the like. The substrate 10 may be a wafer, such as a silicon wafer. FIG. 2 and the subsequent figures illustrate a portion of a wafer to better illustrate features of some embodiments. Similar structures and processes may be applied over larger portions of the wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 10 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The mask layer 12 is formed over the substrate 10 and patterned to form an alignment mark 14. The alignment mark may be used to align the wafer in subsequent processes. In accordance with some embodiments, the mask layer 12 may be formed of silicon oxide, which may be formed by oxidizing a surface layer of the semiconductor substrate 10. In some embodiments, the mask layer 12 may be formed through deposition, for example, using Atomic Layer Deposition (ALD), Plasma Enhanced Chemical Vapor Deposition (PECVD), or the like. The alignment mark 14 may be formed on the substrate 10 and the mask layer 12 via etching using photolithography techniques. A depth of the alignment mark 14 may be in a range from about 100 nm to about 150 nm, such as about 120 nm, beneath a top surface of the substrate 10, and a width of the alignment mark 14 may be in a range from about 1 μm to about 1.5 μm, such as about 1.5 μm. In some embodiments, the mask layer 12 may be removed.

A p-type ion implantation process is performed to lightly dope the substrate, in accordance with some embodiments. The p-type dopant may include, for example, boron, indium, the like, or combinations thereof. The p-type ion implantation process may include one or more blanket implantation processes and may be performed using an energy in a range from about 180 keV to about 240 keV. The p-type implantation process may provide p-type regions in the substrate that may act as deep p-wells (not separately shown) spaced apart from the top surface of the substrate 10 by a distance in a range from about 0.8 μm to about 1.2 μm. The p-type dopant concentration may be equal to or less than $1\times10^{17}$ $cm^{-3}$, such as in a range from about $1\times10^{16}$ $cm^{-3}$ to about $1\times10^{17}$ $cm^{-3}$. An annealing may be used to repair implantation damage and to activate the implanted impurities. The annealing may be performed at a temperature in a range from about 1000° C. to about 1100° C., such as about 1050° C. for a duration of about 1 second to about 20 seconds, such as about 10 seconds.

Figure 3:
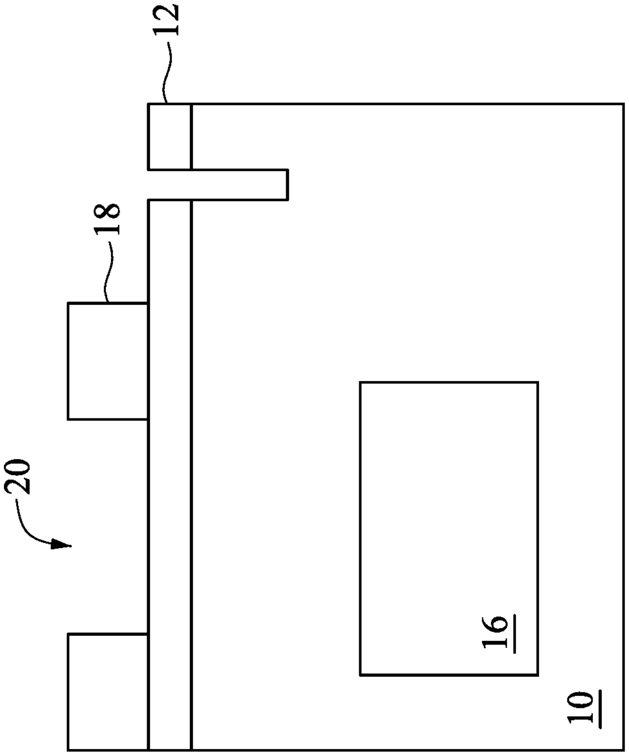

Referring to FIG. 3, an implantation mask 18 is formed and an n-type ion implantation is performed to form the deep n-well 16 in accordance with some embodiments. The implantation mask 18 may be formed of a material capable of substantially blocking ions during the subsequent implantation process. In some embodiments, the implantation mask 18 is formed of a photoresist, which is coated and then patterned using photolithography techniques to form opening 20. One or more n-type ion implantation processes may be performed using the implantation mask 18 to form the deep n-well 16 in accordance with some embodiments.

FIG. 3 and the subsequent figures illustrate a portion of the substrate 10 and a portion of the implantation mask 18 used to form one deep n-well 16 for illustrative purposes. It is understood that the implantation mask 18 may extend over other portions of the substrate 10 and may include additional openings 20 to form additional deep n-wells 16 in other portions of the substrate 10. The n-type dopant may include, phosphorous, arsenic, antimony, the like, or combinations thereof. The n-type ion implantation may be performed using an energy in a range from about 600 keV to about 800 keV. The deep n-well 16 is formed deep in the substrate 10, with the top of the deep n-well 16 being spaced apart from the top surface of the substrate 10 by a distance in a range from about 0.9 μm to about 1.1 μm. As illustrated in FIG. 3, the deep n-well 16 may extend laterally past the lateral edges of the opening 20 due to the implantation process. The n-type dopant concentration may be equal to or less than $1\times10^{17}$ $cm^{-3}$, such as in a range from about $1\times10^{16}$ $cm^{-3}$ to about $1\times10^{17}$ $cm^{-3}$. The implantation mask 18 may be removed, such as by an acceptable ashing process in some embodiments, and an annealing may be used to repair implantation damage and to activate the implanted impurities. The annealing may be performed at a temperature in a range from about 1000° C. to about 1100° C., such as about 1025° C. for a duration of about 1 second to about 20 seconds, such as about 10 seconds.

Figure 4:
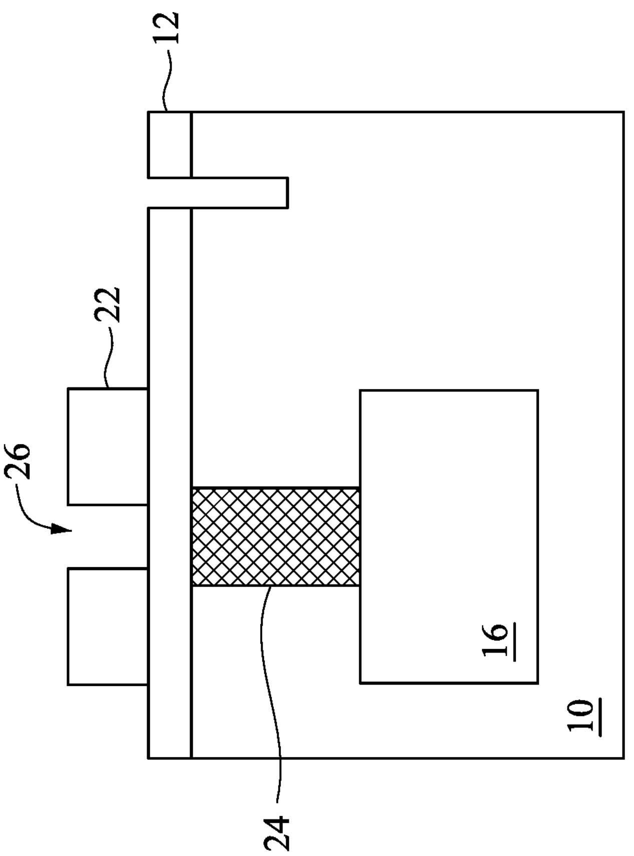

Referring to FIG. 4, an implantation mask 22 is formed and a p-type ion implantation process is performed to form a p-well 24, in accordance with some embodiments. The p-wells 24 provide active regions in the substrate 10 for fabricating n-type metal-oxide-semiconductor (NMOS)

devices as discussed in greater detail below. The implantation mask 22 may be formed of a material capable of substantially blocking ions during the subsequent implantation process. In some embodiments, the implantation mask 22 is formed of a photoresist, which is coated and then patterned using photolithography techniques to form opening 26. One or more p-type ion implantation processes may be performed using the implantation mask 22 to form the p-well 24 in accordance with some embodiments. FIG. 4 and the subsequent figures show a portion of the substrate 10 and a portion of the implantation mask 22 that includes one p-well 24 for illustrative purposes. It is understood that the implantation mask 22 may extend over other portions of the substrate 10 and may include additional openings 26 to form additional p-wells 24 in other portions of the substrate 10. The p-type dopant may include boron, indium, the like, or combinations thereof. The p-type ion implantation may be performed using an energy in a range from about 2 keV to about 100 keV. The implantation temperature may be in a range from about −60° C. to about 450° C. The p-well 24 may extend to the top surface of the substrate 10, and may extend to the deep n-well 16. As illustrated in FIG. 4, the p-well 24 may extend laterally past the lateral edges of the opening 26 due to diffusion during the implantation process. The p-type dopant concentration in the p-well 24 may be equal to or less than $1\times10^{20}$ cm$^{-3}$, such as in a range from about $1\times10^{17}$ cm$^{-3}$ to about $1\times10^{20}$ cm$^{-3}$. The implantation mask 22 may be removed, such as by an acceptable ashing process and an annealing may be used to repair implantation damage and to activate the implanted impurities, in some embodiments. The annealing may be performed at a temperature in a range from about 1000° C. to about 1100° C., such as about 1050° C. for a duration of about 1 second to about 20 seconds, such as about 10 seconds.

Figure 5A:
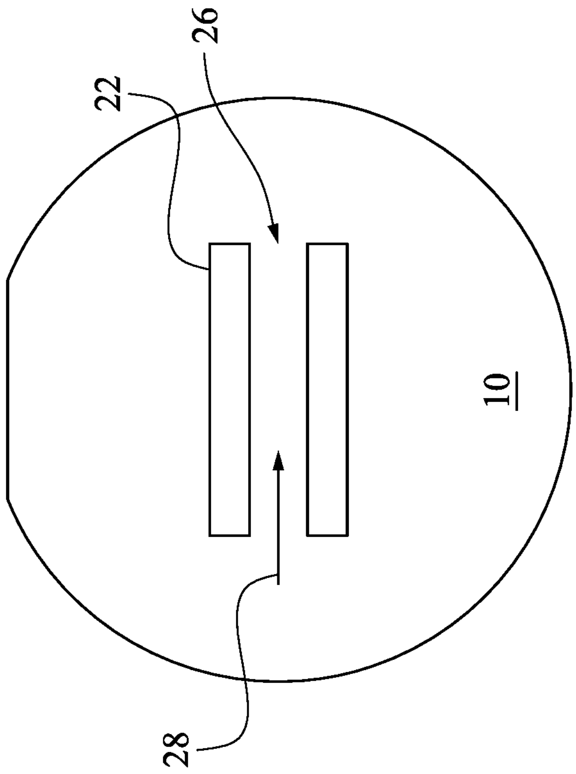
Figure 5B:
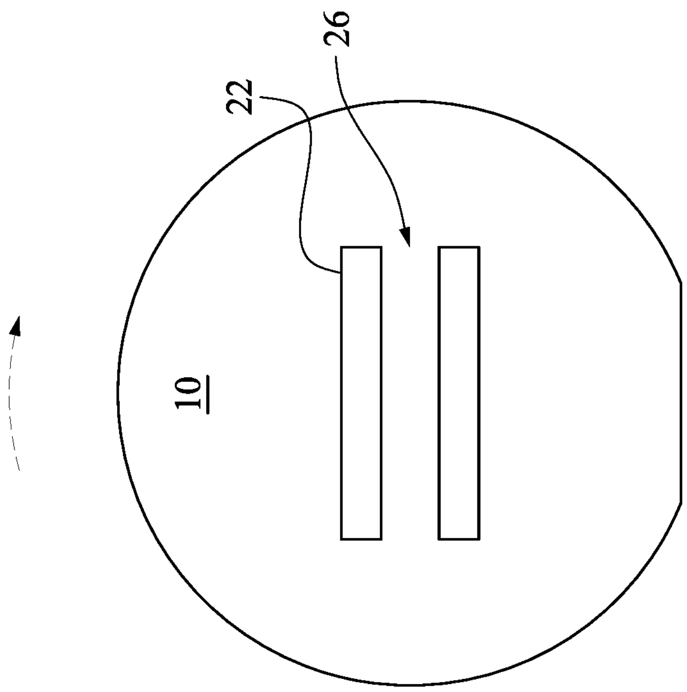
Figure 5C:
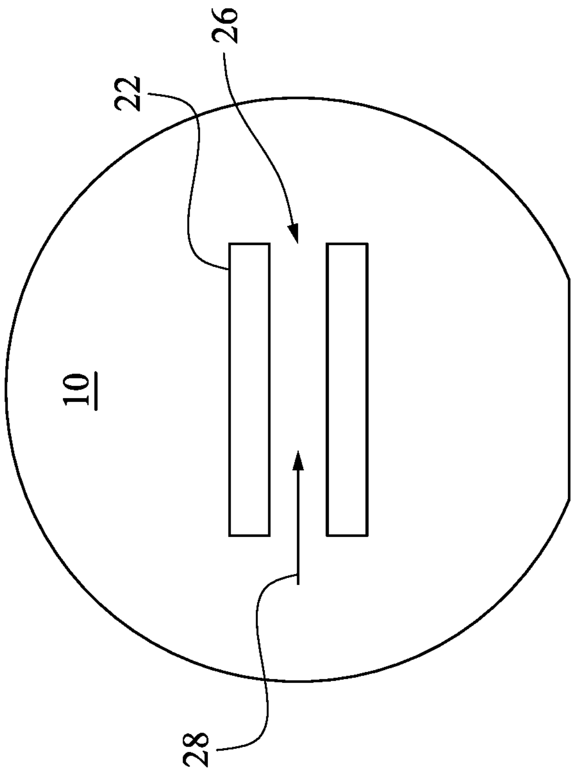

In accordance with some embodiments, an implantation process for forming the p-well 24 may include performing a first implantation, twisting or rotating the substrate 10 by 180 degrees relative to the ion beam, and performing a second implantation as illustrated in FIGS. 5A-5C where the substrate 10 is depicted in the shape of a wafer with a flat edge, and the mask layer 12 and alignment mark 14 are omitted for illustrative purposes. As shown in FIG. 5A, the first step of the implantation process comprises a first implantation while keeping the substrate 10 stationary. As shown in FIG. 5B, the second step of the implantation process comprises twisting or rotating the wafer by 180 degrees, and as shown in FIG. 5C, the third step of the implantation process comprises performing a second implantation while keeping the substrate 10 stationary.

Figure 6:
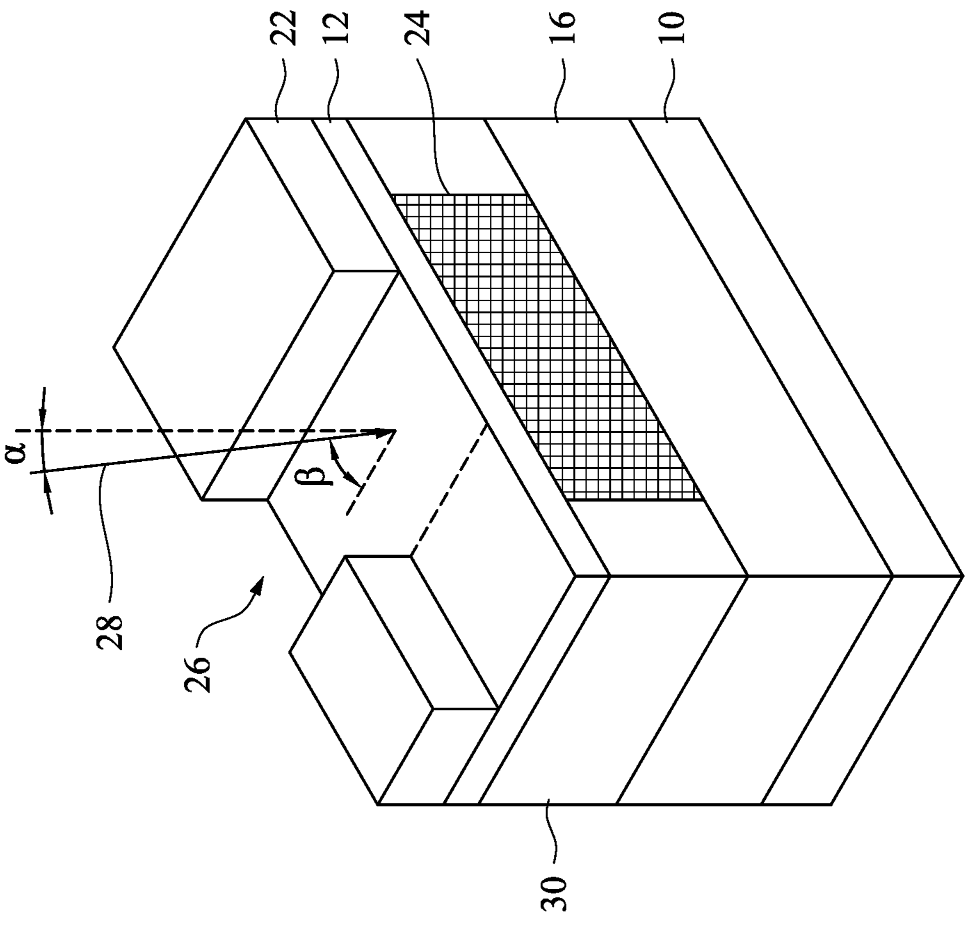

In accordance with some embodiments, the first implantation and the second implantation may utilize a parallel implantation technique, which arranges the ion beam 28 to be substantially parallel to longitudinal sidewalls of the opening 26 in a plan view, as shown in FIGS. 5A and 5C, within process variations. Additionally, FIG. 6 provides a perspective view of the implantation steps forming the p-well 24 utilizing the parallel implantation technique. A portion of the implantation mask 22 is omitted in FIG. 6 for illustrative purposes. When the parallel implantation technique is utilized, the ion beam 28 is in a plane substantially parallel (within process variations) to a plane perpendicular to a top surface of the substrate 10 and the mask layer 12 that includes an interface between a longitudinal sidewall of the implantation mask 22 and the top surface of an underlying layer, (e.g., the mask layer 12 in this example).

In accordance with some embodiments, the first implantation and the second implantation may further utilize a tilt implantation technique. As illustrated in FIG. 6 the ion beam 28 of the implantation forming the p-well 24 may be performed at a first tilt angle α relative to a line perpendicular to the top surface of the substrate 10 and the mask layer 12. The first tilt angle α may be in a range from greater than 0° to about 15°, such as about 7°. In other words, the ion beam 28 of the implantation forming the p-well 24 may be performed at a second tilt angle β relative to the top surface of the substrate 10 and the mask layer 12. The second tilt angle β may be in a range from about 75° to less than 90°, such as about 83°.

Figure 31A:
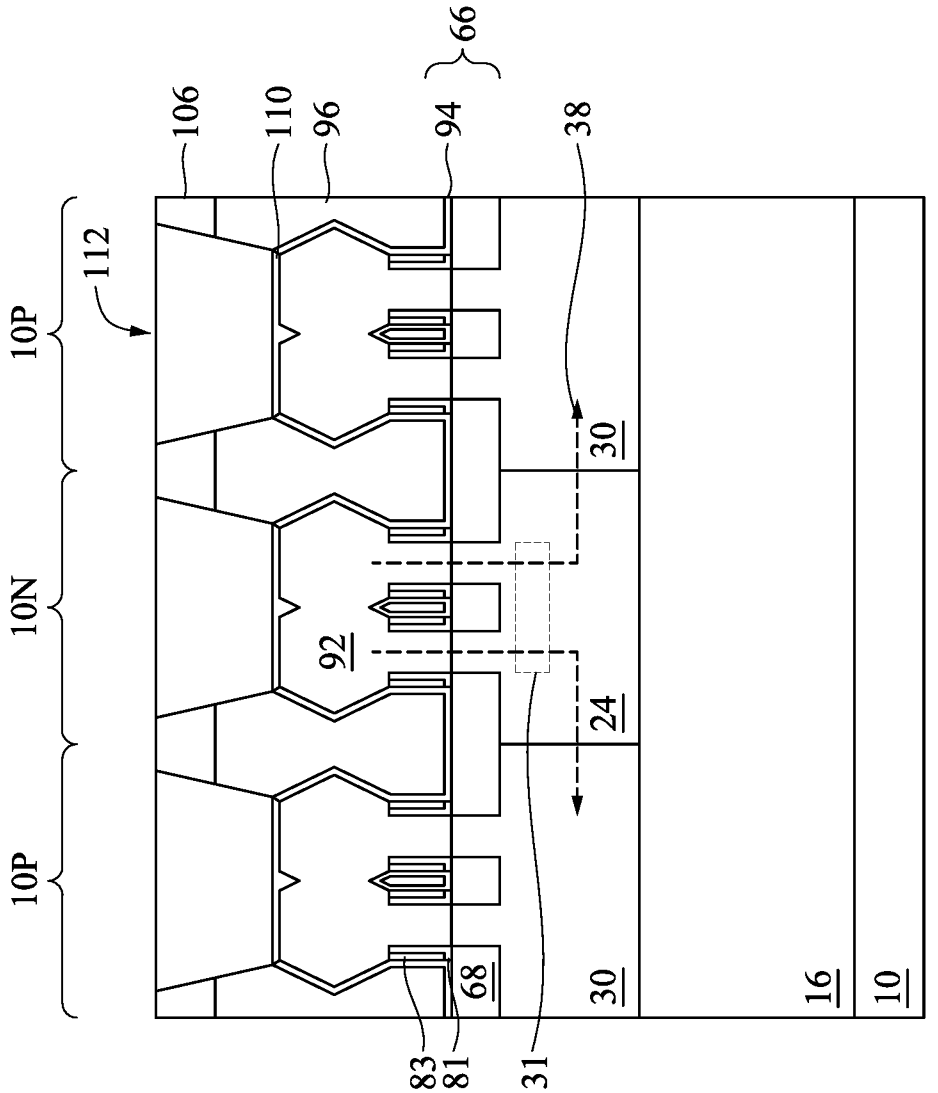

Embodiments such as those discussed herein provide a dopant concentration profile for p-wells 24 and n-wells 30 (see FIGS. 7A and 7B) that may reduce junction leakage in a completed device as shown in FIG. 31A. In some embodiments, the parallel implantation technique and the tilt implantation technique may be applied individually or in combination to achieve a desired dopant concentration profile during the well formation. In the context of forming the p-well 24 as discussed above, arranging the ion beam 28 to be substantially parallel (within process variations) to the interface between the p-well 24 and the projected n-well 30 (see, e.g., FIG. 7A) may reduce the amount of ions implanted under the implantation mask 22, thereby reducing the lateral straggling of the p-type dopant towards neighboring regions, such as neighboring projected n-wells 30. This allows for a narrower p-well 24 to be formed. Arranging the ion beam 28 to be at the second tilt angle β relative to the top surface of the substrate 10 and the mask layer 12 may reduce the channeling of dopants in the crystal lattice of the substrate 10 and reduce the vertical straggling of dopants into a larger depth beneath the top surface of the substrate 10, thereby creating a piling up of dopants at a smaller depth beneath the top surface of the substrate 10.

Figure 7A:
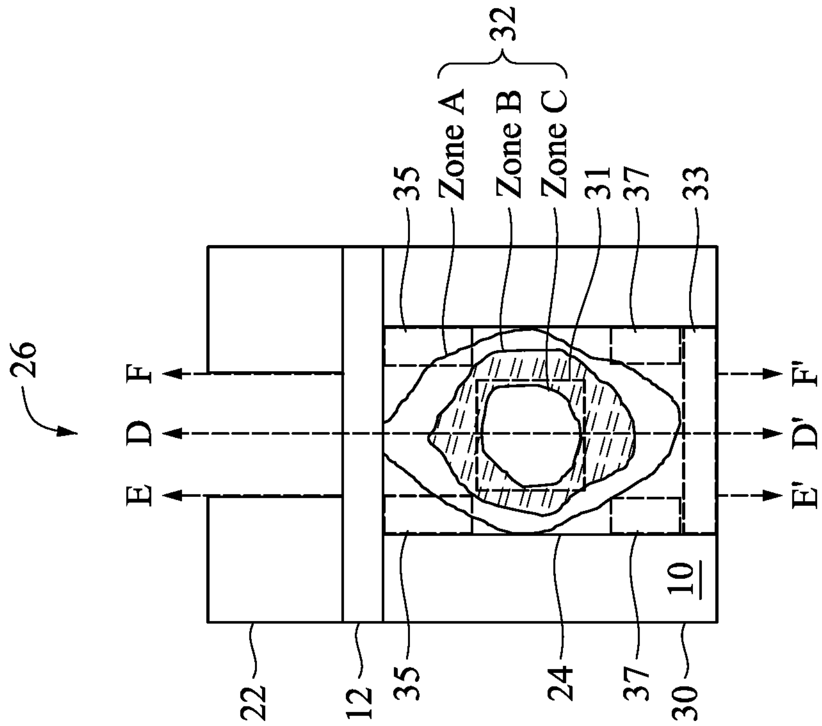

FIG. 7A illustrates a dopant concentration profile 32 of the p-well 24 shown in FIG. 4 in accordance with some embodiments. The dopant concentration profile 32 comprises zone A, zone B, and zone C, where zone A, zone B, and zone C represent the relative dopant concentration profile 32 of the p-well 24 that may be achieved using the techniques discussed above. Zone C represents a region having a relatively high dopant concentration, zone B represents a region with a dopant concentration less than zone C, and zone A represents a region with a dopant concentration less than zone B. FIG. 7A illustrates three distinct regions for illustrative purposes to demonstrate the relative concentrations and the general shape or profile of the doped regions, as well as the dopant piling up and straggling aspects of the dopant concentration profile 32 using techniques discussed herein, and in some embodiments, the dopant concentration profile 32 may be illustrated as having more or fewer zones. Zones A, B, and C illustrates that the dopant concentration may be gradient extending outward from zone C. Additionally, FIG. 7A illustrates that the dopant concentration profile 32 has a higher slope in the horizontal direction than the vertical direction as illustrated by a width of zone A and zone B in the horizontal direction as compared to the width of zone A and zone B in the vertical direction. In some embodiments, the p-type dopant concentration in zone A may be in a range from about $1.6\times10^{17}$ atom/cm$^3$ to about $2.7\times10^{17}$ atom/cm$^3$, such as about $2.2\times10^{17}$ atom/cm$^3$, the p-type dopant concentration in zone B may be in a range from about $2.7\times10^{17}$ atom/cm$^3$ to about $7.4\times10^{17}$ atom/cm$^3$, such as about $4.5\times10^{17}$ atom/cm$^3$, and the p-type dopant concentration in zone C may be in a range from about $7.4\times10^{17}$ atom/cm$^3$ to about $1.2\times10^{18}$ atom/cm$^3$, such as about $1\times10^{18}$ atom/cm$^3$.

FIG. 7A further illustrates lines D-D', E-E', and F-F' extending vertically through the opening 26, the mask layer 12, and the p-well 24. Line D-D' is equal distance to both sidewalls of the opening 26. Lines E-E' and F-F' are aligned with opposing sidewalls of the opening 26 and are parallel to line D-D'. Using techniques discussed herein such as the parallel implantation technique, a distance from the line E-E' (representing a boundary of the opening 26) to an outer boundary of the implantation region (represented by the dopant concentration profile 32) is reduced, limiting the amount of p-type dopants implanted or diffused into the neighboring regions, such as a neighboring n-well 30. For example, in some embodiments, arranging the ion implant beam substantially parallel to a sidewall of the implantation mask 22 may limit the lateral dimension of the dopant concentration profile from line E-E' to less than 50 nm.

FIG. 7A also illustrates a region 31 that encompasses zone C. Region 31 is an area of high dopant concentration. As discussed in greater detail below, the substrate 10 may be etched to form fins 66, and in some embodiments, the depth of region 31 and zone C is adjusted such that region 31 and zone C remain in the substrate below the subsequently formed fins 66. In some embodiments, region 31 may have an average p-type dopant concentration in a range from about $5\times10^{17}$ atom/$cm^3$ to about $7\times10^{17}$ atom/$cm^3$. FIG. 7A also illustrates that the parallel implantation technique and tilt implantation technique discussed herein reduce the vertical and lateral straggling of p-type dopants, and thereby creates a piling up of p-type dopants within region 31. The location of region 31 is discussed in greater detail below with reference to FIG. 31B.

FIG. 7A also illustrates region 33 positioned below region 31. In some embodiments, region 33 is positioned below region 31 in a range from about 400 nm to about 600 nm below a bottom of region 31 and may have an average p-type dopant concentration in a range from about $0.5\times10^{17}$ atom/$cm^3$ to about $1\times10^{17}$ atom/$cm^3$, which indicates less vertical straggling of the p-type dopants within region 33.

FIG. 7A further illustrates that the dopant concentration profile 32 exhibits less lateral diffusion and straggling. For example, regions 35 are positioned along the top surface of the substrate 10, above lateral protrusions of the dopant concentration profile 32, and laterally adjacent a top region of the dopant concentration profile 32. FIG. 7A also illustrates regions 37 positioned above region 33, below the lateral protrusions of the dopant concentration profile 32, and laterally adjacent a bottom region of the dopant concentration profile 32. Regions 35 and regions 37 are below the implantation mask 22 and have fewer dopants due to using implantation techniques such as those discussed herein. In some embodiments, the p-type dopant concentration in regions 35 may be less than $2.7\times10^{17}$ atom/$cm^3$, which indicate less lateral straggling of the p-type dopants towards the projected n-wells 30 at smaller depths. In some embodiments, the p-type dopant concentration in regions 37 maybe less than $1.6\times10^{17}$ atom/$cm^3$, which indicates less lateral straggling of the p-type dopants towards the projected n-wells 30 at larger depths.

Figure 7B:
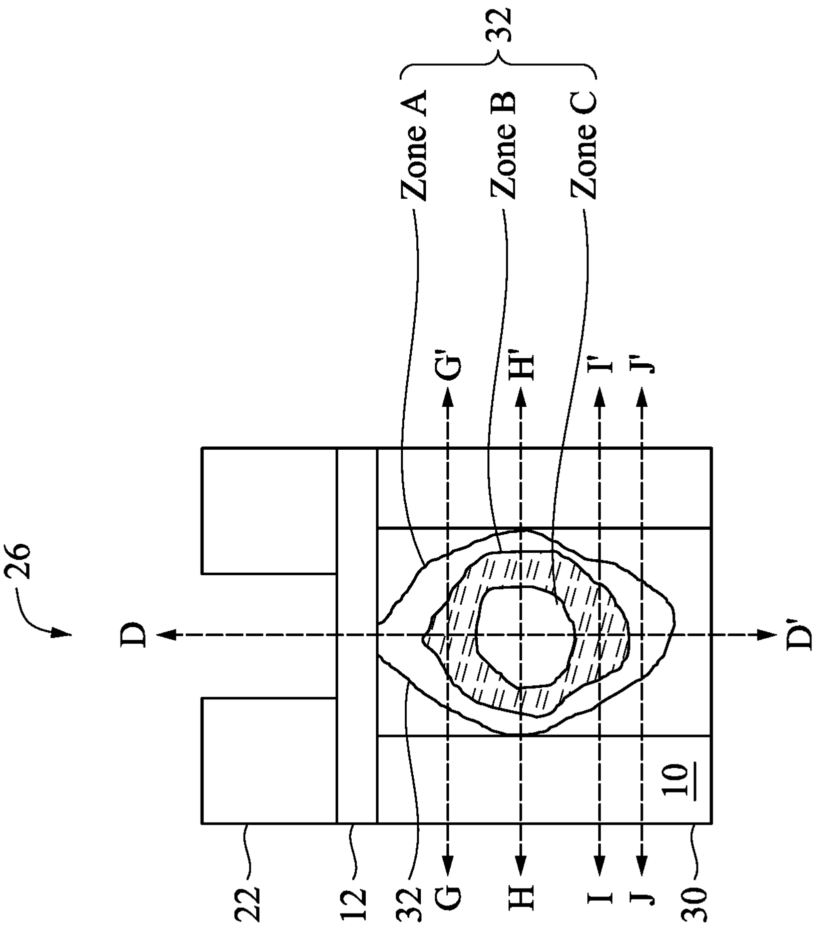
Figure 8A:
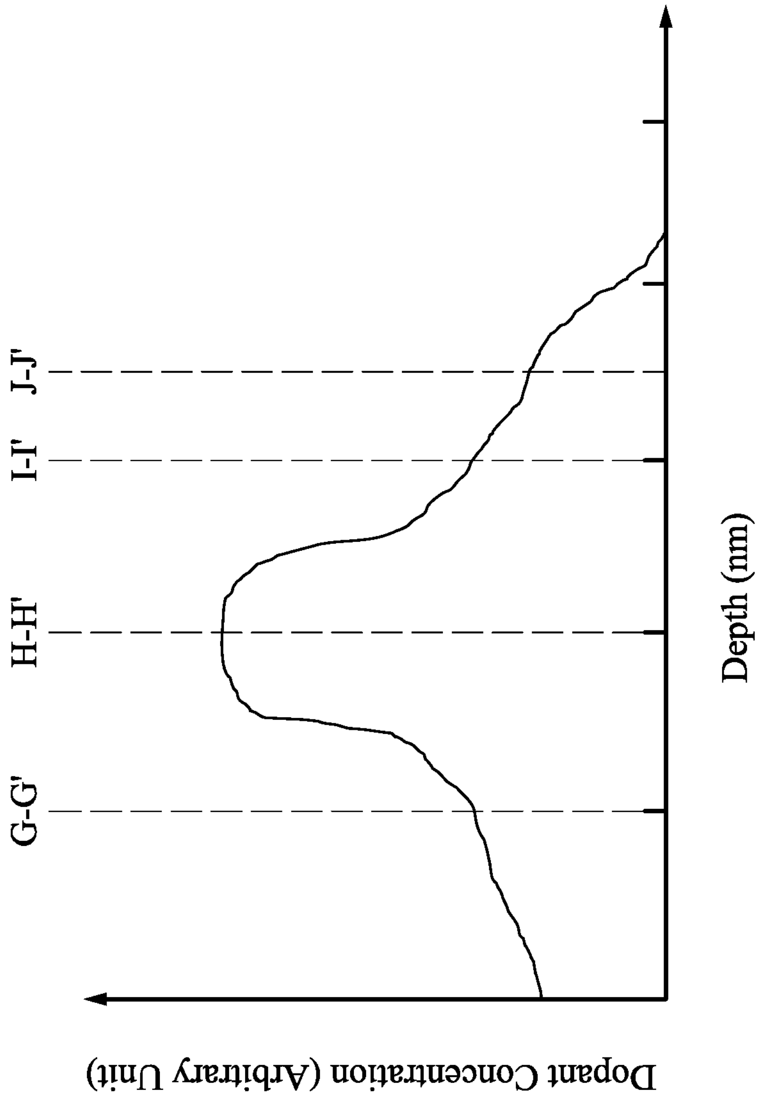
FIGS. 8A and 8B illustrate plots that demonstrate relationships between dopant concentrations and distances.
Figure 8B:
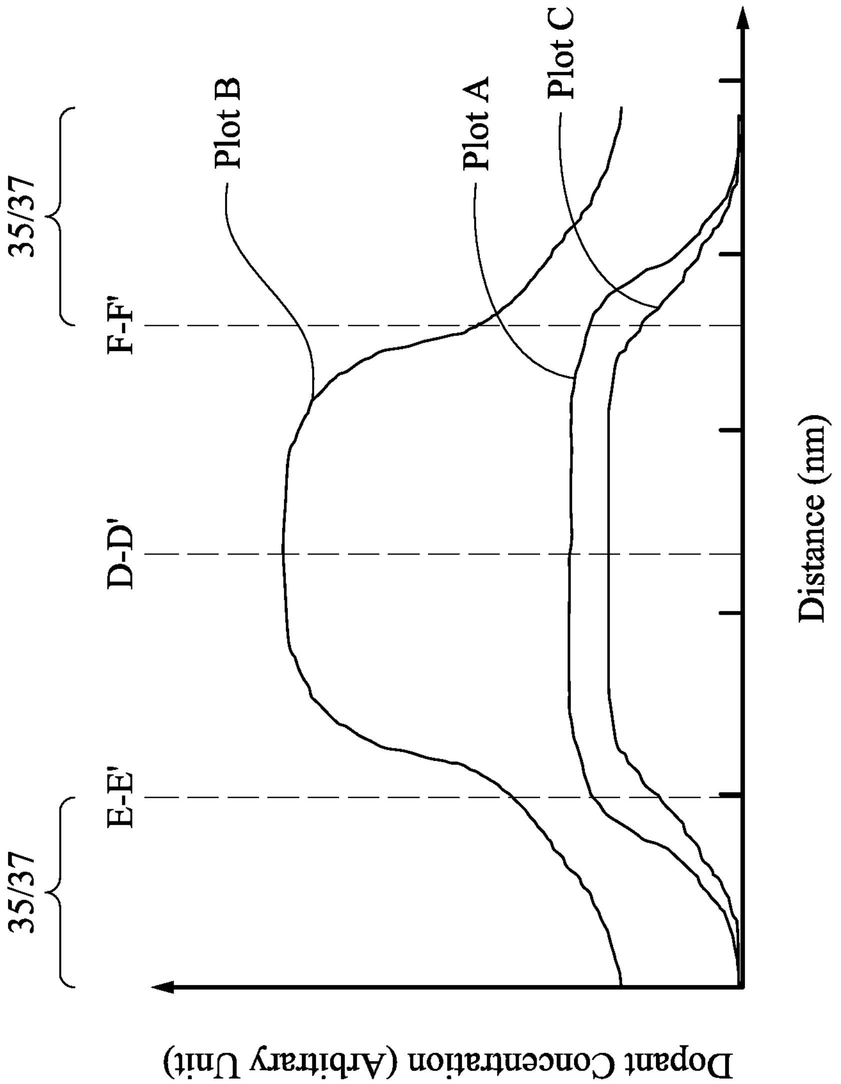

FIG. 7B illustrates the same dopant concentration profile 32 of the p-well 24 as shown in FIG. 7A with reference lines D-D', G-G', H-H', I-I', and J-J' added, and FIGS. 8A and 8B provides dopant concentration plots along the illustrated reference lines. Line D-D' extends vertically through a center of the opening 26, and lines G-G', H-H', I-I', and J-J' are perpendicular to line D-D' at various depths. Line H-H' extends horizontally through a horizontal center of zone A, zone B, and zone C of the dopant concentration profile 32, and line G-G' extends horizontally through the p-well 24 at a depth of about midway between line H-H' and the top surface of the substrate 10. Line I-I' extends horizontally at a depth 1.5 times of the depth of line H-H' from an upper surface of the substrate 10. Line J-J' extends horizontally at a depth 1.75 times of the depth of line H-H' from the upper surface of the substrate 10. For example, in some embodiments line H-H' is at a depth of about 150 nm to about 250 nm, such as about 200 nm, beneath the top surface of the substrate 10; line G-G' is at a depth of about 75 nm to about 125 nm, such as about 100 nm, from the top surface of the substrate 10; line I-I' is at a depth of about 275 nm to about 325 nm, such as about 300 nm, from the top surface of the substrate 10; and line J-J' is at a depth of about 330 nm to about 370 nm, such as about 350 nm, from the top surface of the substrate 10.

FIG. 8A shows a plot of dopant concentration as a function of depth beneath the top surface of the substrate 10 along line D-D' shown in FIG. 7B. In some embodiments, the magnitude of the slope (the change in concentration over the change in depth) of the concentration profile from line G-G' to line H-H' may be greater than the magnitude of the slope from the top surface of the substrate 10 to line G-G'. In other words, a first slope of the plot from line G-G' to line H-H' is steeper than a second slope of the plot from the start of the plot to line G-G'. In some embodiments, the magnitude of the slope from line H-H' to line I-I' may be greater than the magnitude of the slope from line I-I' to line J-J'. In other words, a third slope of the plot from line H-H' to line I-I' is steeper than a fourth slope of the plot from line I-I' to line J-J'. In some embodiments, the peak of the plot is between line G-G' and I-I', and the slopes from the peak is relatively steep, which indicates dopants piling up between lines G-G' and I-I'. In some embodiments, the plot has a relatively sharp drop-off beyond line J-J', which also indicates dopants piling up above line J-J'.

FIG. 8B shows plot A, plot B, and plot C representing dopant concentrations as a function of distance from a left interface between the p-well 24 and the projected n-wells 30 to a right interface between the p-well 24 and the projected n-wells 30 along line G-G', line H-H', and line J-J', respectively, as shown in FIG. 7B. In some embodiments, plot A may also represent dopant concentration as a function of distance from a left interface between the p-well 24 and the projected n-wells 30 to a right interface between the p-well 24 and the projected n-wells 30 along line I-I'. As illustrated in FIG. 8B, plot B, which extends through a horizontal center of the high concentration area of zone C, shows a dopant concentration profile increasing to a high flat peak centered on line D-D'.

Plots A and C, which extend through regions 35 and regions 37 respectively (see FIGS. 7A and 7B), illustrate dopant profiles that have relatively few dopants at the lateral boundaries and steep slopes that increase sharply to relatively low and flat peaks. For reference, lines E-E' and F-F' indicating the inner location of regions 35 and regions 37 have been added to FIG. 8B. The relatively low and flat peaks between lines E-E' and F-F' are a result of utilizing the tilt implantation technique during the doping of the p-well 24 and indicates less vertical straggling into those respective regions. The sharp slope extending away from the relatively low and flat peaks near between lines E-E' and F-F' are a result of utilizing the parallel implantation technique during the doping of the p-well 24 and indicates less lateral straggling into those respective regions.

In some embodiments, between lines E-E' and D-D', a magnitude of the slope of plot B is greater than a magnitude of the slope of plot A and a magnitude of the slope of plot C, and between lines D-D' and F-F', a magnitude of the slope of plot B is greater than a magnitude of the slope of plot A and a magnitude of the slope of plot C In some embodiments, the highest point of plot B is higher than the highest point of plots A and C, and the highest point of plot A is higher than the highest point of plot C. For example, the highest point of plot A is about 30% to about 40% the highest point of plot B and the highest point of plot C is about 20% to about 30% the highest point of plot B. In some embodiments, the lowest point of plot B is higher than the lowest point of plots A and B, and the lowest point of plot A is about the same as the lowest point of plot C. In some embodiments, the lowest point of plot B is about the same as or greater than the highest point of plot C. In other words, between lines E-E' and F-F' plot B has a high and sharp peak whereas plots A and C have low and flat peaks. This is a result of utilizing the tilt implantation technique during the doping of the p-well 24 and indicates the piling up of dopants between lines E-E' and F-F' and at depths about line H-H'.

Figure 9:
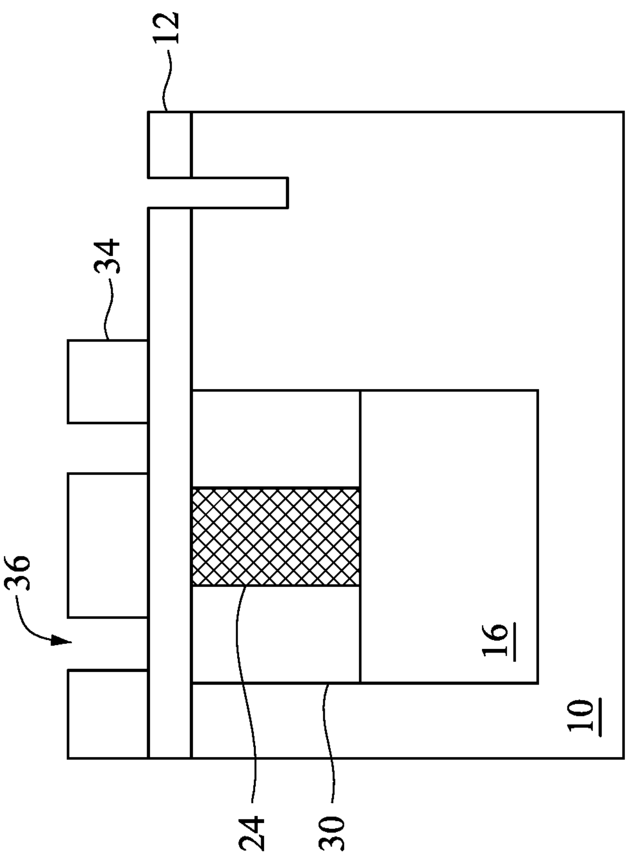

Referring to FIG. 9, implantation mask 22 is removed, and an implantation mask 34 is formed and an n-type ion implantation process is performed to form n-wells 30, in accordance with some embodiments. The n-wells 30 provide active regions in the substrate 10 for fabricating p-type metal-oxide-semiconductor (PMOS) devices as discussed in greater detail below. The implantation mask 34 may be formed of a material capable of substantially blocking ions during the subsequent implantation process. In some embodiments, the implantation mask 34 is formed of a photoresist, which is coated and then patterned using photolithography techniques to form openings 36. One or more n-type ion implantation processes may be performed using the implantation mask 34 to form the n-wells 30. In some embodiments, the n-wells 30 may be formed in a similar manner as discussed above with reference to forming the p-well 24 to achieve a same or similar dopant concentration profile in the n-wells 30 as discussed above with reference to the p-well 24. For example, the n-wells 30 may be formed by performing a first implantation with the ion beam being to be substantially parallel to the interface between the p-well 24 and the projected n-well 30 and at the second tilt angle β relative to the top surface of the substrate 10 and mask layer 12, twisting or rotating the wafer by 180 degrees relative to the ion beam, and performing a second implantation similar to the first implantation. FIG. 9 and the subsequent figures illustrate a portion of the substrate 10 that includes two n-wells 30. More n-wells 30 may be formed in others portions of the substrate 10, but are not shown. The n-type dopant may include phosphorous, arsenic, antimony, the like, or combinations thereof. The n-type ion implantation may be performed using an energy lower than the energy for forming the deep n-wells 16, such as in a range from about 5 keV to about 400 keV. The implantation temperature may be in a range from about −60° C. to about 450° C. The n-wells 30 extend to the top surface of the substrate 10, and may extend to deep n-well 16. As illustrated in FIG. 9, the n-wells 30 may extend laterally past the lateral edges of the openings 36 due to the implantation process. The n-type dopant concentration in n-wells 30 may be equal to or less than $1\times10^{20}$ cm$^{-3}$, such as in a range from about $1\times10^{17}$ cm$^{-3}$ to about $1\times10^{20}$ cm$^{-3}$. The implantation mask 34 may be then removed, such as by an acceptable ashing process in some embodiments. Afterwards, an annealing may be used to repair implantation damage and to activate the implanted impurities. The annealing may be performed at a temperature in a range from about 1000° C. to about 1100° C., such as about 1050° C. for a duration of about 1 second to about 20 seconds, such as about 10 seconds. FIGS. 4 through 9 show forming the p-well 24 prior to forming the n-wells 30 for illustrative purposes. In some embodiments, the n-wells 30 may be formed prior to the p-well 24.

Figure 10:
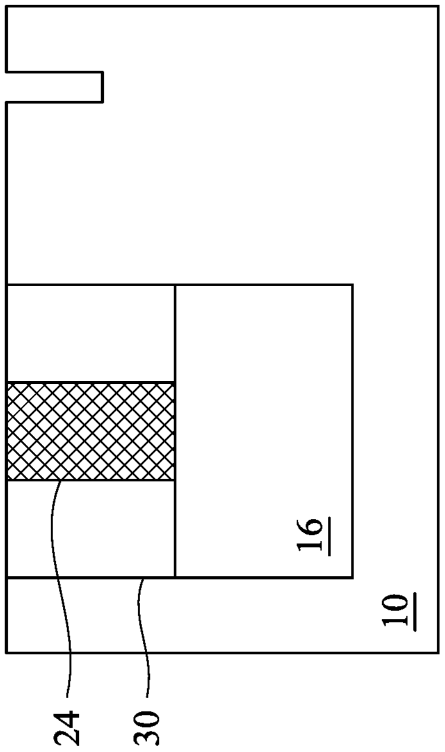
Figure 11:
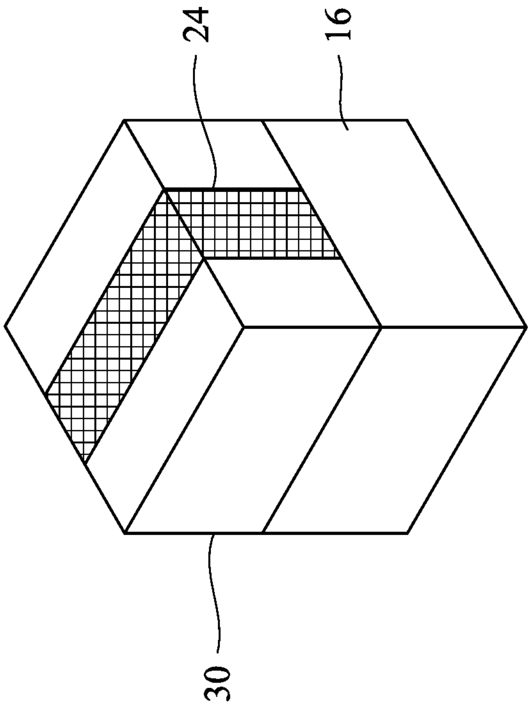

Referring to FIG. 10, the mask layer 12 is removed, such as by an acceptable etching process, in accordance with some embodiments. FIG. 11 illustrates a perspective view of a portion of the structure shown in FIG. 10 in accordance with some embodiments. In the structure shown in FIG. 11, the top surfaces of the p-well 24 and the n-wells 30 may be shaped as rectangles and each p-well 24 and n-well 30 may be disposed next to another in an alternating fashion. In some embodiments, the width of the shorter side of the p-well 24 is in a range from about 90 nm to about 120 nm. In some embodiments, the width of the shorter sides of the n-wells 30 are in a range from about 80 nm to about 110 nm.

Figure 12:
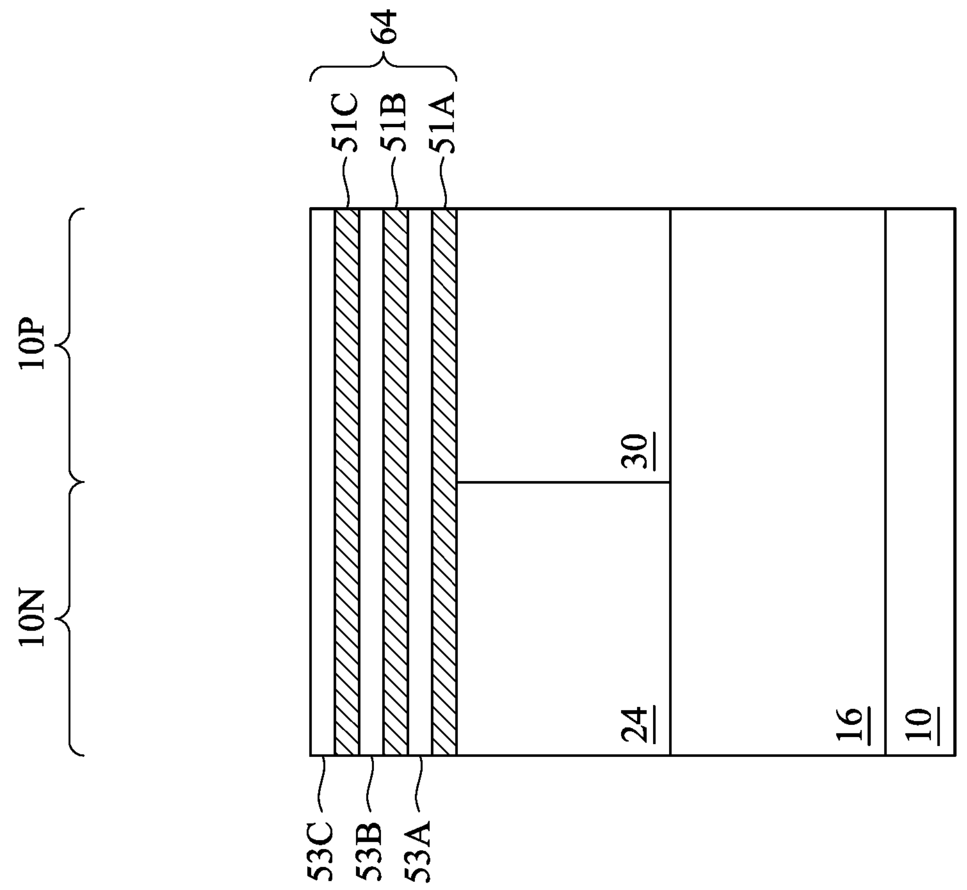

As illustrated in FIG. 12, the substrate 10 has an n-type region 10N and a p-type region 10P. The n-type region 10N includes the p-well 24 and can be for forming n-type devices, such as NMOS transistors, e.g., n-type nano-FETs. The p-type region 10P includes the n-well 30 and can be for forming p-type devices, such as PMOS transistors, e.g., p-type nano-FETs. FIG. 12 illustrates one p-well 24 and one adjacent n-well for illustrative purposes, and the substrate 10 may include any number of such interfaces. Additionally, although one n-type region 10N and one p-type region 10P are illustrated, any number of n-type regions 10N and p-type regions 10P may be provided.

Further in FIG. 12, a multi-layer stack 64 is formed over the substrate 10. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 10P. Also, the first semiconductor layers 51 will be removed and the second semiconductor layers 53 will be patterned to form channel regions of nano-FETs in the n-type region 10N. Nevertheless, in some embodiments the first semiconductor layers 51 may be removed and the second semiconductor layers 53 may be patterned to form channel regions of nano-FETs in the n-type region 10N, and the second semiconductor layers 53 may be removed and the first semiconductor layers 51 may be patterned to form channel regions of nano-FETs in the p-type region 10P.

Figure 32A:
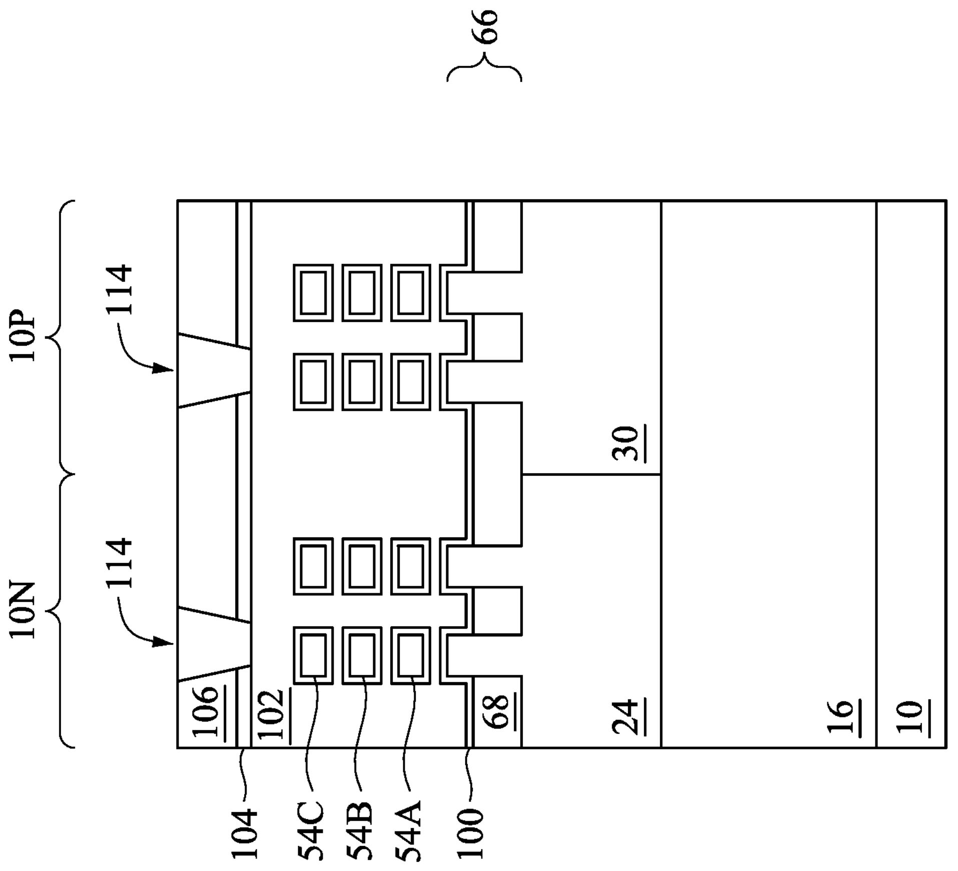
Figure 32B:
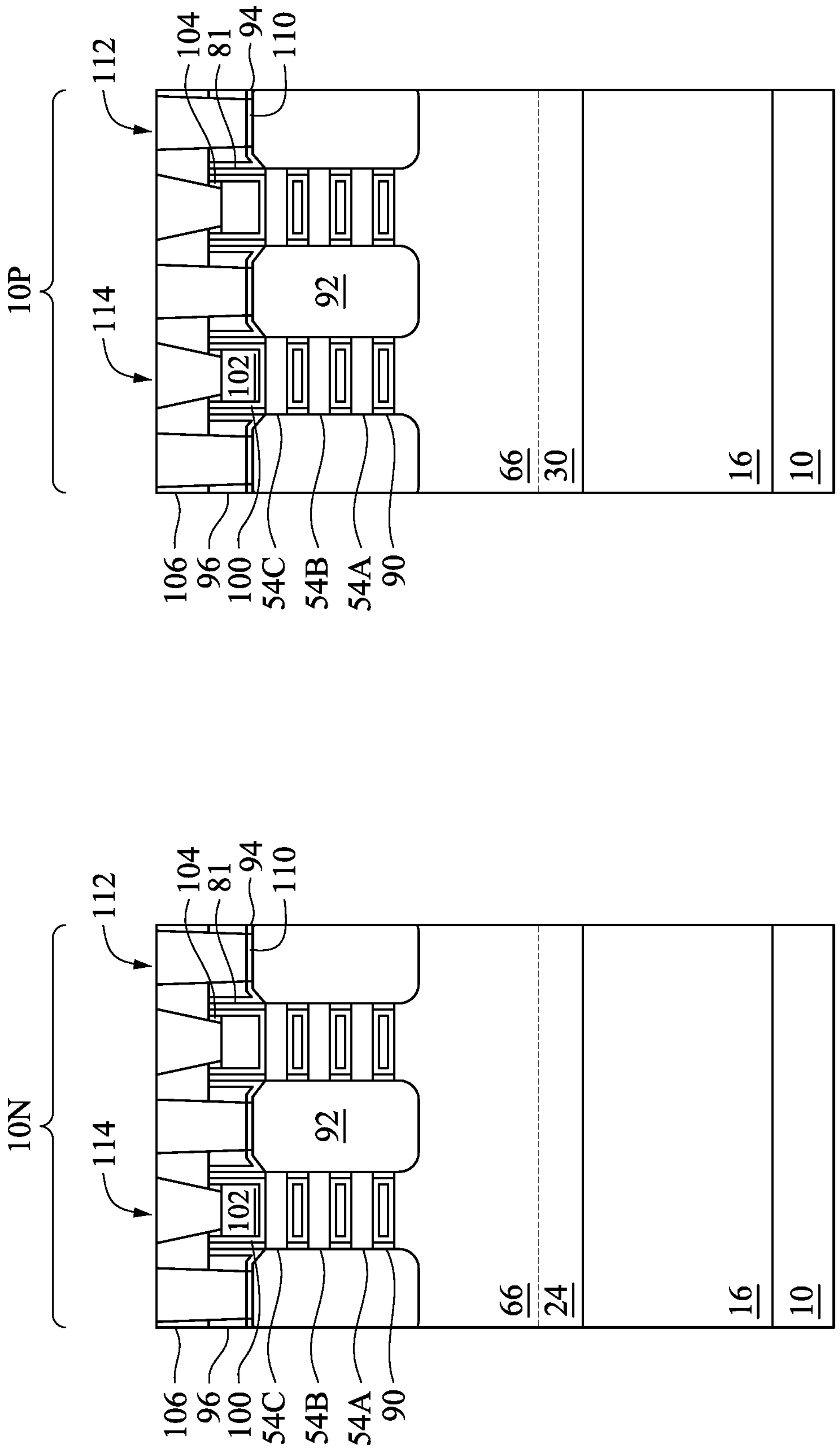
Figure 32C:
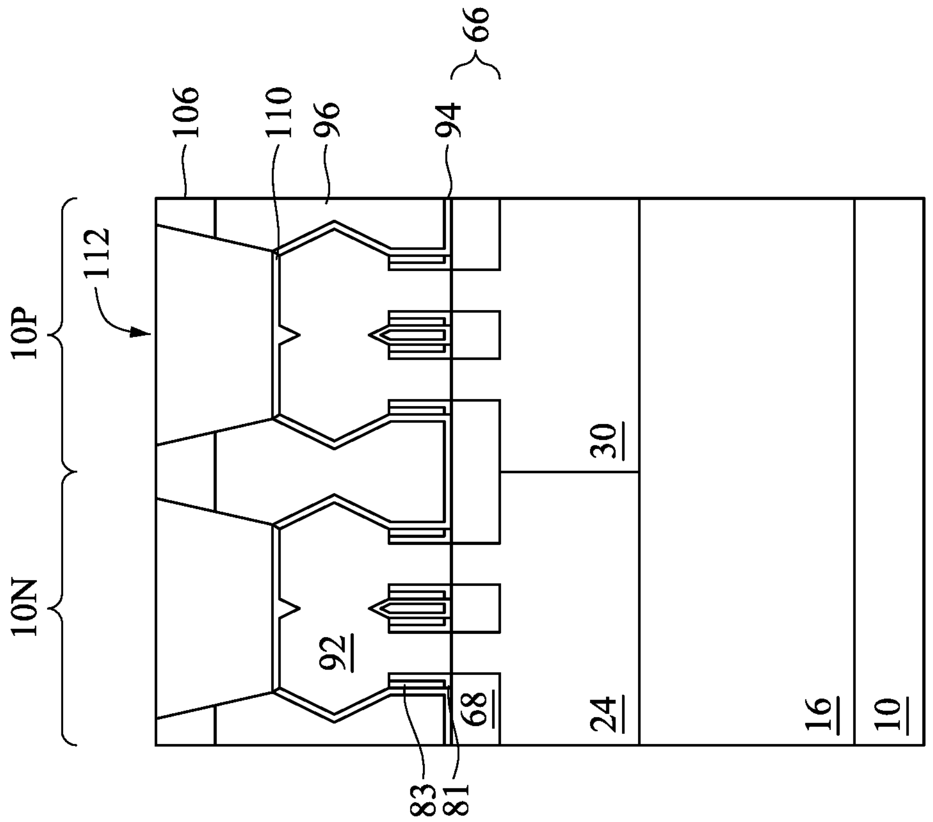

In some embodiments, the first semiconductor layers 51 may be removed and the second semiconductor layers 53 may be patterned to form channel regions of nano-FETS in both the n-type region 10N and the p-type region 10P. In other embodiments, the second semiconductor layers 53 may be removed and the first semiconductor layers 51 may be patterned to form channel regions of non-FETs in both the n-type region 10N and the p-type region 10P. In such embodiments, the channel regions in both the n-type region 10N and the p-type region 10P may have a same material composition (e.g., silicon, or the another semiconductor material) and be formed simultaneously. FIGS. 32A-C illustrate a structure resulting from such embodiments where the channel regions in both the p-type region 10P and the n-type region 10N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs. The first semiconductor layers 51 and the second semiconductor layers 53 may be doped in situ or using one or more implant processes.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 10N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 10P, thereby allowing the first semiconductor layers 51 to be patterned to form channel regions of p-type nano-FETs.

Figure 13:
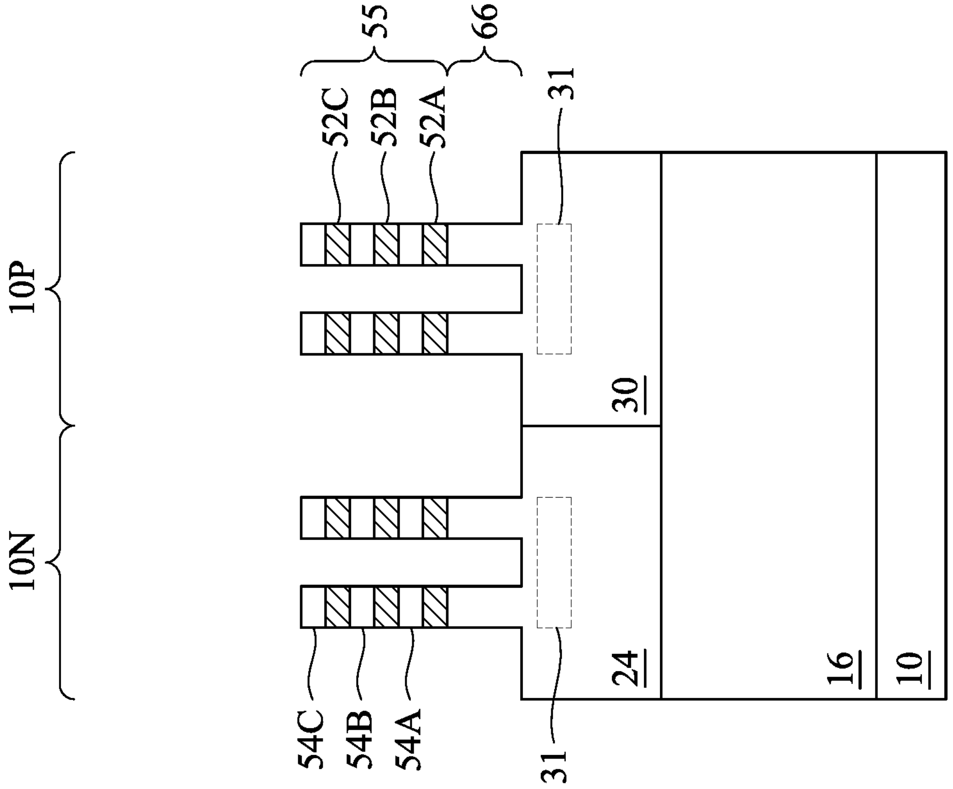

Referring now to FIG. 13, fins 66 are formed in the substrate 10 and nanostructures 55 are formed in the multi-layer stack 64, in accordance with some embodiments. The fins 66 protrude from a top surface of the substrate 10 and the height of the fins 66 is in a range from about 50 nm to about 70 nm. In some embodiments, the nanostructures 55 and the fins 66 may be formed in the multi-layer stack 64 and the substrate 10, respectively, by etching trenches in the multi-layer stack 64 and the substrate 10. As discussed above, region 31 and/or zone C (e.g., the high dopant concentration area) remains in the substrate below the fins 66, which may lead to high resistance along leakage pathways 38 from the subsequently formed source/drain regions 92 as shown on FIG. 31A. For example, region 31 and/or zone C in the p-well 24 includes a high concentration region of p-type dopants, and the high concentration of p-type dopants creates high resistance along the leakage pathway 38 for the subsequently formed n-type source/drain regions 92. Similarly, region 31 and/or zone C in the n-well 30 includes a high concentration region of n-type dopants, and the high concentration of n-type dopants creates high resistance along the leakage pathway 38 for the subsequently formed p-type source/drain regions 92.

The etching process to form the fins 66 and the nanostructures 55 may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55. FIG. 13 illustrates that two fins are formed in each of the n-type region 10N and the p-type region 10P, in other embodiments a different number of fins may be formed in each region.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 13 illustrates the fins 66 in the n-type region 10N and the p-type region 10P as having substantially equal widths for illustrative purposes. In some embodiments, widths of the fins 66 in the n-type region 10N may be greater or thinner than the fins 66 in the p-type region 10P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 10. In such embodiments, each of the nanostructures 55 may have a different width and be trapezoidal in shape.

Figure 14:
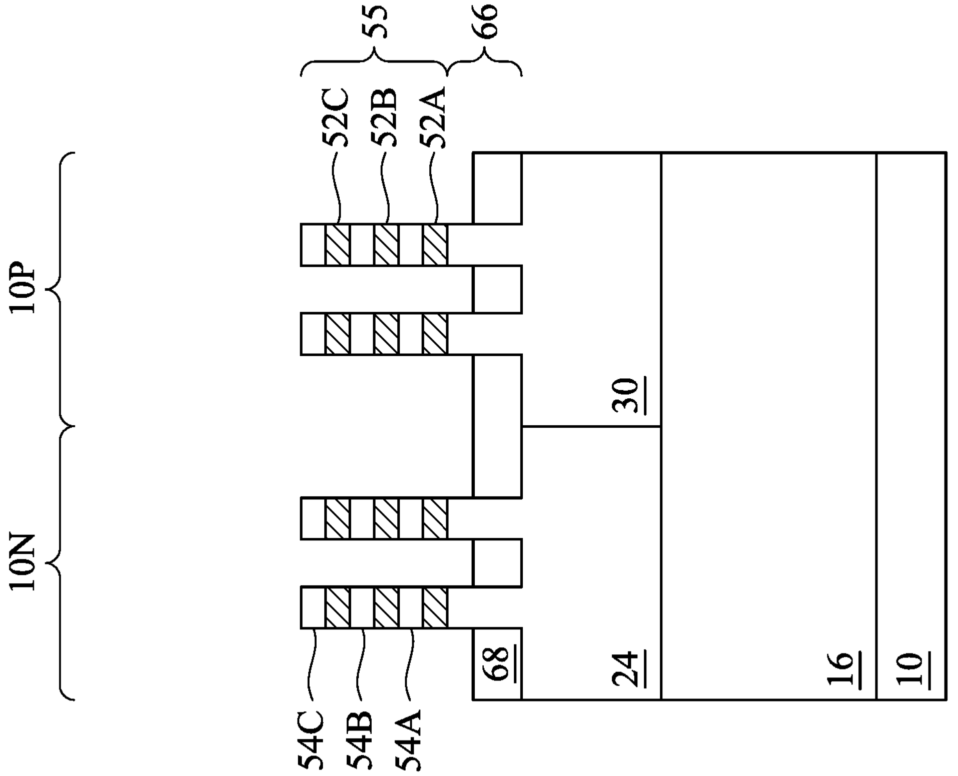

In FIG. 14, shallow trench isolation (STI) regions 68 are formed adjacent the fins 66. The STI regions 68 may be formed by depositing an insulation material over the substrate 10, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An annealing process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along the top surface of the substrate 10, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 10N and the p-type region 10P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIG. 12 through FIG. 14 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 10, and trenches can be etched through the dielectric layer to expose the underlying substrate 10. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments, where epitaxial structures are epitaxially grown, the epitaxially grown materials may be in situ doped during growth, or doped through one or more implantation processes.

Additionally, the first semiconductor layers 51 (and resulting nanostructures 52) and the second semiconductor layers 53 (and resulting nanostructures 54) are illustrated and discussed herein as comprising the same materials in the p-type region 10P and the n-type region 10N for illustrative purposes only. As such, in some embodiments one or both of the first semiconductor layers 51 and the second semiconductor layers 53 may be different materials or formed in a different order in the p-type region 10P and the n-type region 10N.

Further in FIG. 14, appropriate wells (not separately illustrated) may be formed in the nanostructures 55. In embodiments with different well types, different implantation steps for the n-type region 10N and the p-type region 10P may be achieved using a photoresist or other masks (not separately illustrated). For example, a photoresist may be formed over the fins 66, the nanostructures 55, and the STI regions 68 in the n-type region 10N and the p-type region 10P. The photoresist is patterned to expose the p-type region 10P. The photoresist can be formed by using a spin-on technique and can be patterned using acceptable photolithography techniques. Once the photoresist is patterned, an n-type impurity implantation is performed in the p-type region 10P, and the photoresist may act as a mask to substantially prevent n-type impurities from being implanted into the n-type region 10N. The n-type impurities may be phosphorus, arsenic, antimony, or the like implanted in the region to a concentration in a range from about $1\times10^{13}$ atom/cm$^3$ to about $1\times10^{14}$ atom/cm$^3$. After the implantation, the photoresist is removed, such as by an acceptable ashing process.

Following or prior to the implanting of the p-type region 10P, a photoresist or other masks (not separately illustrated) is formed over the fins 66, the nanostructures 55, and the STI regions 68 in the p-type region 10P and the n-type region 10N. The photoresist is patterned to expose the n-type region 10N. The photoresist can be formed by using a spin-on technique and can be patterned using acceptable photolithography techniques. Once the photoresist is patterned, a p-type impurity implantation may be performed in the n-type region 10N, and the photoresist may act as a mask to substantially prevent p-type impurities from being implanted into the p-type region 10P. The p-type impurities may be boron, boron fluoride, indium, or the like implanted in the region to a concentration in a range from about $1\times10^{13}$ atom/cm$^3$ to about $1\times10^{14}$ atom/cm$^3$. After the implantation, the photoresist may be removed, such as by an acceptable ashing process.

After the implantations of the n-type region 10N and the p-type region 10P, an annealing may be performed to repair implantation damage and to activate the p-type and/or n-type impurities that were implanted. In some embodiments, the grown materials of epitaxial fins may be in situ doped during growth, which may obviate the implantations, although in situ and implantation doping may be used together.

Figure 15:
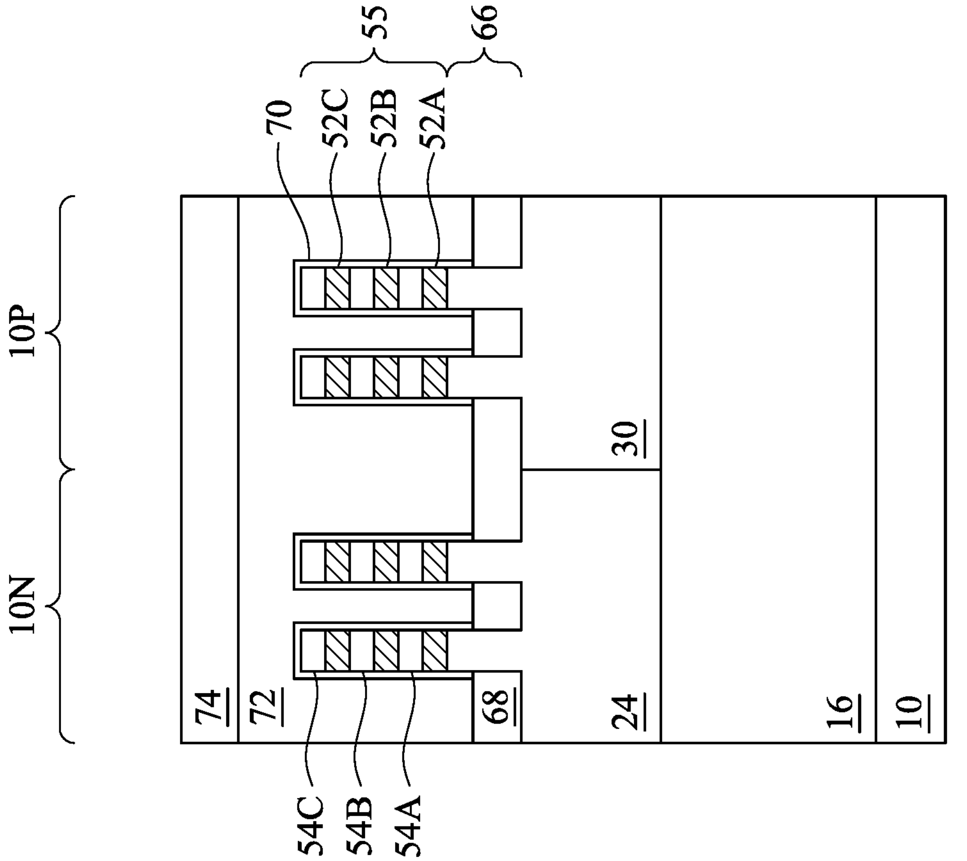

In FIG. 15, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 10N and the p-type region 10P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 16A:
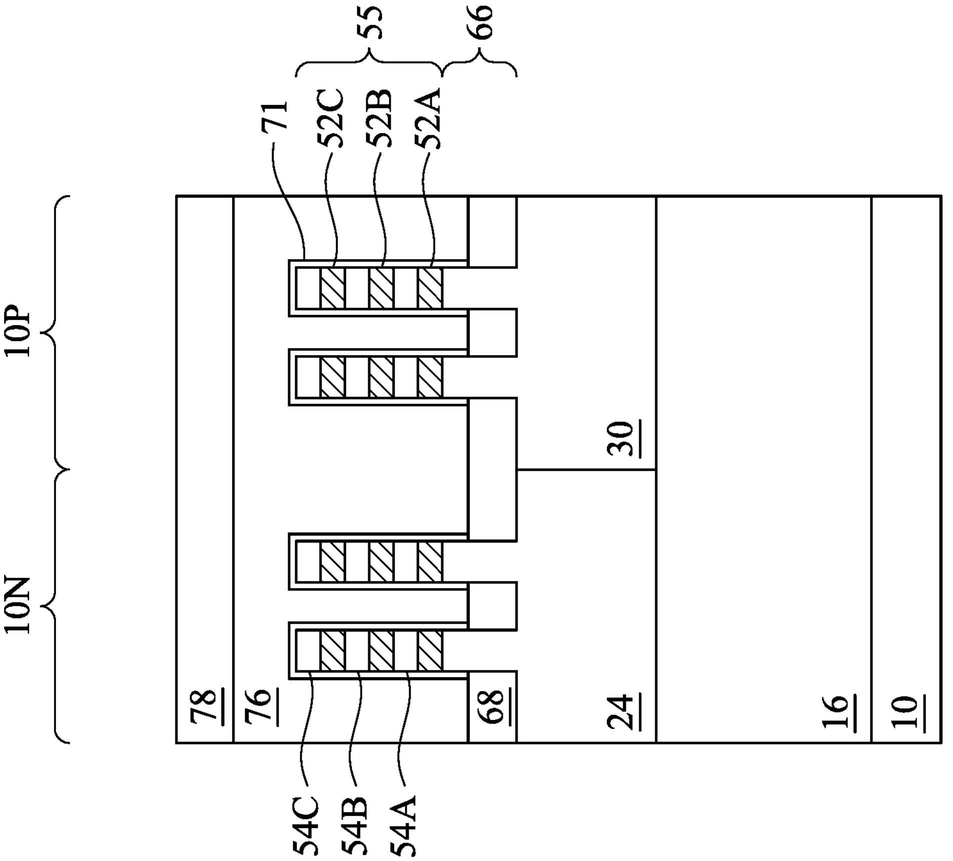
Figure 16B:
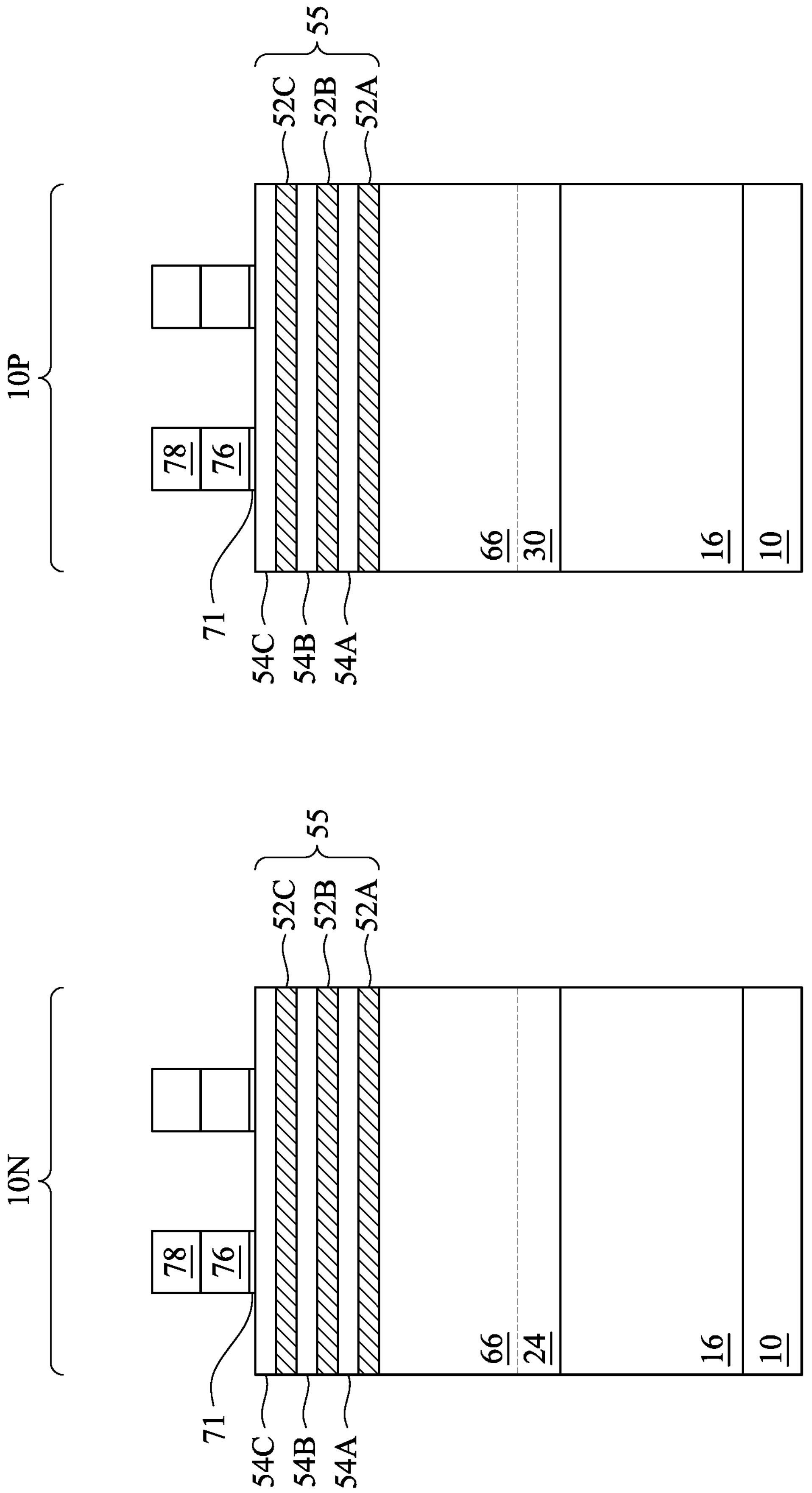

FIGS. 16A through 28C illustrate various additional steps in the manufacturing of embodiment devices. In FIGS. 16A and 16B, the mask layer 74 (see FIG. 15) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 17A:
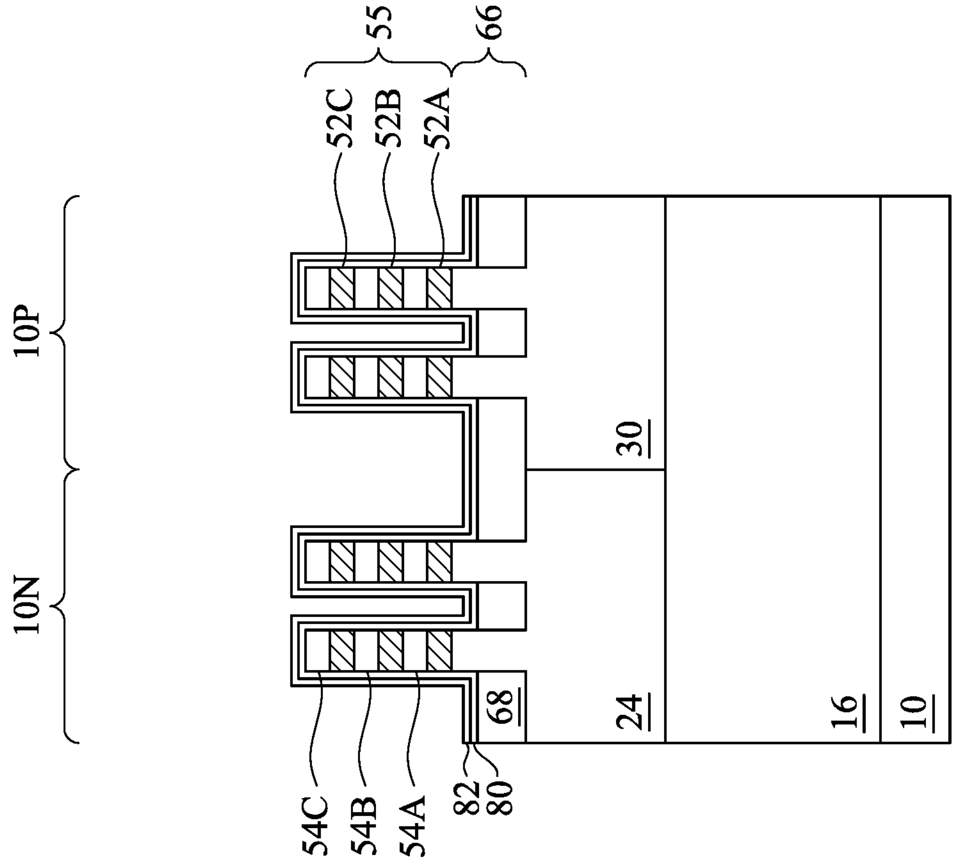
Figure 17B:
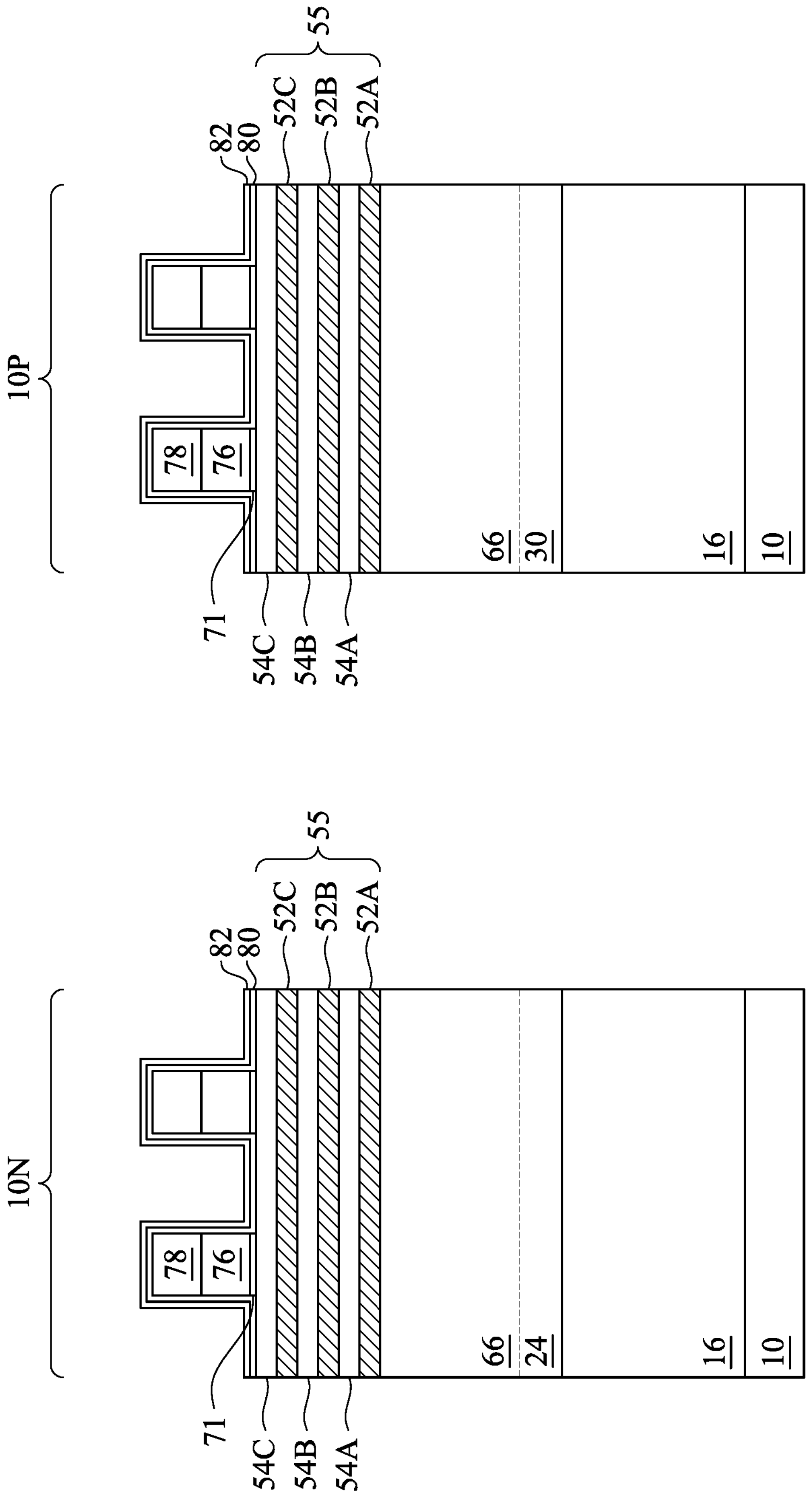

In FIGS. 17A and 17B, a first spacer layer 80 and a second spacer layer 82 are formed over the structures illustrated in FIGS. 16A and 16B, respectively. The first spacer layer 80 and the second spacer layer 82 will be subsequently patterned to act as spacers for forming self-aligned source/drain regions. In FIGS. 17A and 17B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implantations for lightly doped source/drain (LDD) regions (not separately illustrated) may be performed. In embodiments with different device types, similar to the implantations discussed above in FIG. 4, a mask, such as a photoresist, may be formed over the n-type region 10N, while exposing the p-type region 10P, and appropriate type (e.g., p-type) impurities may be implanted into the exposed fins 66 and nanostructures 55 in the p-type region 10P. The mask may then be removed. Subsequently, a mask, such as a photoresist, may be formed over the p-type region 10P while exposing the n-type region 10N, and appropriate type impurities (e.g., n-type) may be implanted into the exposed fins 66 and nanostructures 55 in the n-type region 10N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atom/cm$^3$ to about $1\times10^{19}$ atom/cm$^3$. An annealing may be used to repair implantation damage and to activate the implanted impurities.

Figure 18A:
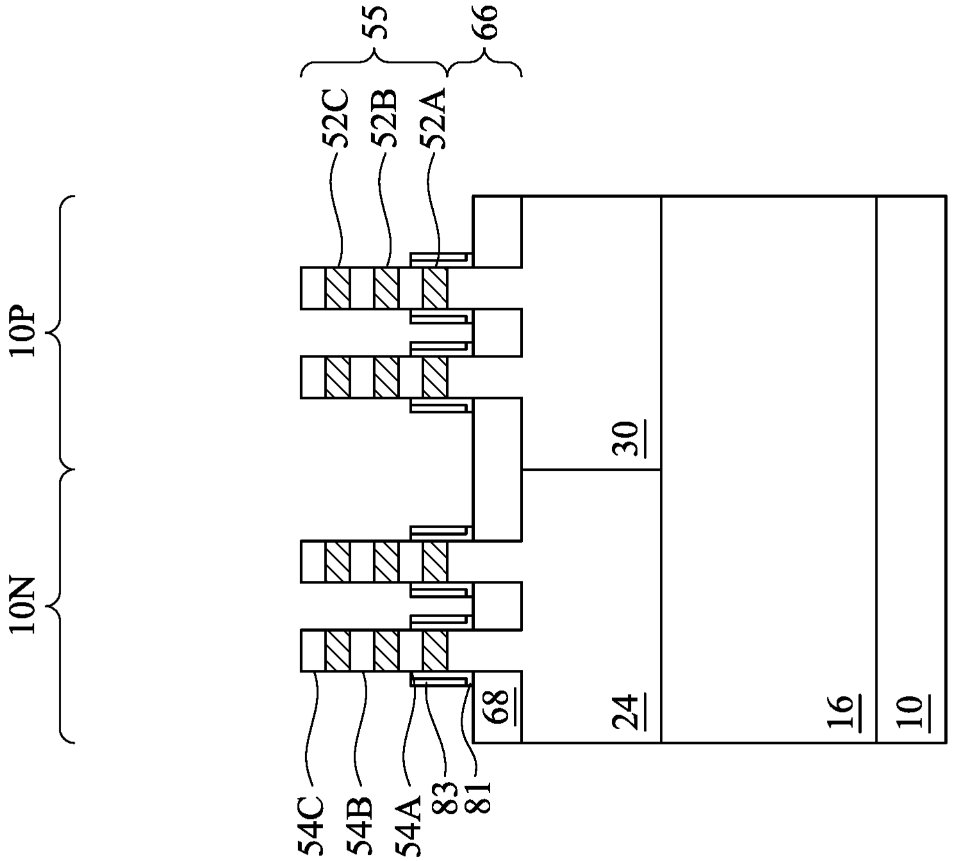
Figure 18B:
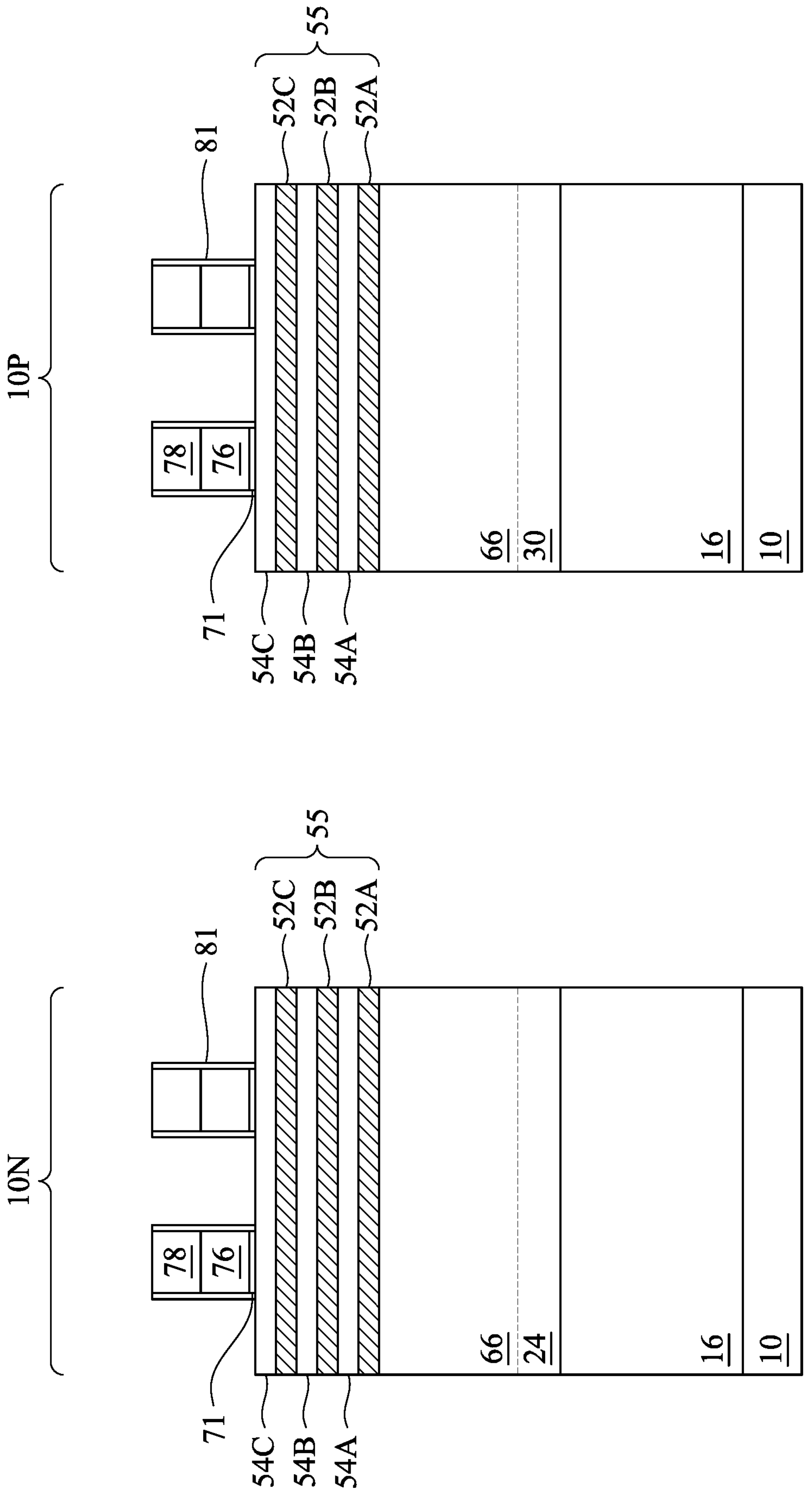

In FIGS. 18A and 18B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 18A. Thereafter, the second spacers 83 acts as a mask while etching exposed portions of the first spacer layer 80, thereby forming first spacers 81 as illustrated in FIG. 18A.

As illustrated in FIG. 18A, the first spacers 81 and the second spacers 83 are disposed on sidewalls of the fins 66 and/or nanostructures 55. As illustrated in FIG. 18B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 19A:
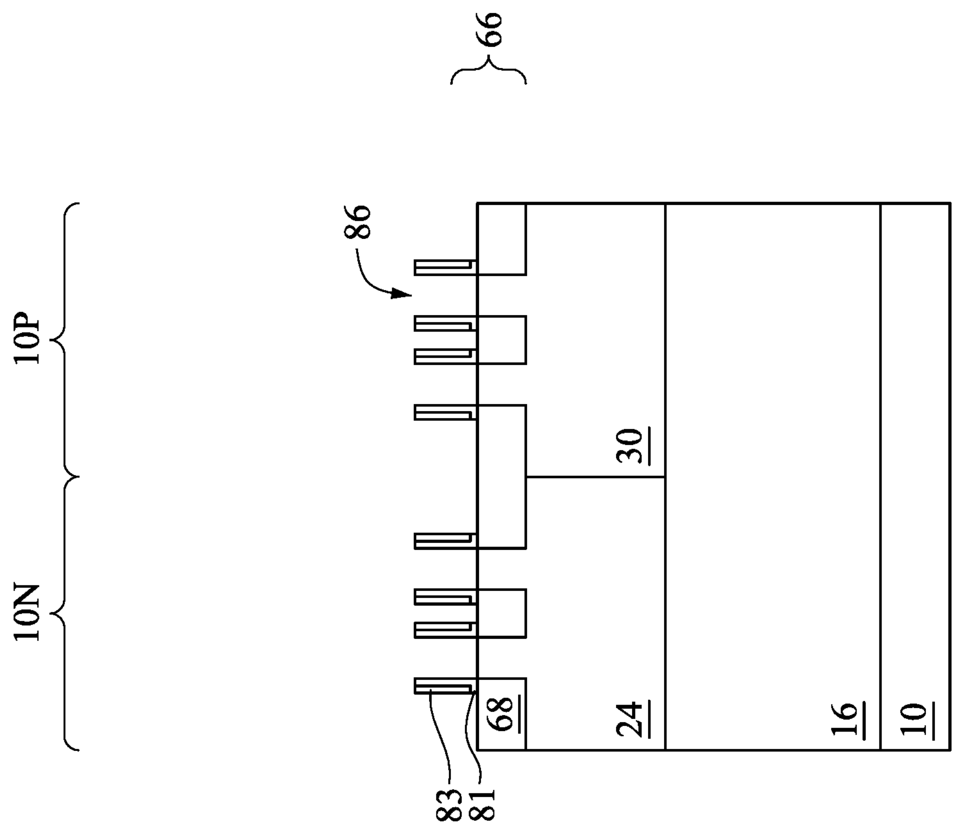
Figure 19B:
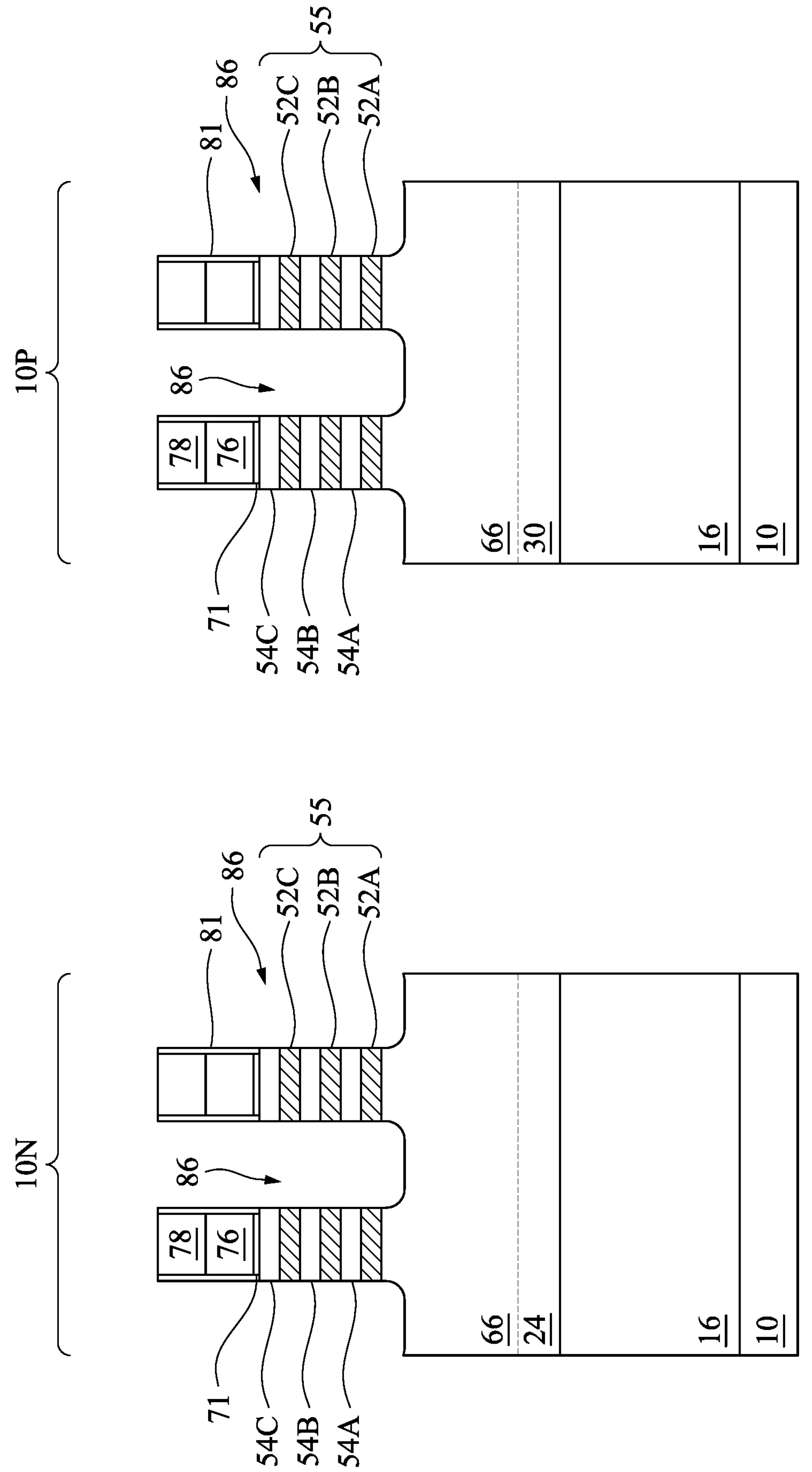

In FIGS. 19A and 19B, first recesses 86 are formed in the fins 66, the nanostructures 55, and the substrate 10, in accordance with some embodiments. Epitaxial source/drain regions will be subsequently formed in the first recesses 86. The first recesses 86 may extend through the first nanostructures 52 and the second nanostructures 54, and into the substrate 10. As illustrated in FIG. 19A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 10 using anisotropic etching processes, such as RIE, NBE, or the like. The first spacers 81, the second spacers 83, and the masks 78 mask portions of the fins 66, the nanostructures 55, and the substrate 10 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 20A:
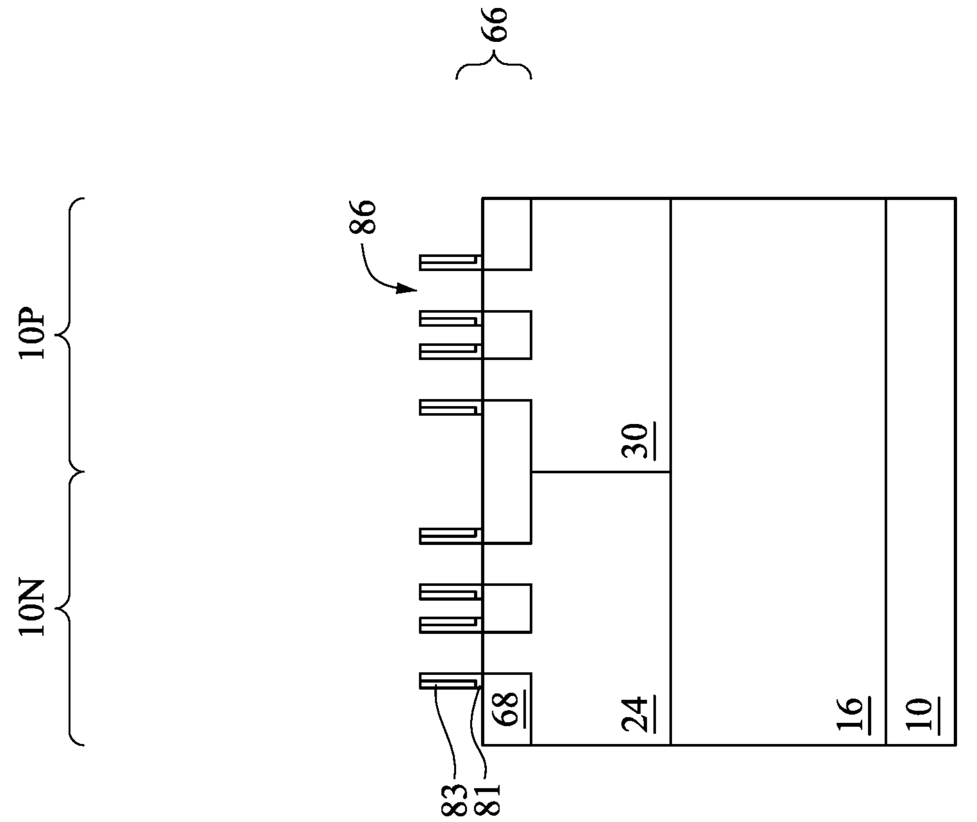
Figure 20B:
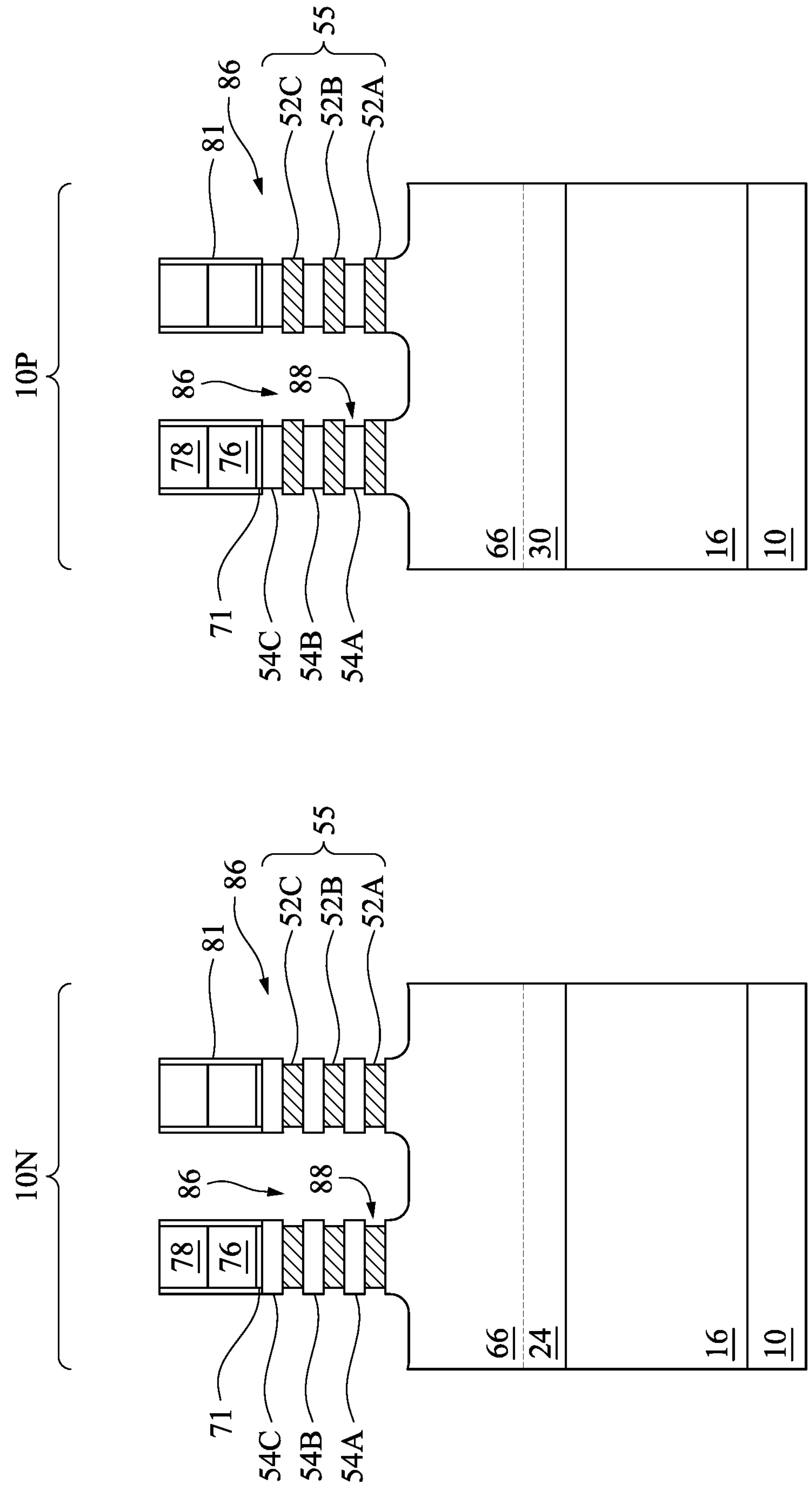

In FIGS. 20A and 20B, portions of sidewalls of the layers of the multi-layer stack 64 formed of the first semiconductor materials (e.g., the first nanostructures 52) exposed by the first recesses 86 are etched to form sidewall recesses 88 in the n-type region 10N, and portions of sidewalls of the layers of the multi-layer stack 64 formed of the second semiconductor materials (e.g., the second nanostructures 54) exposed by the first recesses 86 are etched to form sidewall recesses 88 in the p-type region 10P. Although sidewalls of the first nanostructures 52 and the second nanostructures 54 in sidewall recesses 88 are illustrated as being straight in FIG. 20B, the sidewalls may be concave or convex. The sidewalls may be etched using isotropic etching processes, such as wet etching or the like. The p-type region 10P may be protected using a mask (not shown) while etchants selective to the first semiconductor materials are used to etch the first nanostructures 52 such that the second nanostructures 54 and the substrate 10 remain relatively unetched as compared to the first nanostructures 52 in the n-type region 10N. Similarly, the n-type region 10N may be protected using a mask (not shown) while etchants selective to the second semiconductor materials are used to etch the second nanostructures 54 such that the first nanostructures 52 and the substrate 10 remain relatively unetched as compared to the second nanostructures 54 in the p-type region 10P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH4OH), or the like may be used to etch sidewalls of the first nanostructures 52 in the n-type region 10N, and a wet or dry etch process with hydrogen fluoride, another fluorine-based etchant, or the like may be used to etch sidewalls of the second nanostructures 54 in the p-type region 10P.

Figure 21A:
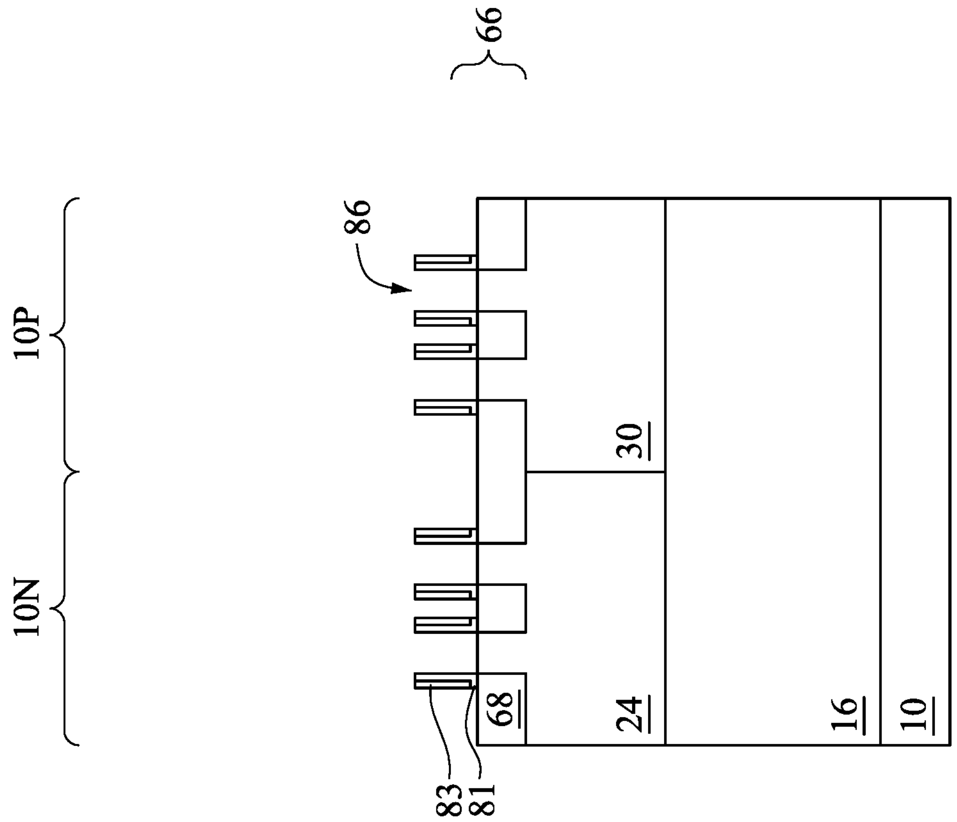
Figure 21B:
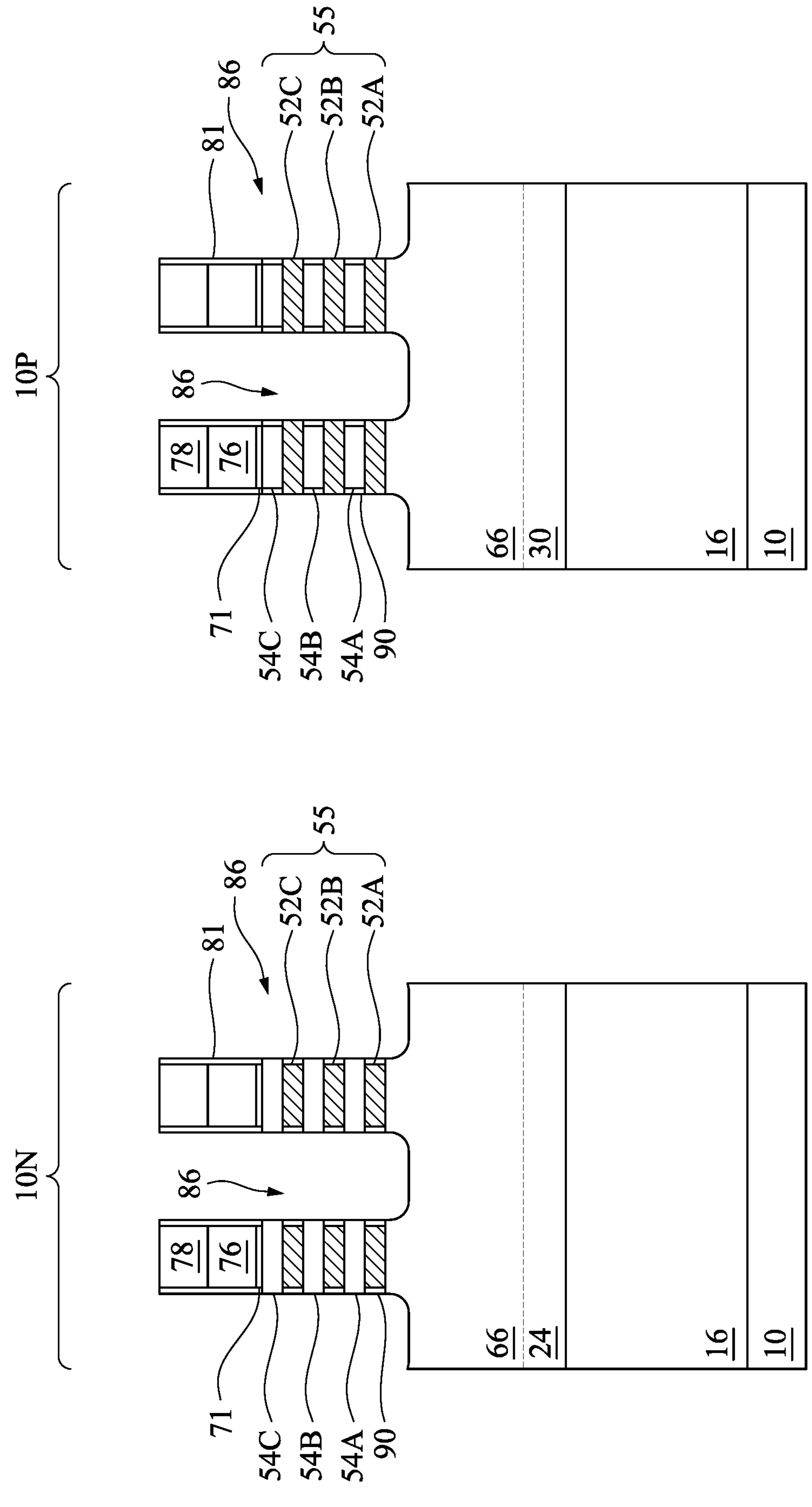
Figure 21C:
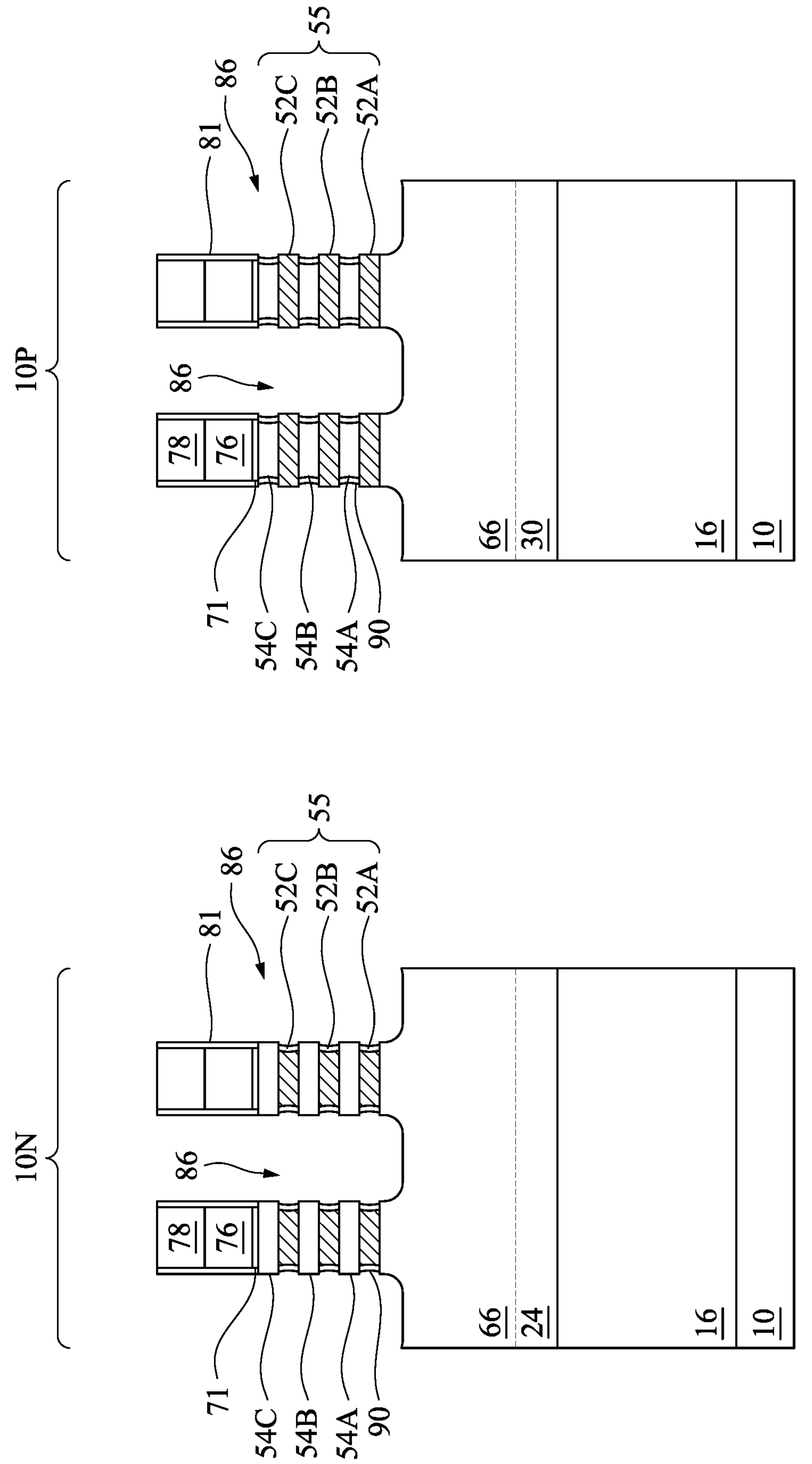

In FIGS. 21A-21C, first inner spacers 90 are formed in the sidewall recess 88. The first inner spacers 90 may be formed by depositing an inner spacer layer (not separately illustrated) over the structures illustrated in FIGS. 20A and 20B. The first inner spacers 90 act as isolation features between subsequently formed source/drain regions and a gate structure. As will be discussed in greater detail below, source/drain regions will be formed in the recesses 86, while the first nanostructures 52 in the n-type region 10N and the second nanostructures 54 in the p-type region 10P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 10N and flush with the sidewalls of the first nanostructures 52 in the p-type region 10P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 21B, the outer sidewalls of the first inner spacers 90 may be concave or convex. As an example, FIG. 21C illustrates an embodiment in which sidewalls of the first nanostructures 52 are concave, outer sidewalls of the first inner spacers 90 are concave, and the first inner spacers 90 are recessed from sidewalls of the second nanostructures 54 in the n-type region 10N. Also illustrated are embodiments in which sidewalls of the second nanostructures 54 are concave, outer sidewalls of the first inner spacers 90 are concave, and the first inner spacers 90 are recessed from sidewalls of the first nanostructures 52 in the p-type region 10P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 22A-22C) by subsequent etching processes, such as etching processes used to form gate structures.

Figure 22A:
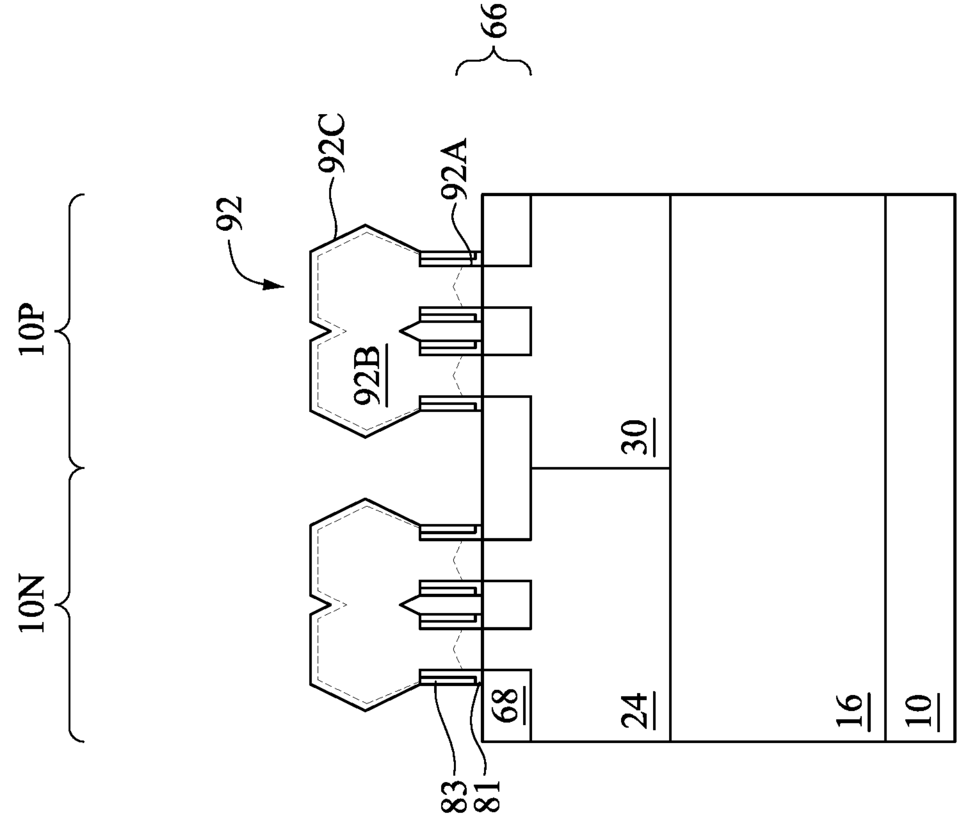
Figure 22B:
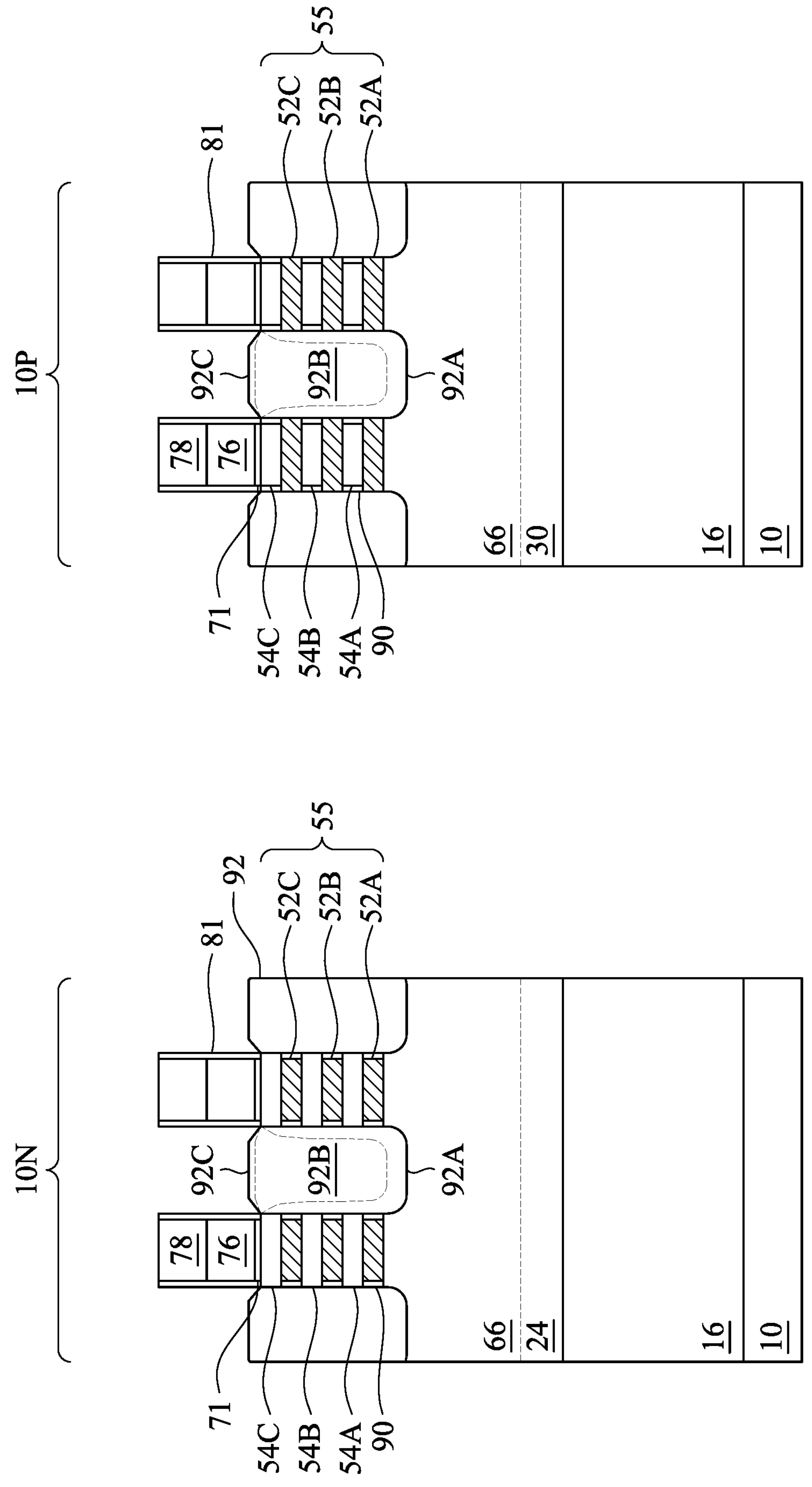
Figure 22C:
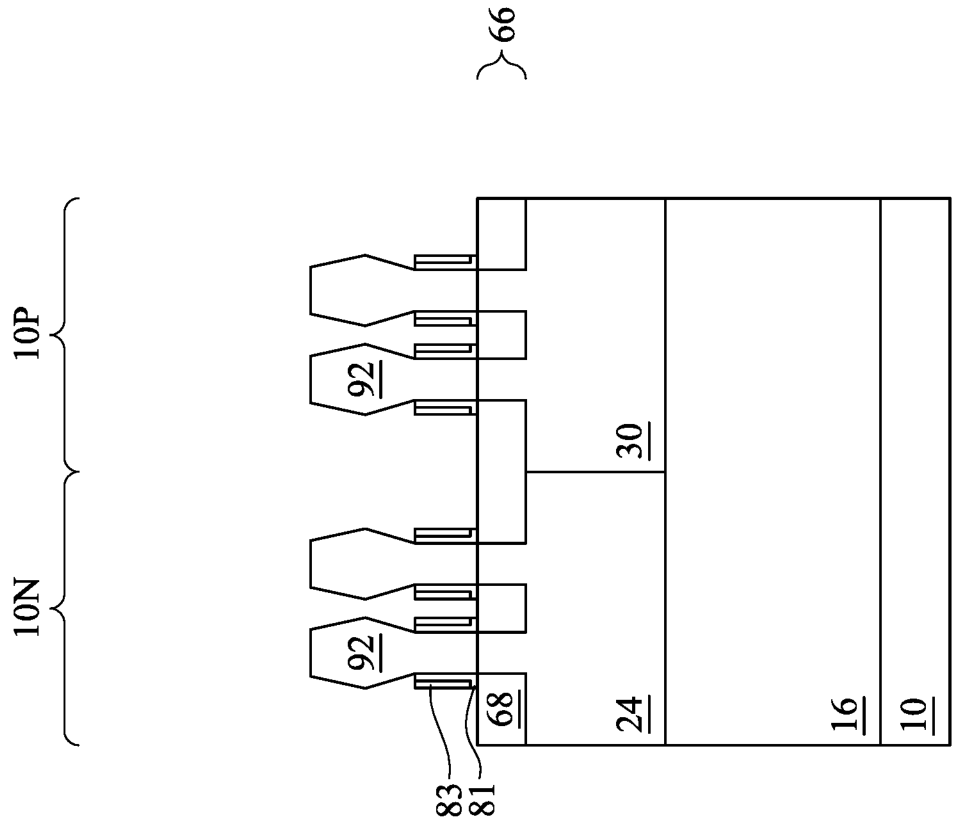

In FIGS. 22A-22C, epitaxial source/drain regions 92 are formed in the first recesses 86. In some embodiments, the source/drain regions 92 may exert stress on the second nanostructures 54 in the n-type region 10N and on the first nanostructures 52 in the p-type region 10P, thereby improving performance. As illustrated in FIG. 22B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 10N, e.g., the NMOS region, may be formed by masking the p-type region 10P, e.g., the PMOS region. Then, the epitaxial source/drain regions 92 are epitaxially grown in the first recesses 86 in the n-type region 10N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 10P, e.g., the PMOS region, may be formed by masking the n-type region 10N, e.g., the NMOS region. Then, the epitaxial source/drain regions 92 are epitaxially grown in the first recesses 86 in the p-type region 10P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first nanostructures 52, the second nanostructures 54, and/or the substrate 10 may be implanted with dopants to form source/drain regions, similar to the process previously discussed for forming lightly-doped source/drain regions, followed by an annealing. The source/drain regions may have an impurity concentration of between about $1\times10^{19}$ atom/cm$^3$ and about $1\times10^{21}$ atom/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 10N and the p-type region 10P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 22A. In other embodiments, adjacent epitaxial source/drain regions 92 remain separated after the epitaxy process is completed as illustrated by FIG. 22C. In the embodiments illustrated in FIGS. 22A and 22C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 22D:
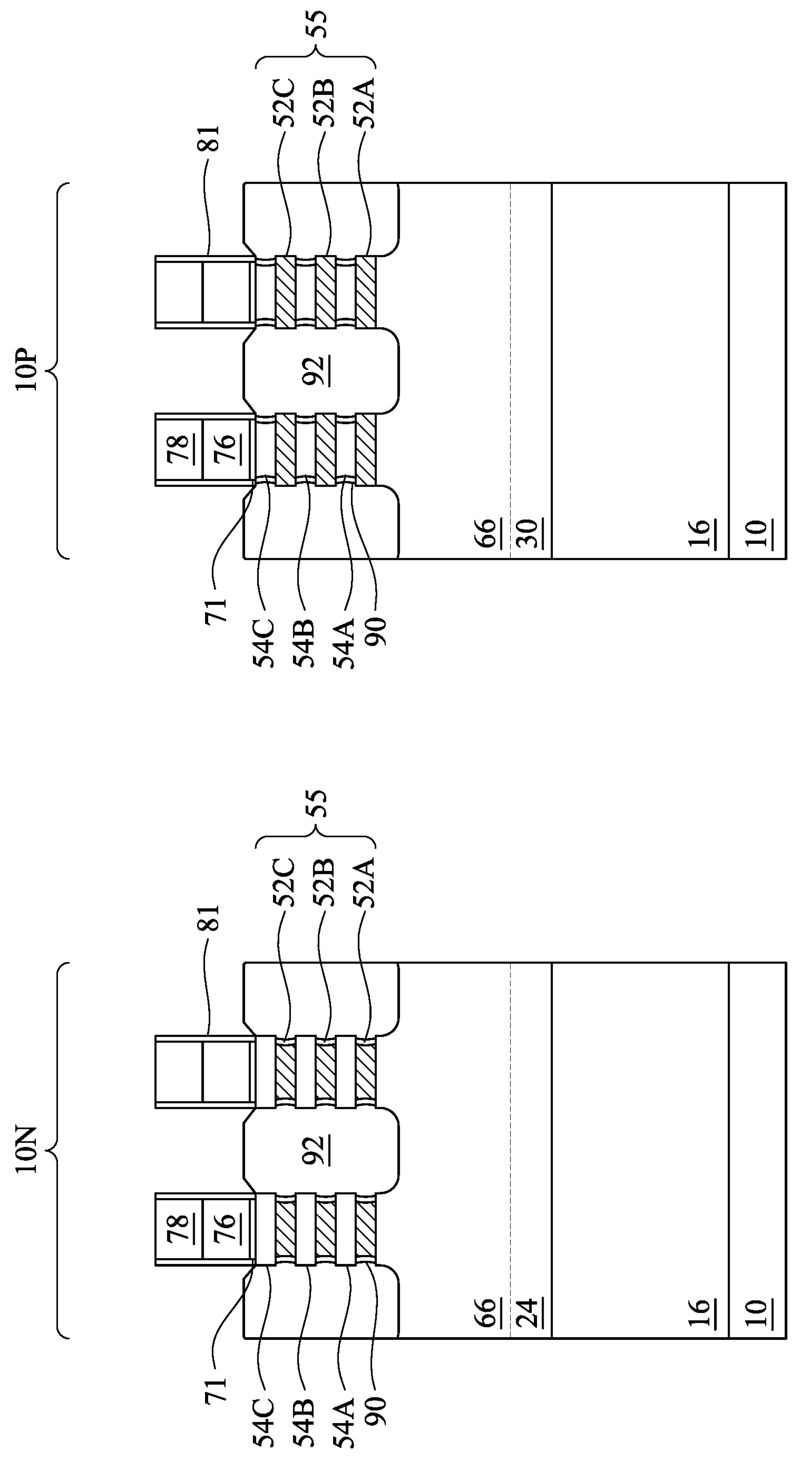

FIG. 22D illustrates an embodiment in which sidewalls of the first nanostructures 52 in the n-type region 10N and sidewalls of the second nanostructures 54 in the p-type region 10P are concave, outer sidewalls of the first inner spacers 90 are concave, and the first inner spacers 90 are recessed from sidewalls of the second nanostructures 54 and the first nanostructures 52, respectively. As illustrated in FIG. 22D, the epitaxial source/drain regions 92 may be formed in contact with the first inner spacers 90 and may extend past sidewalls of the second nanostructures 54 in the n-type region 10N and past sidewalls of the first nanostructures 52 in the p-type region 10P.

Figure 23A:
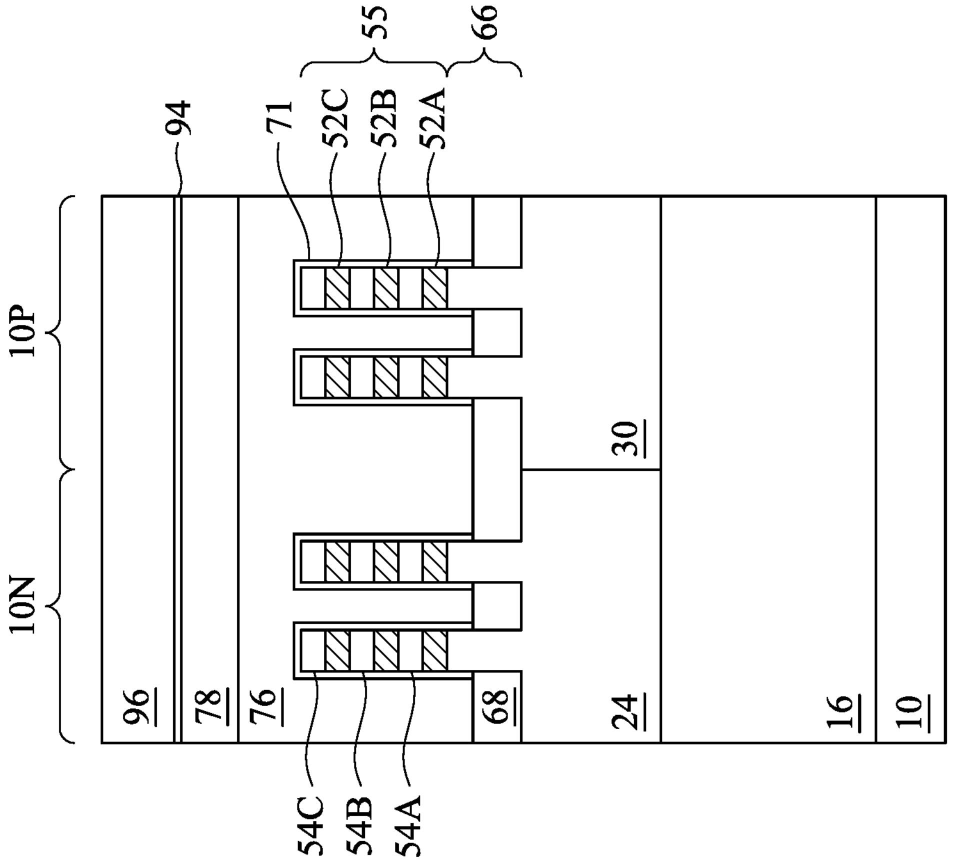
Figure 23B:
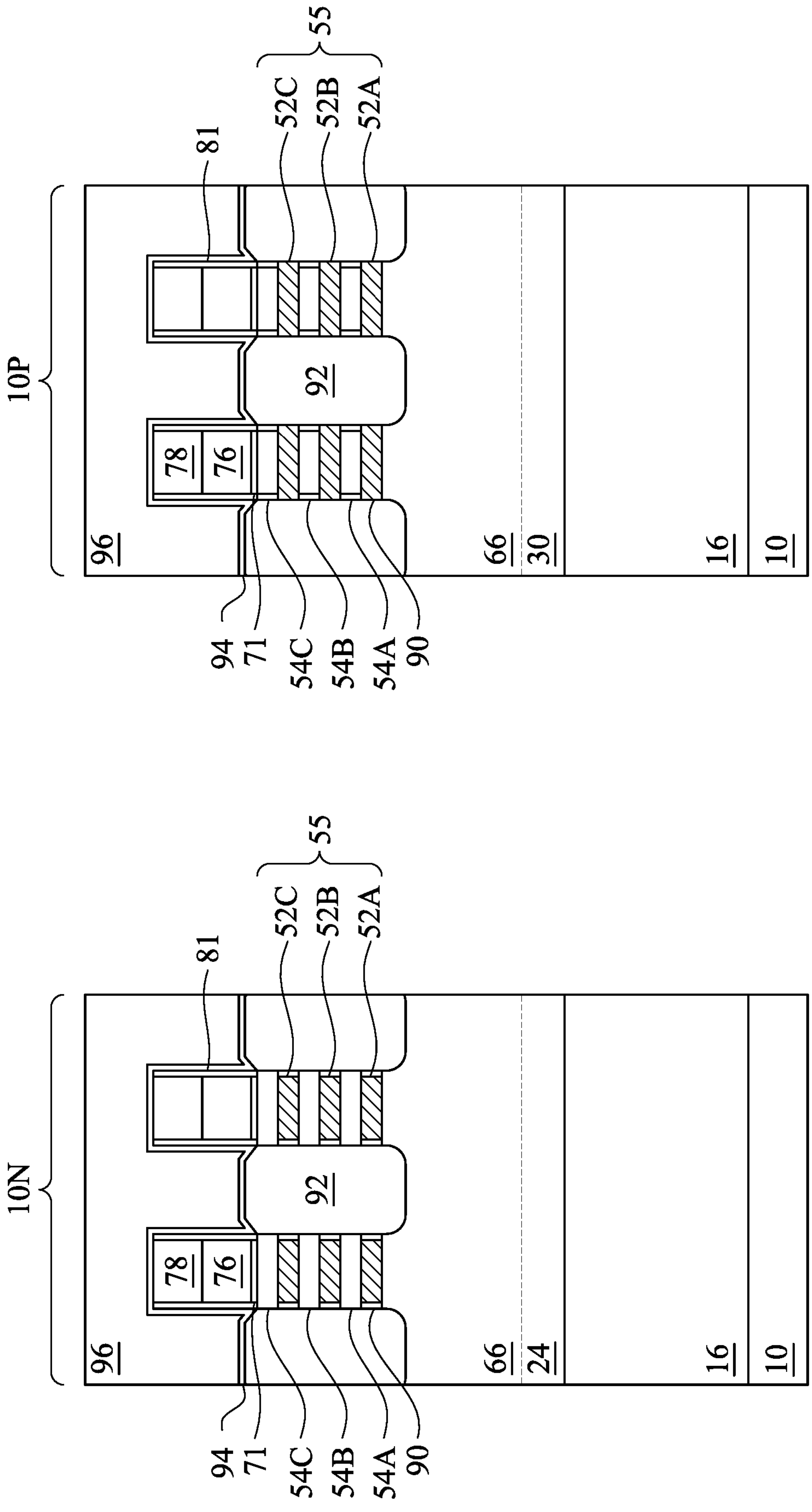
Figure 23C:
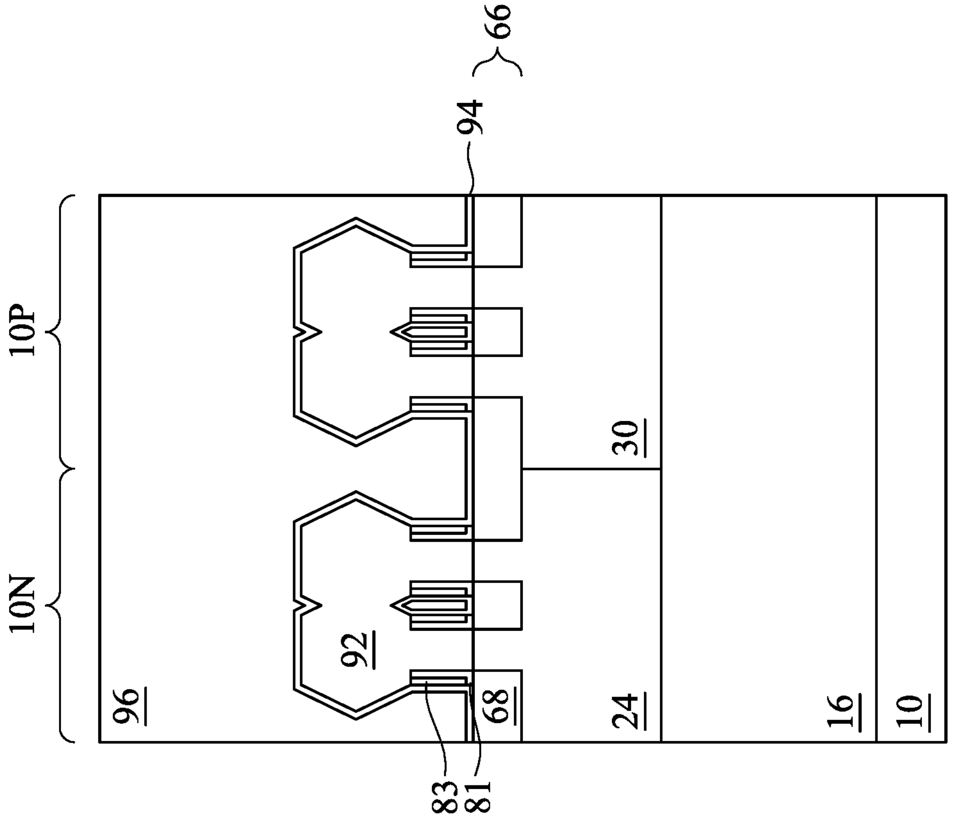

In FIGS. 23A-23C, a first interlayer dielectric (ILD) 96 is deposited over the structure illustrated in FIGS. 16A, 22B, and 22A (the processes of FIGS. 17A-22D do not alter the cross-section illustrated in FIG. 16A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 24A:
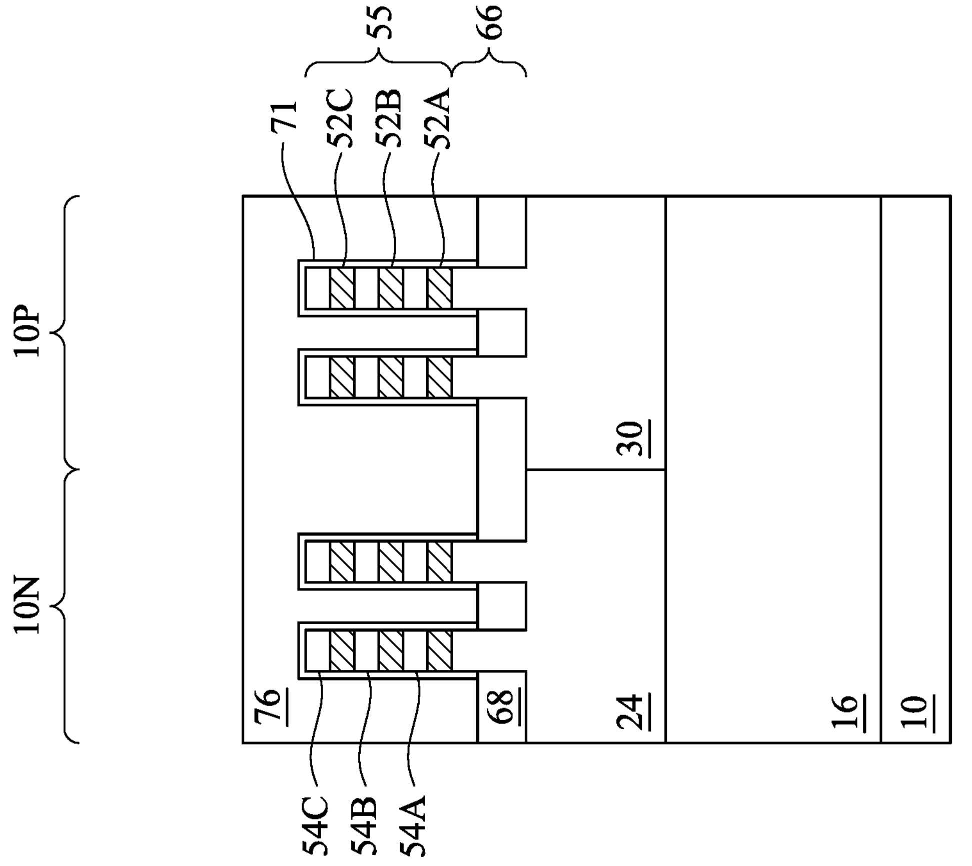
Figure 24B:
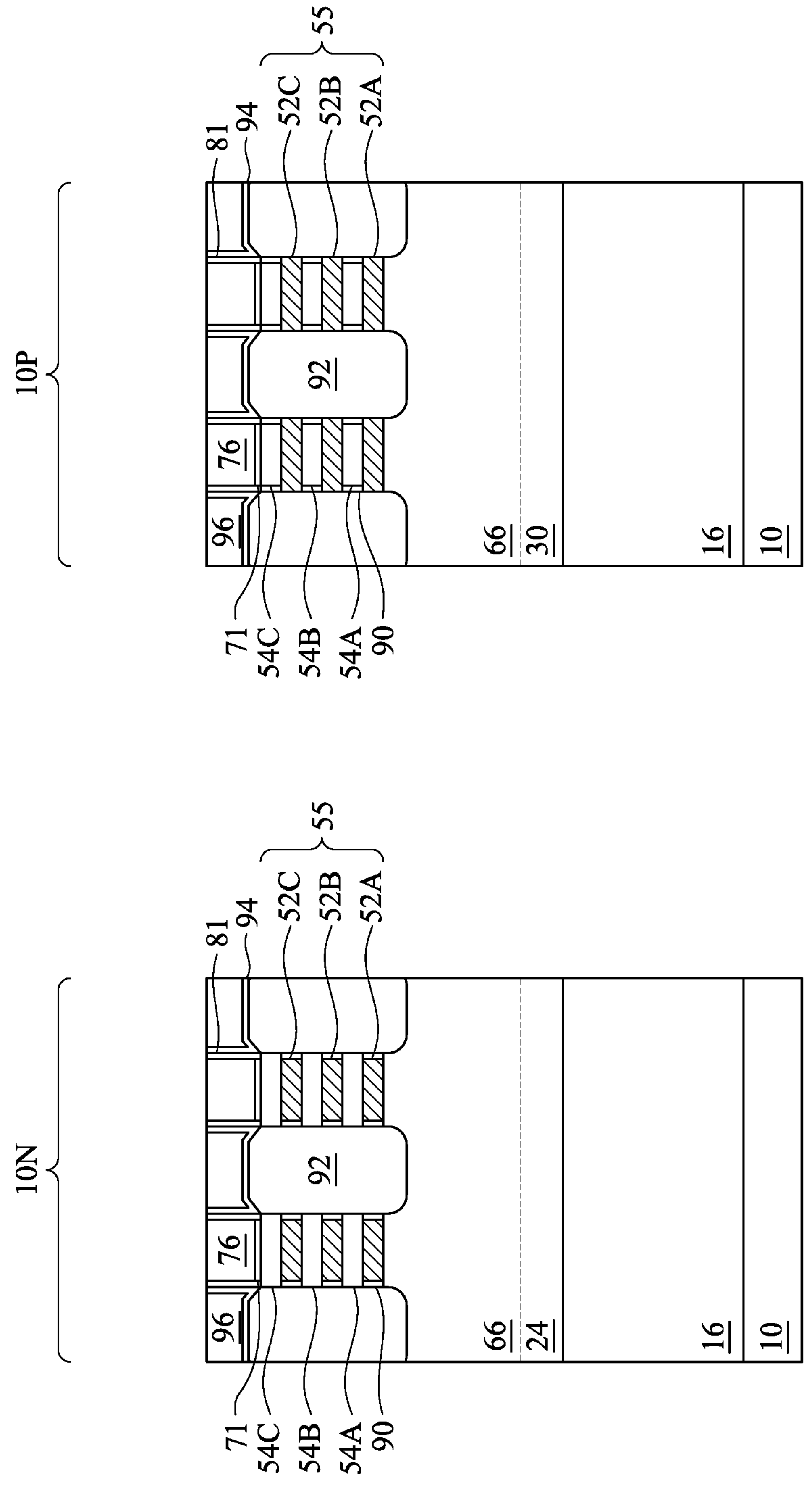

In FIGS. 24A-24B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 72 are exposed through the first ILD 96. In some embodiments, the masks 78 may remain, in which case the planarization process levels the top surface of the first ILD 96 with top surface of the masks 78 and the first spacers 81.

Figure 25A:
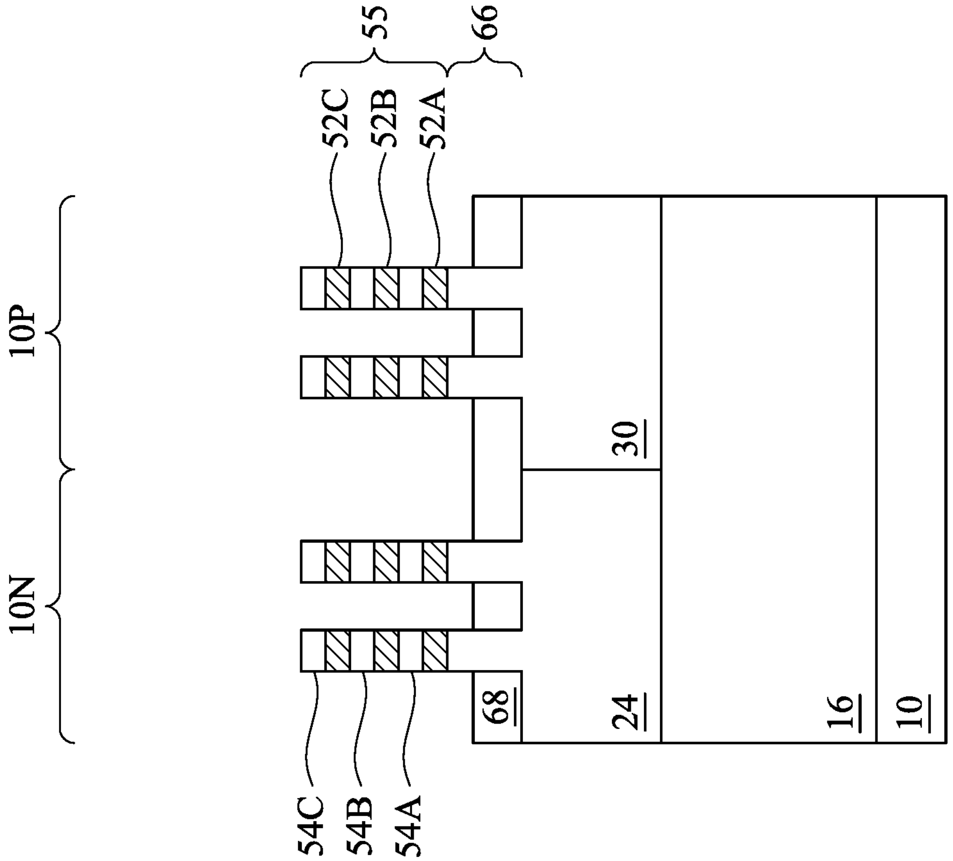
Figure 25B:
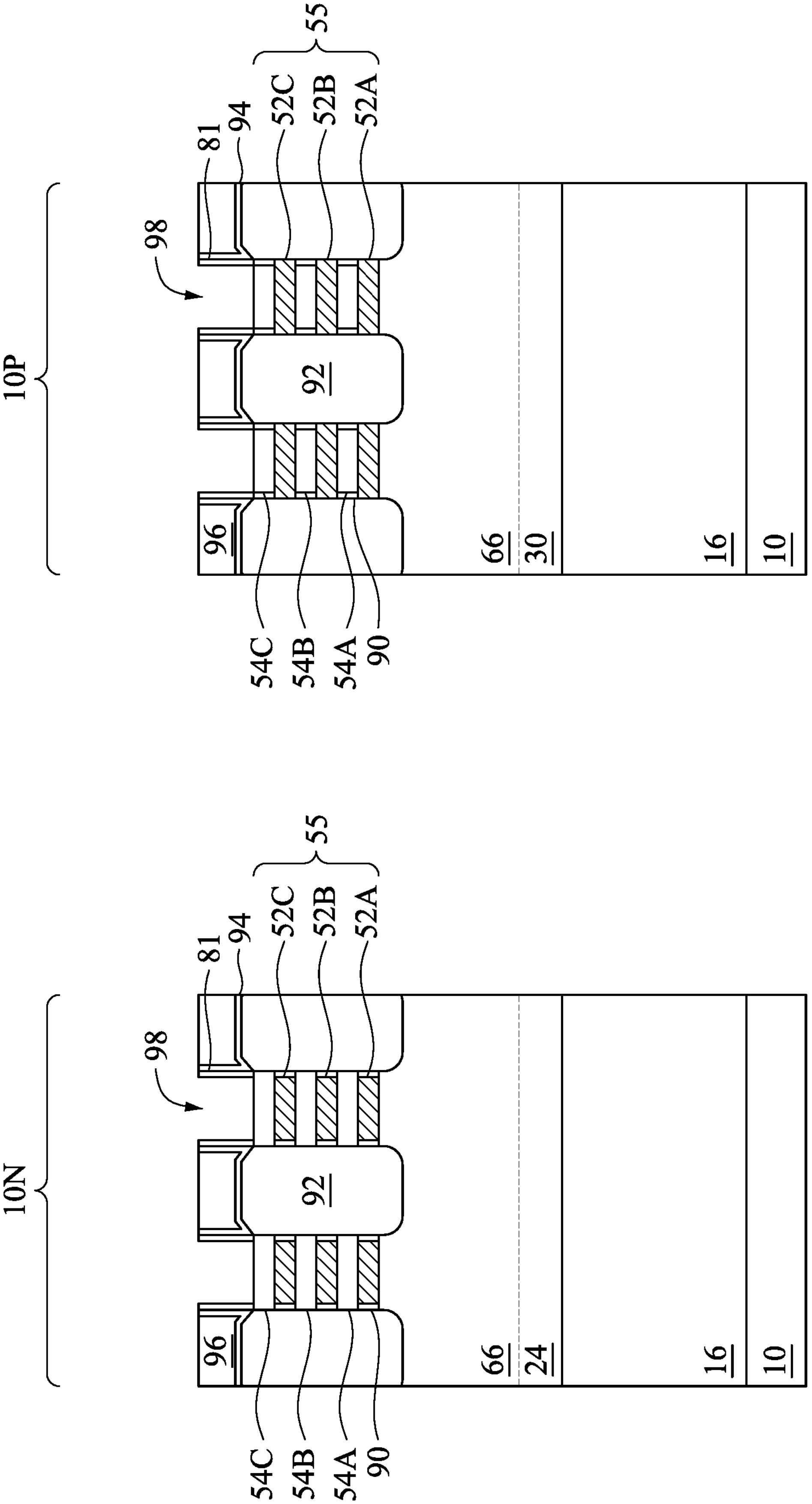

In FIGS. 25A and 25B, the dummy gates 76, and the masks 78 if present, are removed in one or more etching steps, so that second recesses 98 are formed. Portions of the dummy gate dielectrics 71 in the second recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 26A:
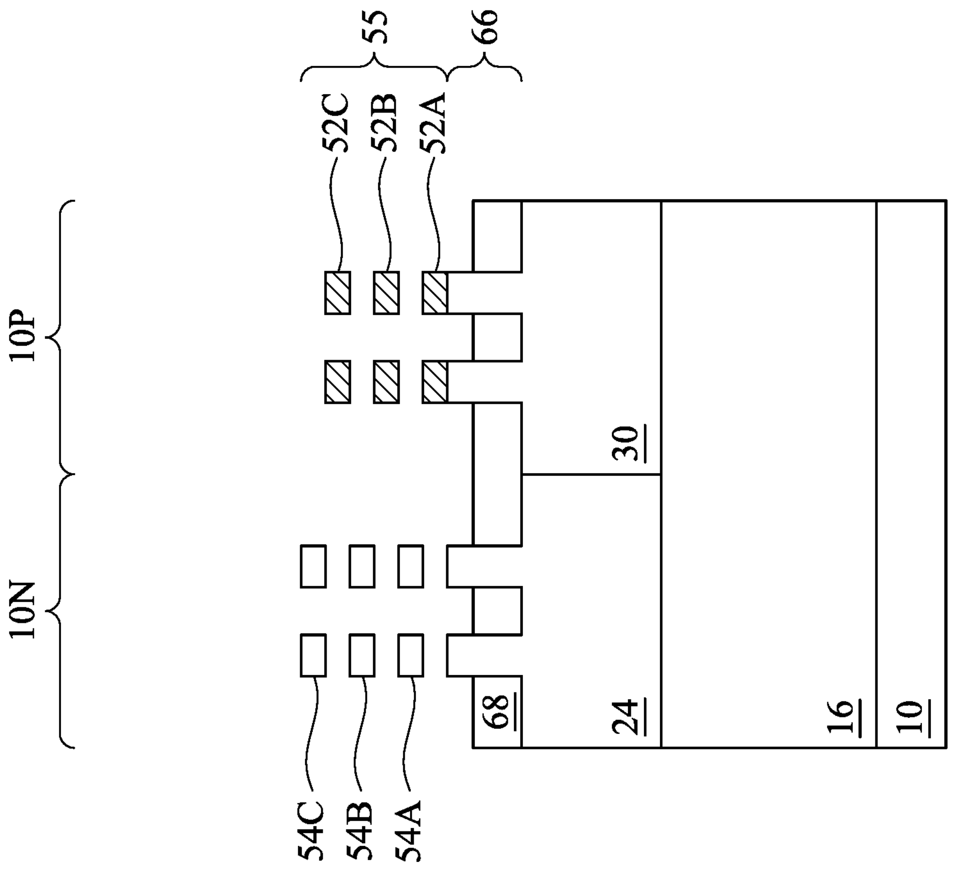
Figure 26B:
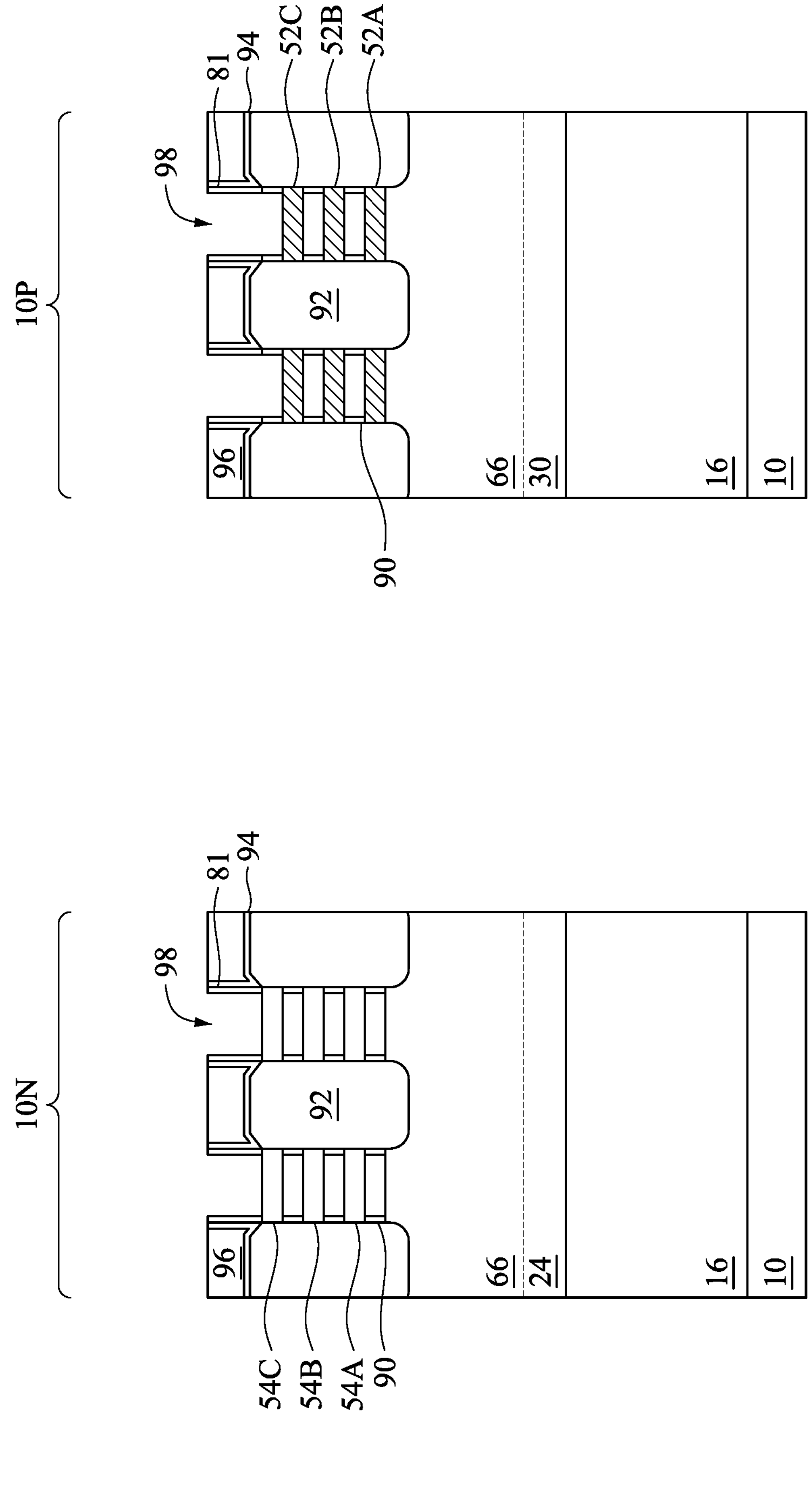

In FIGS. 26A and 26B, the first nanostructures 52 in the n-type region 10N and the second nanostructures 54 in the p-type region 10P are removed extending the second recesses 98. The first nanostructures 52 may be removed by forming a mask (not shown) over the p-type region 10P and performing an isotropic etching process such as wet etching or the like using etchants which are selective to the materials of the first nanostructures 52, while the second nanostructures 54, the substrate 10, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH4OH), or the like may be used to remove the first nanostructures 52 in the n-type region 10N.

The second nanostructures 54 in the p-type region 10P may be removed by forming a mask (not shown) over the n-type region 10N and performing an isotropic etching process such as wet etching or the like using etchants which are selective to the materials of the second nanostructures 54, while the first nanostructures 52, the substrate 10, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 10P.

In other embodiments, the channel regions in the n-type region 10N and the p-type region 10P may be formed simultaneously, for example by removing the first nanostructures 52 in both the n-type region 10N and the p-type region 10P or by removing the second nanostructures 54 in both the n-type region 10N and the p-type region 10P. In such embodiments, channel regions of n-type nano-FETs and p-type nano-FETS may have a same material composition, such as silicon, silicon germanium, or the like. FIGS. 32A, 32B, and 32C illustrate a structure resulting from such embodiments where the channel regions in both the p-type region 10P and the n-type region 10N are provided by the second nanostructures 54 and comprise silicon, for example.

Figure 27A:
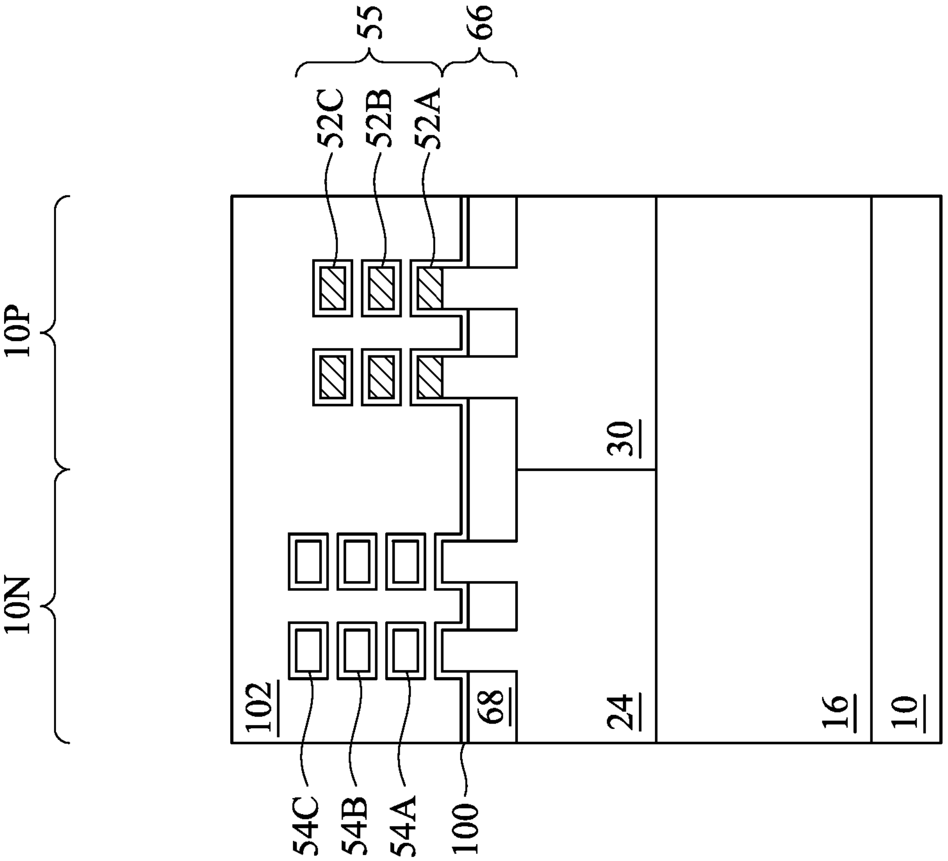
Figure 27B:
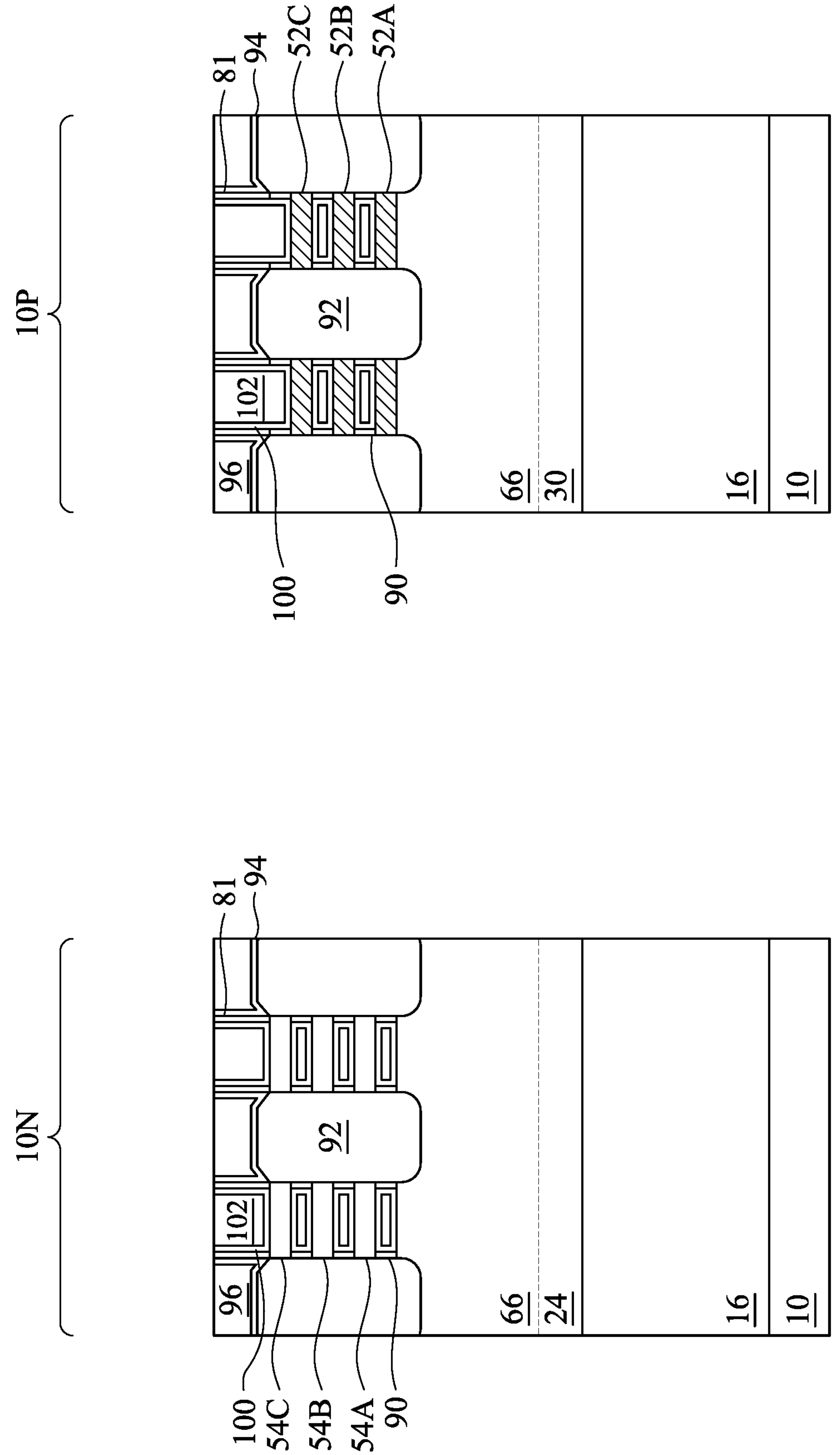

In FIGS. 27A and 27B, gate dielectric layers 100 and gate electrodes 102 are formed for replacement gates. The gate dielectric layers 100 are deposited conformally in the second recesses 98. In the n-type region 10N, the gate dielectric layers 100 may be formed on top surfaces and sidewalls of the substrate 10 and on top surfaces, sidewalls, and bottom surfaces of the second nanostructures 54, and in the p-type region 10P, the gate dielectric layers 100 may be formed on top surfaces and sidewalls of the substrate 10 and on top surfaces, sidewalls, and bottom surfaces of the first nanostructures 52. The gate dielectric layers 100 may also be deposited on top surfaces of the first ILD 96, the CESL 94, the first spacers 81, and the STI regions 68.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 10N and the p-type region 10P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 27A and 27B, the gate electrodes 102 may comprise any number of liner layers, any number of work function tuning layers, and a fill material. Any combination of the layers which make up the gate electrodes 102 may be deposited in the n-type region 10N between adjacent ones of the second nanostructures 54 and between the second nanostructure 54A and the substrate 10, and may be deposited in the p-type region 10P between adjacent ones of the first nanostructures 52.

The formation of the gate dielectric layers 100 in the n-type region 10N and the p-type region 10P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 28A:
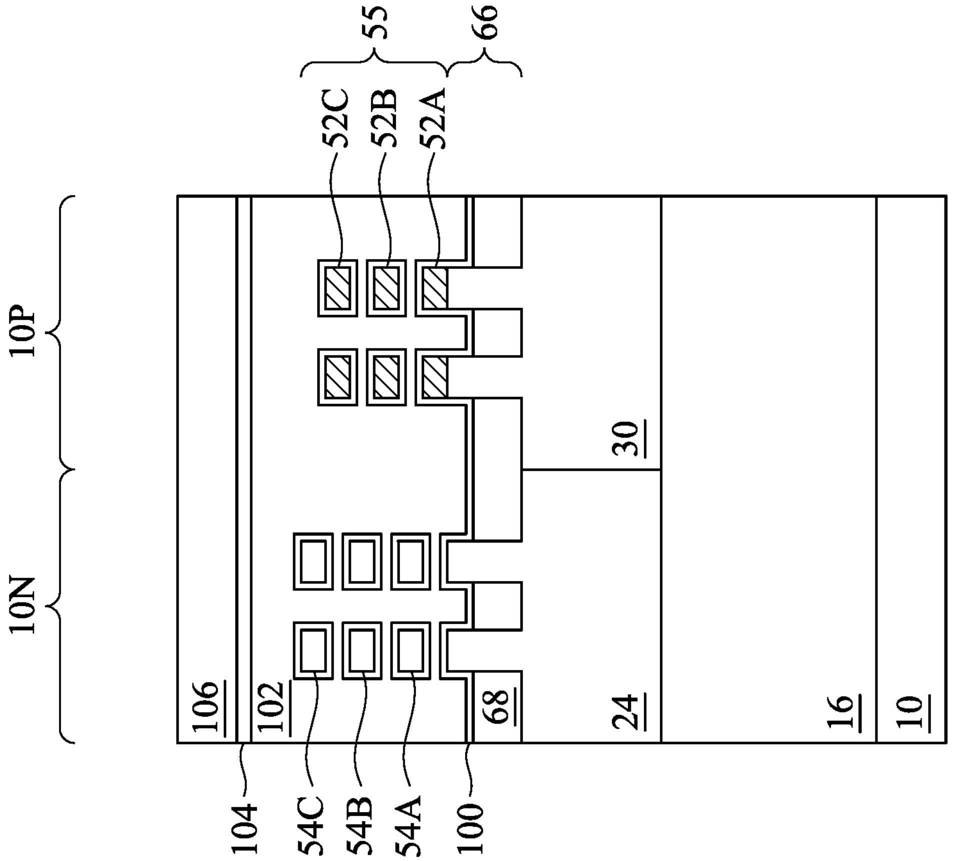
Figure 28B:
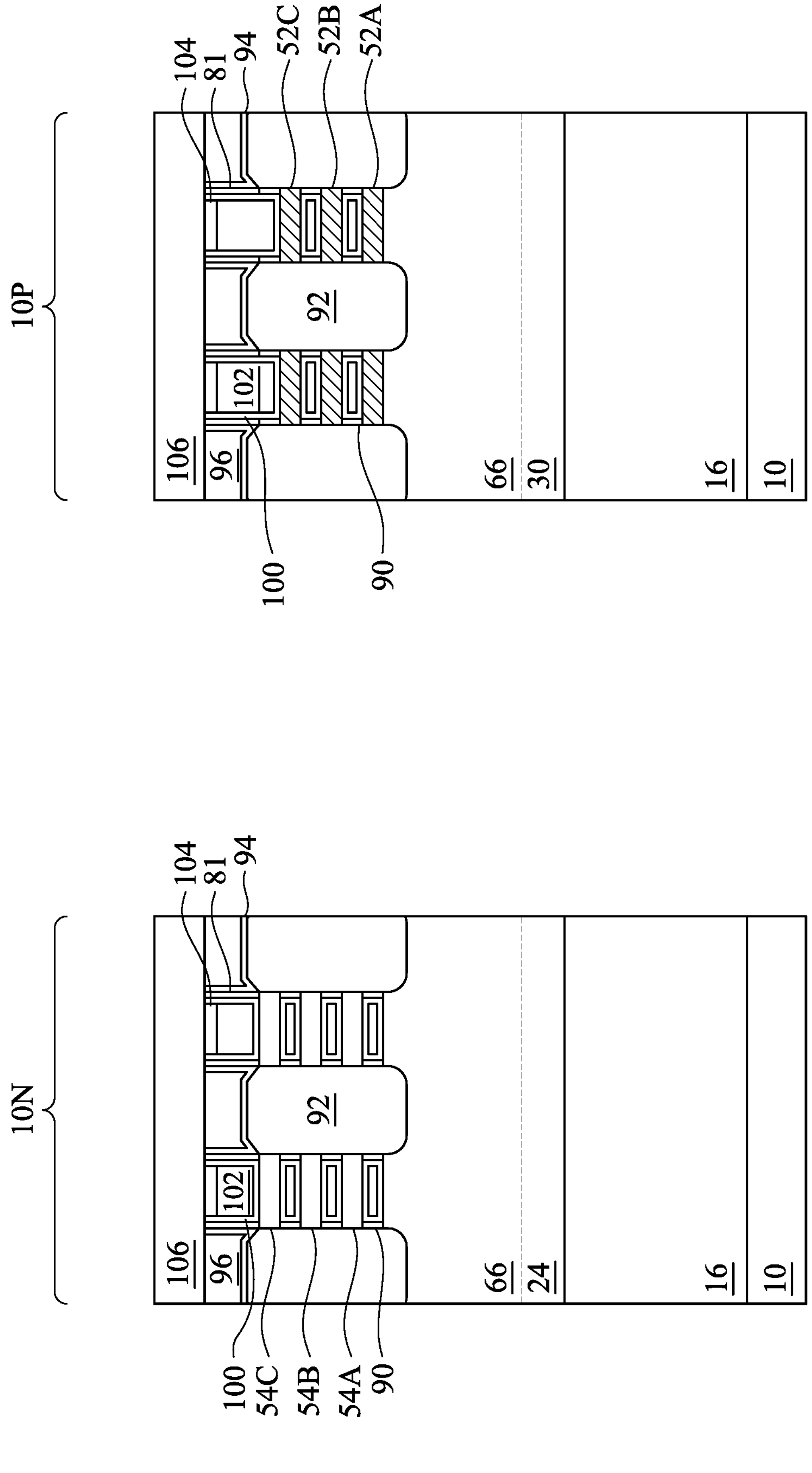
Figure 28C:
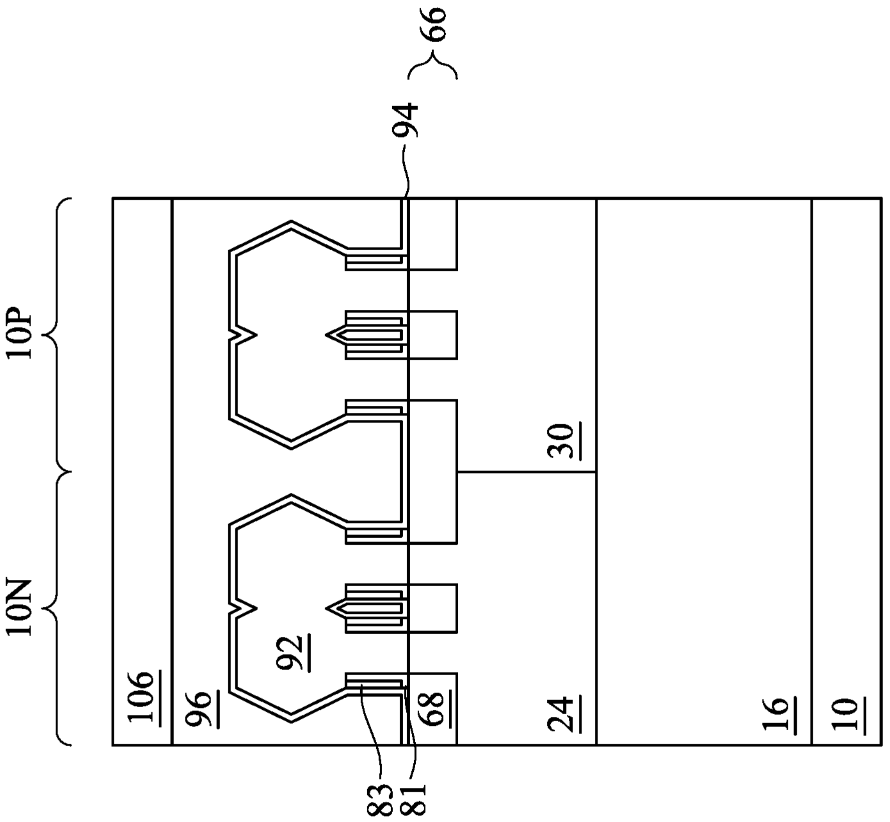

In FIGS. 28A-28C, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 30A and 30B) penetrate through the gate mask 104 to contact the top surface of the recessed gate electrodes 102.

As further illustrated by FIGS. 28A-28C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 29A:
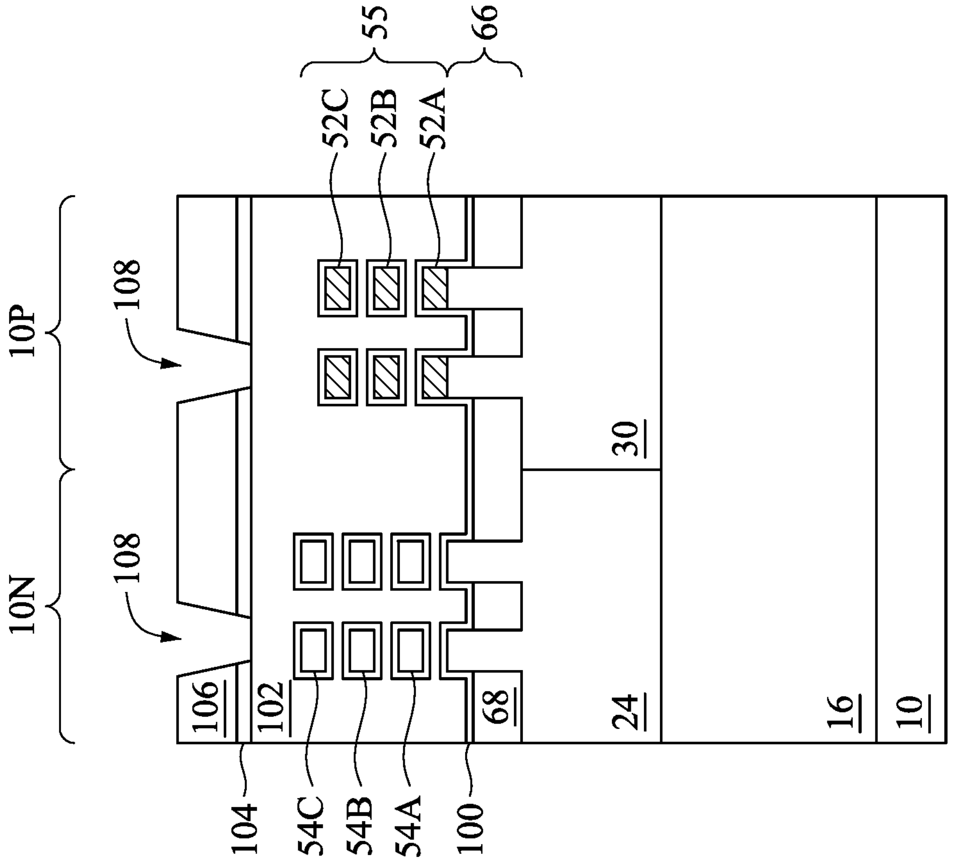
Figure 29B:
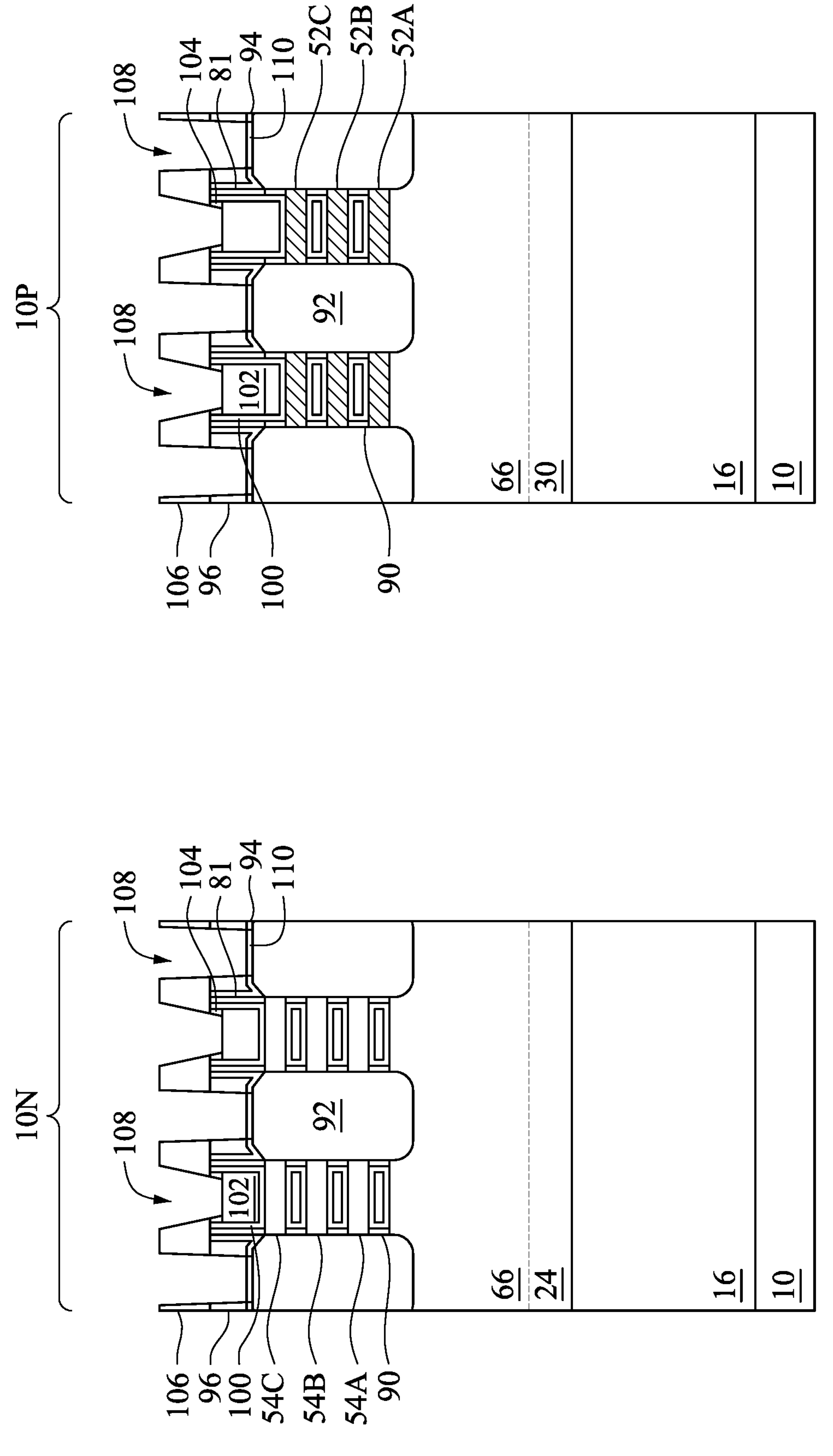
Figure 29C:
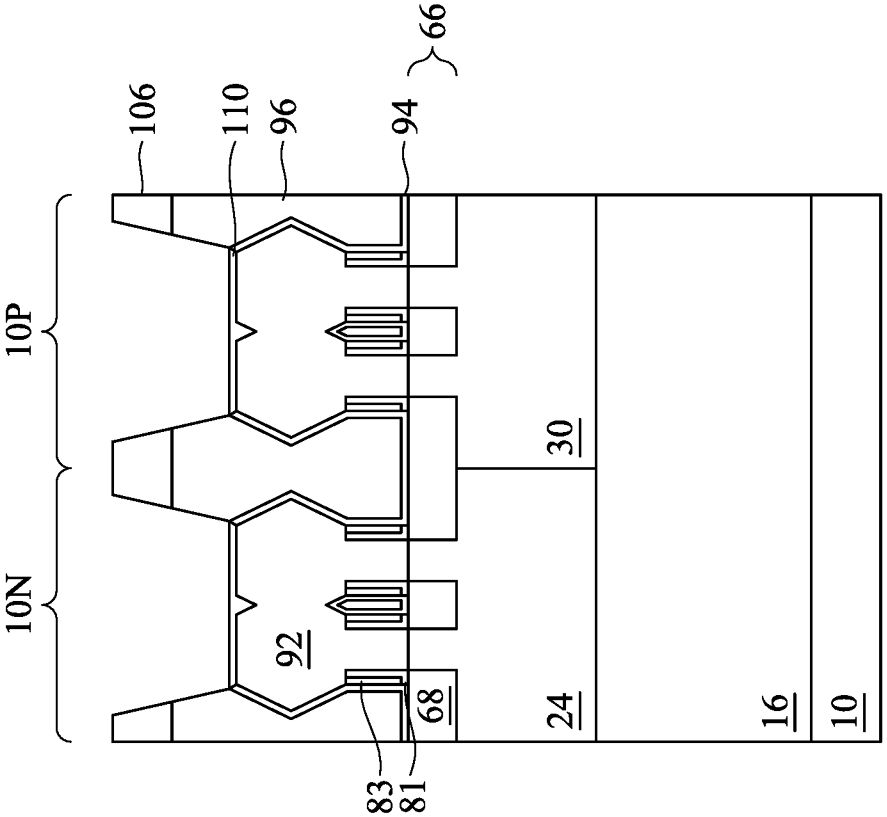

In FIGS. 29A-29C, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 29B illustrate the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal annealing process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 30A:
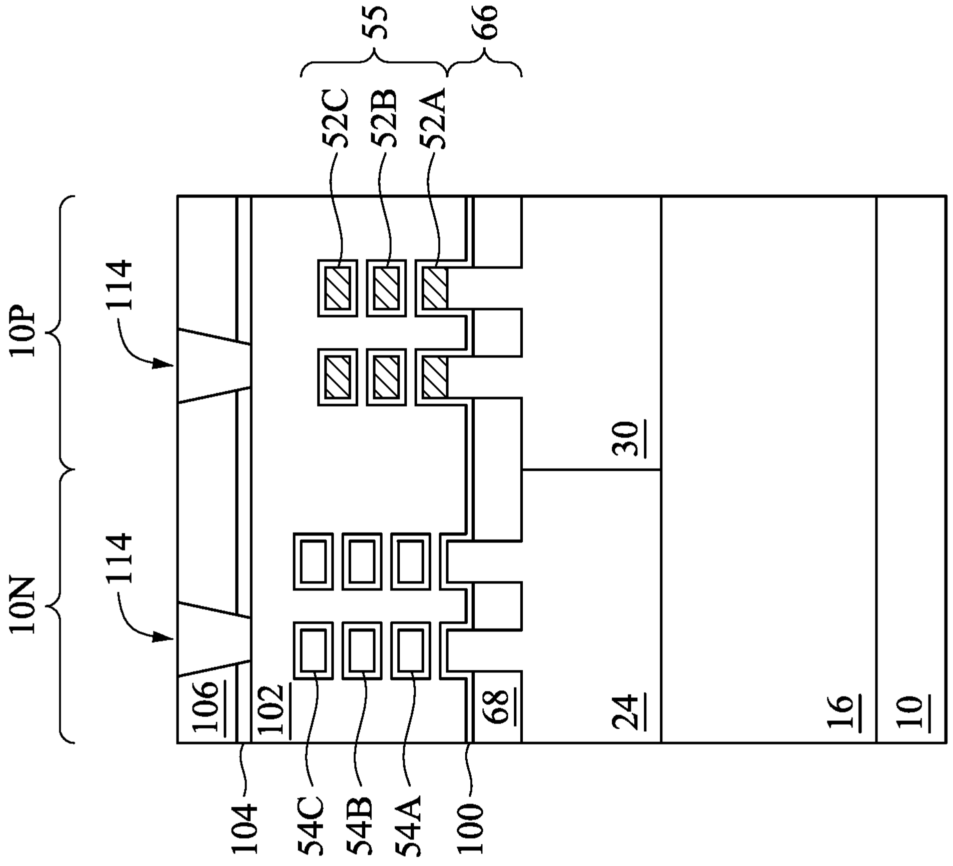
Figure 30B:
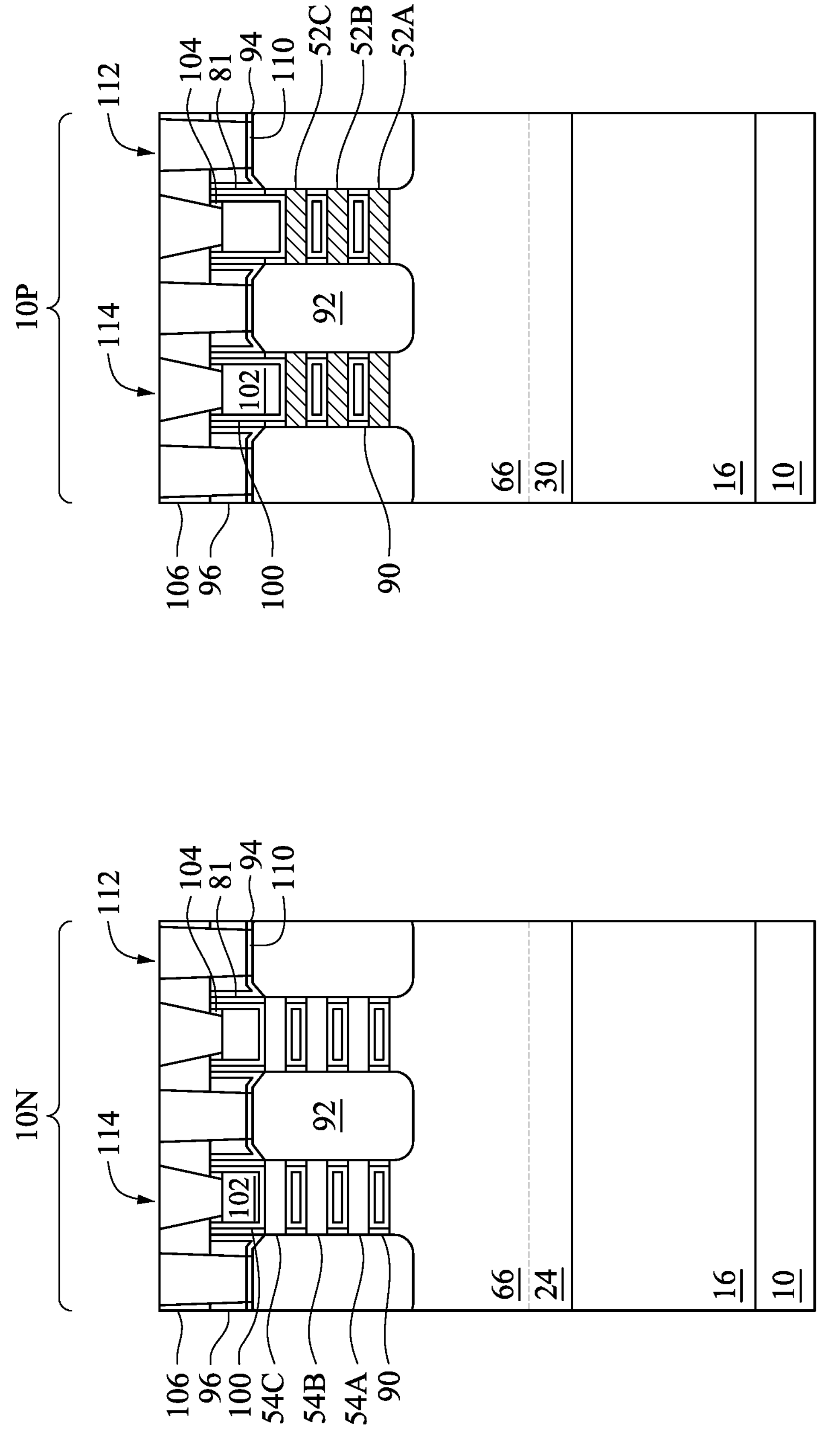
Figure 30C:
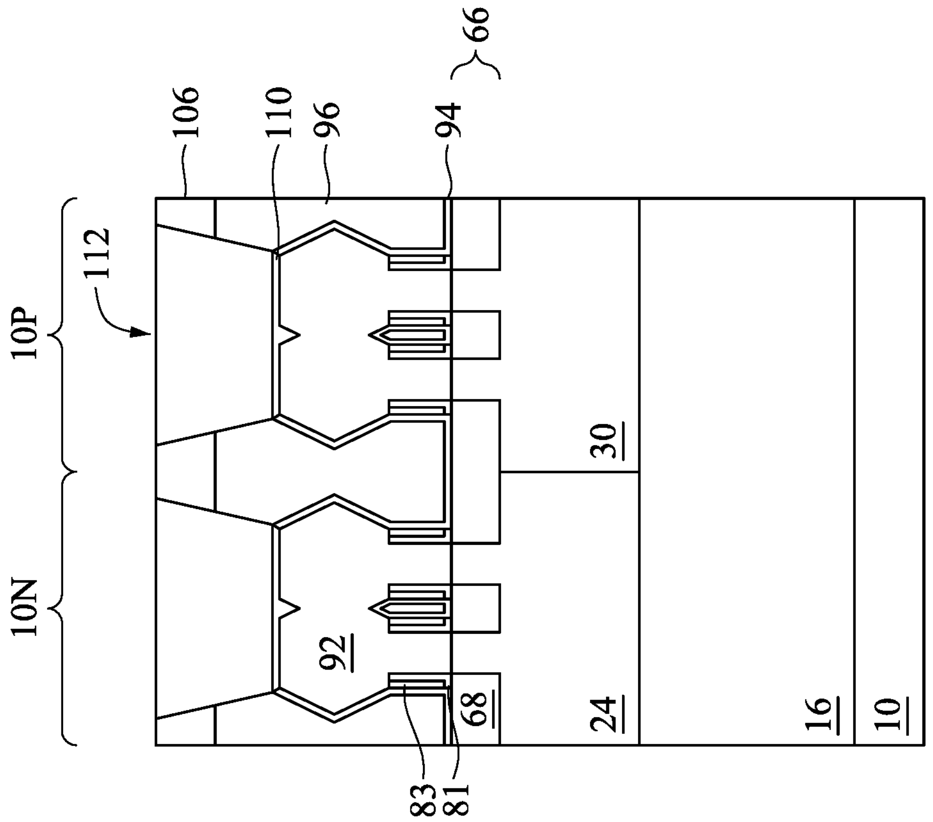

Next, in FIGS. 30A-C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive material, and is electrically coupled to the underlying conductive feature (e.g., gate structure 102 and/or silicide region 110 in the illustrated embodiment). The contacts 114 are electrically coupled to the gate structure 102 and may be referred to as gate contacts, and the contacts 112 are electrically coupled to the silicide regions 110 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

FIG. 31A illustrates the same structure shown in FIG. 30C with another p-type region 10P on the left side of the n-type region 10N, so there is an n-well 30 on each side of the p-well 24, in accordance with some embodiments. Pathways 38 represent two of the pathways where junction leakage may occur from the n-type source/drain regions 92 in the n-type region 10N to the n-wells 30 in the p-type region 10P via the p-well 24 in accordance with some embodiments. As illustrated in FIG. 31A, the region 31 is positioned such that the pathways 38 extend through the high dopant concentration portion of region 31. At each of interfaces between the p-well 24 and the n-wells 30, there is a depletion region (not shown). When the device is under bias, the two depletion regions may overlap in the p-well 24 and may result in a depletion region pinch-off in the p-well 24. The depletion region pinch-off creates a path of lower resistance between the n-type source/drain regions 92 and n-wells 30. As discussed in greater detail below, embodiments such as those discussed below reduces the depletion region pinch-off, thereby increasing the resistance along pathways 38 and decreasing the junction leakage.

Figure 31B:
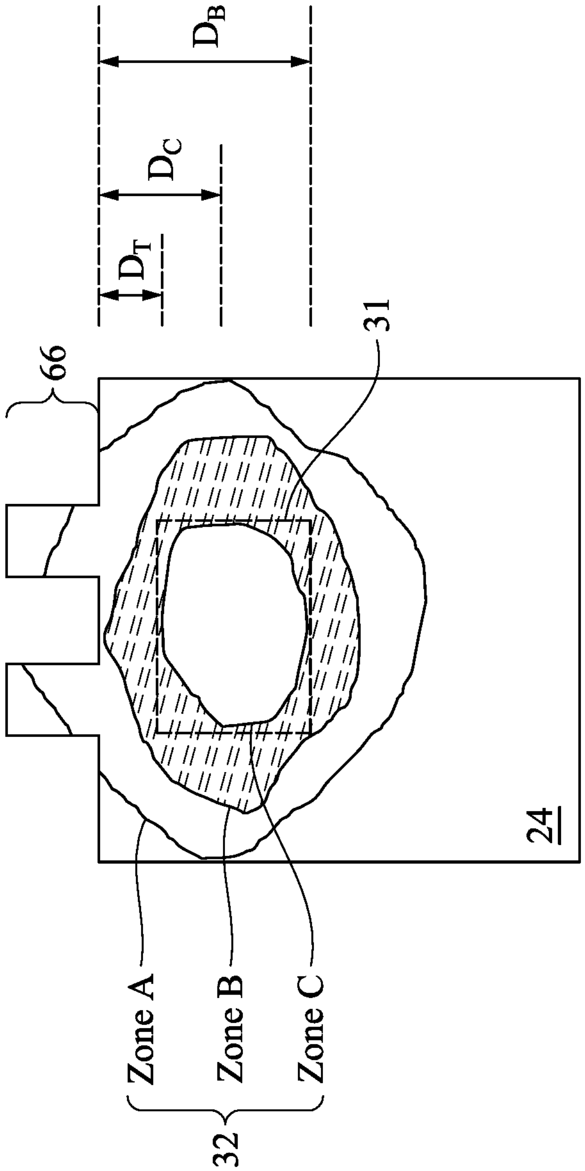

FIG. 31B illustrates the p-well 24 shown on FIG. 31A. The dopant concentration profile 32 and region 31 shown on FIG. 7A are also shown on the p-well 24 of FIG. 31B, though portions of the dopant concentration profile 32 is absent due to the formation of the fins 66 in accordance with some embodiments. The dopant concentration profile 32 may be modulated such that region 31 (including at least portions of zone C) remains under the fin. In some embodiments, region 31 extends laterally between the outer sidewalls of the fins 66 contained in the p-well 24 as illustrated in FIG. 31B, and has a top boundary spaced apart from the bottom of the fins 66 by a distance $D_T$, and a bottom boundary spaced apart from the bottom of the fins 66 by a distance $D_B$. $D_C$ represents a center of zone C (e.g., line H-H' as illustrated in FIG. 7B), a ratio of $D_T$ to $D_C$ may be in a range from about 0.5 to about 0.6, and a ratio of $D_B$ to $D_C$ may be in a range from about 1.5 to about 1.75. In some embodiments, $D_T$ may be from about 50 nm to about 70 nm, $D_C$ may be from about 130 nm to about 160 nm, and $D_B$ may be from about 200 nm to about 280 nm. For example, region 31 may extend from about 50 nm below the bottom of the fins 66 to about 280 nm below the bottom of the fins 66. The average concentration of dopants in region 31 is in a range from about $5\times10^{17}$ atom/cm$^3$ to about $7\times10^{17}$ atom/cm$^3$. This may lead to a reduction of the overlap between the two depletion regions as discussed above, and thereby a reduction of the depletion region pinch-off in the p-well 24, which may further result in an increased resistance along pathways 38 and thereby a decreased junction leakage from the n-type source/drain regions 92 in the n-type region 10N to the n-wells 30 via the p-well 24 as shown in FIG. 31A. In some embodiments, the n-wells 30 also have dopant concentration profiles 32, which may result in a decreased junction leakage from the p-type source/drain regions 92 in the p-type region 10P to the p-wells 24 via the n-wells 30.

FIGS. 32A-C illustrate cross-sectional views of a device according to some alternative embodiments. FIG. 32A illustrates reference cross-section A-A' illustrated in FIG. 1. FIG. 32B illustrates reference cross-section B-B' illustrated in FIG. 1. FIG. 32C illustrates reference cross-section C-C' illustrated in FIG. 1. In FIGS. 32A-C, like reference numerals indicate like elements formed by like processes as the structure of FIGS. 30A-C. However, in FIGS. 32A-C, channel regions in the n-type region 10N and the p-type region 10P comprise a same material. For example, the second nanostructures 54, which comprise silicon, provide channel regions for p-type nano-FETs in the p-type region 10P and for n-type nano-FETs in the n-type region 10N. The structure of FIGS. 32A-C may be formed, for example, by removing the first nanostructures 52 from both the p-type region 10P and the n-type region 10N simultaneously; depositing the gate dielectrics 100 and the gate electrodes 102P (e.g., gate electrode suitable for a p-type nano-FET) around the second nanostructures 54 in the p-type region 10P; and depositing the gate dielectrics 100 and the gate electrodes 102N (e.g., a gate electrode suitable for a n-type nano-FET) around the second nanostructures 54 in the n-type region 10N. In such embodiments, materials of the epitaxial source/drain regions 92 may be different in the n-type region 10N compared to the p-type region 10P as explained above.

Embodiments may achieve advantages. For example, utilizing techniques described above such as parallel implantation technique and tilt implantation technique during the implantation processes enables the modulation of the dopant concentration profiles 32 in the p-well 24 and the n-well 30. The dopant concentration profiles 32 lead to a reduction of depletion region pinch off in the p-well 24 and the n-well 30. This results in decreased junction leakage from the source/drain regions 92 to the substrate 10 in nano-FETs devices.

In an embodiment, a semiconductor device includes a semiconductor substrate, the semiconductor substrate including one or more fins; an isolation layer over the semiconductor substrate and along sidewalls of the one or more fins; a first deep well in the semiconductor substrate below the one or more fins, the first deep well being doped with a first dopant, the first dopant having a first conductivity type; a first well in the semiconductor substrate, wherein the one or more fins are in the first well, the first well being doped with a second dopant, the second dopant having a second conductivity type, wherein the second conductivity type is opposite the first conductivity type, wherein the first well is above the first deep well; a second well in the semiconductor substrate on a first side of the first well; and a third well in the semiconductor substrate on a second side of the first well, wherein a first lateral boundary is aligned with a first sidewall the one or more fins, wherein a second lateral boundary is aligned with a second sidewall the one or more fins, wherein the first sidewall is a sidewall of the one or more fins closest to the second well, wherein the second sidewall is a sidewall of the one or more fins closest to the third well, wherein an average concentration of the second dopant in a first region of the semiconductor substrate below the one or more fins and between the first lateral boundary and the second lateral boundary is in a range from $5\times10^{17}$ atom/cm$^3$ to $7\times10^{17}$ atom/cm$^3$. The semiconductor device of claim 1, wherein the first region is 50 nm to 280 nm below a bottom of the one or more fins. In an embodiment, the second dopant has a first concentration at a first location along a first vertical line, wherein the first vertical line is positioned in the first well midway between the second well and the third well, wherein the first location is at a center of a peak of a dopant concentration profile of the second dopant along the first vertical line, wherein the second dopant has a second concentration at a second location, wherein a depth of the second location is 1.5 times of a depth of the first location from a top surface of the semiconductor substrate, wherein the second concentration is 30% to 40% of the first concentration. In an embodiment, the second dopant has a first concentration at a first location along a first vertical line, wherein the first vertical line is positioned in the first well midway between the second well and the third well, wherein the first location is at a center of peak of a dopant concentration profile of the second dopant along the first vertical line, wherein the second dopant has a third concentration at a third location, wherein a depth of the third location is 1.75 times of a depth of the first location from a top surface of the semiconductor substrate, wherein the third concentration is 20% to 30% of the first concentration. In an embodiment, the first well is a p-well, and wherein the second well and third well are n-wells.

In an embodiment, a method of forming a semiconductor device includes: forming a patterned mask over a substrate, wherein the patterned mask has an opening over a first portion of the substrate; implanting a first dopant into the substrate with a first ion beam at a first angle, wherein the first ion beam is in a first plane parallel to a side of the first portion in a plan view, wherein the first plane being perpendicular to a top surface of the substrate, wherein the first ion beam impacts the top surface of the substrate at the first angle relative to a line perpendicular to the top surface of the substrate; implanting the first dopant into the substrate with a second ion beam at a second angle, wherein the second ion beam is in a second plane parallel to the side of the first portion in a plan view, wherein the second plane being perpendicular to the top surface of the substrate, wherein the second ion beam impacts the top surface of the substrate at the second angle relative to the line perpendicular to the top surface of the substrate, wherein the first ion beam and the second ion beam are on opposite sides of the line perpendicular to the top surface of the substrate, wherein implanting with the first ion beam and implanting with the second ion beam forms a first well; and etching the substrate to form one or more fins in the first well, wherein a maximum concentration of the first dopant is below a bottom of the one or more fins. In an embodiment, the method further includes rotating the substrate after implanting with the first ion beam and prior to implanting with the second ion beam. In an embodiment, a magnitude of the first angle is greater than 0 degrees and less than 15 degrees. In an embodiment, a magnitude of the second angle is greater than 0 degrees and less than 15 degrees. In an embodiment, a magnitude the first angle is equal to a magnitude of the second angle. In an embodiment, after implanting with the second ion beam the first dopant has a first concentration profile along a vertical line extending midway through the first portion, wherein the first concentration profile has a peak, wherein the peak is centered at a first distance below a bottom of the one or more fins, wherein an average concentration of the first dopant in a region is in a range from $5\times10^{17}$ atom/cm$^3$ to $7\times10^{17}$ atom/cm$^3$, wherein the region is laterally bound by outermost sidewalls of the one or more fins in the first well and vertically bound by an upper boundary and a lower boundary, wherein the upper boundary has a first depth 0.5 to 0.6 times the first distance, wherein the lower boundary has a second depth 1.5 to 1.75 times the first distance. In an embodiment, wherein a maximum concentration of the first dopant is in a range of 130 nm to 160 nm below the bottom of the one or more fins.

In an embodiment, a method of forming a semiconductor device includes: forming a first patterned mask over a substrate, wherein the first patterned mask has a first opening over a top surface of a first portion of the substrate; performing a first implantation to the first portion of the substrate with a first dopant, wherein a first ion beam of the first implantation is at a first acute angle relative to the top surface of the first portion of the substrate, the first ion beam being substantially parallel to a plane perpendicular to the top surface of the substrate, the plane including a longitudinal side of the first portion of the substrate; after performing the first implantation, rotating the substrate by 180 degrees; and performing a second implantation to the first portion of the substrate with the first dopant, wherein a second ion beam of the second implantation is at a second acute angle relative to the top surface of the first portion of the substrate, the second ion beam being substantially parallel to the plane perpendicular to the top surface of the substrate, the plane including the longitudinal side of the first portion of the substrate. In an embodiment, the first dopant is a p-type dopant, wherein performing the first implantation and the second implantation forms a p-well. In an embodiment, the first dopant is boron. In an embodiment, the first dopant is an n-type dopant, wherein performing the first implantation and the second implantation forms an n-well. In an embodiment, wherein the first dopant is arsenic or phosphorus. In an embodiment, wherein each of the first acute angle and the second acute angle is in a range from 75° to less than 90°. In an embodiment, wherein the first acute angle is a same angle as the second acute angle. In an embodiment, wherein the substrate is stationary during the first implantation and the second implantation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:

forming a patterned mask over a substrate, wherein the patterned mask has an opening over a first portion of the substrate;

implanting a first dopant into the substrate with a first ion beam at a first angle, wherein the first ion beam is in a first plane parallel to a side of the first portion in a plan view, wherein the first plane being perpendicular to a top surface of the substrate, wherein the first ion beam impacts the top surface of the substrate at the first angle relative to a line perpendicular to the top surface of the substrate;

implanting the first dopant into the substrate with a second ion beam at a second angle, wherein the second ion beam is in a second plane parallel to the side of the first portion in a plan view, wherein the second plane being perpendicular to the top surface of the substrate, wherein the second ion beam impacts the top surface of the substrate at the second angle relative to the line perpendicular to the top surface of the substrate, wherein the first ion beam and the second ion beam are on opposite sides of the line perpendicular to the top surface of the substrate, wherein the first dopant has a first concentration profile along a vertical line extending midway through the first portion after implanting with the second ion beam, wherein the first concentration profile has a peak, and wherein implanting with the first ion beam and implanting with the second ion beam forms a first well; and etching the substrate to form a first fin and a second fin in the first well and to define an upper surface of the substrate wherein the upper surface of the substrate is between the first fin and the second fin, wherein a maximum concentration of the first dopant is below a bottom of the first fin and the upper surface of the substrate, and wherein the peak of the first concentration profile is centered at a first distance below the bottom of the first fin, wherein an average concentration of the first dopant in a region is in a range from $5\times10^{17}$ atom/cm$^3$ to $7\times10^{17}$ atom/cm$^3$, wherein the region is laterally bounded by outermost sidewalls of the first fin and the second fin, and vertically bounded by an upper boundary and a lower boundary, wherein the upper boundary has a first depth 0.5 to 0.6 times the first distance, and wherein the lower boundary has a second depth 1.5 to 1.75 times the first distance.

2. The method of claim 1, further comprising rotating the substrate after implanting with the first ion beam and prior to implanting with the second ion beam.

3. The method of claim 1, wherein a magnitude of the first angle is greater than 0 degree and less than 15 degrees.

4. The method of claim 3, wherein a magnitude of the second angle is greater than 0 degree and less than 15 degrees.

5. The method of claim 1, wherein a magnitude of the first angle is equal to a magnitude of the second angle.

6. The method of claim 1, wherein the maximum concentration of the first dopant is in a range of 130 nm to 160 nm below the bottom of the first fin.

7. The method of claim 1, wherein the first dopant is boron, arsenic, or phosphorus.

8. A method of forming a semiconductor device, the method comprising:

forming a first patterned mask over a substrate, wherein the first patterned mask has a first opening over a top surface of a first portion of the substrate;

performing a first implantation to the first portion of the substrate with a first dopant, wherein a first ion beam of the first implantation is at a first acute angle relative to the top surface of the first portion of the substrate, the first ion beam being substantially parallel to a plane perpendicular to the top surface of the substrate, the plane including a longitudinal side of the first portion of the substrate;

after performing the first implantation, rotating the substrate by 180 degrees;

performing a second implantation to the first portion of the substrate with the first dopant, wherein a second ion beam of the second implantation is at a second acute angle relative to the top surface of the first portion of the substrate, the second ion beam being substantially parallel to the plane perpendicular to the top surface of the substrate, the plane including the longitudinal side of the first portion of the substrate; and etching the first portion of the substrate to form a first fin structure and a second fin structure and to define an upper surface of the substrate between the first fin structure and the second fin structure, wherein the first fin structure comprises a first sidewall and a second sidewall, wherein the second fin structure comprises a third sidewall and a fourth sidewall, wherein the second sidewall faces the third sidewall, wherein a maximum concentration region of the first dopant is underneath the first fin structure, the second fin structure, and the upper surface of the substrate, and wherein side borders of the maximum concentration region of the first dopant are laterally between the first sidewall and the fourth sidewall in a cross-sectional view.

9. The method of claim 8, wherein the first dopant is a p-type dopant, wherein performing the first implantation and the second implantation forms a p-well.

10. The method of claim 9, wherein the first dopant is boron.

11. The method of claim 8, wherein the first dopant is an n-type dopant, wherein performing the first implantation and the second implantation forms an n-well.

12. The method of claim 11, wherein the first dopant is arsenic or phosphorus.

13. The method of claim 8, wherein each of the first acute angle and the second acute angle is in a range from 75° to less than 90°.

14. The method of claim 8, wherein the first acute angle is a same angle as the second acute angle.

15. The method of claim 8, wherein the substrate is stationary during the first implantation and the second implantation.

16. A method of forming a semiconductor device, the method comprising:

implanting a first dopant having a first conductivity type into a substrate with a first ion beam, wherein the first ion beam impacts a top surface of the substrate at a first angle relative to a line perpendicular to the top surface of the substrate;

implanting the first dopant into the substrate with a second ion beam, wherein the second ion beam impacts the top surface of the substrate at a second angle relative to the line perpendicular to the top surface of the substrate, wherein the first ion beam and the second ion beam are on opposite sides of the line perpendicular to the top surface of the substrate, and wherein implanting with the first ion beam and implanting with the second ion beam forms a first well;

forming a second well on a first side of the first well;

forming a third well on a second side of the first well opposite the first side of the first well, wherein the first well is between the second well and the third well, wherein the first dopant has a first concentration at a first location along a first vertical line, wherein the first vertical line is positioned in the first well midway between the second well and the third well, wherein the first location is at a center of a peak of a dopant concentration profile of the first dopant along the first vertical line, wherein the first dopant has a second concentration at a second location, wherein a depth of the second location is 1.5 times a depth of the first location from the top surface of the substrate, and wherein the second concentration is 30% to 40% of the first concentration; and etching the substrate to form a plurality of fins in the first well, wherein a first lateral boundary is aligned with a first sidewall of the plurality of fins, wherein a second lateral boundary is aligned with a second sidewall of the plurality of fins, wherein the first sidewall is a sidewall of the plurality of fins closest to the second well, wherein the second sidewall is a sidewall of the plurality of fins closest to the third well, wherein an average concentration of the first dopant in a first region of the substrate below the plurality of fins and between the first lateral boundary and the second lateral boundary is in a range from $5\times10^{17}$ atom/cm$^3$ to $7\times10^{17}$ atom/cm$^3$.

17. The method of claim 16, wherein the first region is disposed 50 nm to 280 nm below a bottom of the plurality of fins.

18. The method of claim 16, wherein the first dopant has a third concentration at a third location, wherein a depth of the third location is 1.75 times the depth of the first location from the top surface of the substrate, and wherein the third concentration is 20% to 30% of the first concentration.

19. The method of claim 16, wherein the second well and the third well comprise a second dopant having a second conductivity type, and wherein the second conductivity type is opposite the first conductivity type.

20. The method of claim 16, wherein a magnitude of the first angle is equal to a magnitude of the second angle, and wherein the magnitude of the first angle and the magnitude of the second angle are less than 15 degrees.

* * * * *